(12) United States Patent
Ohnuma et al.

(10) Patent No.: US 8,288,245 B2
(45) Date of Patent: Oct. 16, 2012

(54) REPROCESSING METHOD OF SEMICONDUCTOR SUBSTRATE, MANUFACTURING METHOD OF REPROCESSED SEMICONDUCTOR SUBSTRATE, AND MANUFACTURING METHOD OF SOI SUBSTRATE

(75) Inventors: Hideto Ohnuma, Atsugi (JP); Kazuya Hanaoka, Fujisawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 12/894,860

(22) Filed: Sep. 30, 2010

(65) Prior Publication Data
US 2011/0086492 A1    Apr. 14, 2011

(30) Foreign Application Priority Data
Oct. 9, 2009  (JP) .................................. 2009-234949

(51) Int. Cl.
*H01L 21/30*    (2006.01)
(52) U.S. Cl. . 438/455; 438/458; 438/459; 257/E21.568; 257/E21.57
(58) Field of Classification Search .................. 438/455, 438/458, 459; 257/E21.568, E21.57
See application file for complete search history.

(56) References Cited

U.S. PATENT DOCUMENTS

| | | | |
|---|---|---|---|
| 3,640,806 A | 2/1972 | Watanabe et al. | |
| 4,731,516 A | 3/1988 | Noguchi et al. | |
| 5,374,564 A | 12/1994 | Bruel | |
| 5,494,849 A | 2/1996 | Iyer et al. | |
| 5,559,043 A | 9/1996 | Bruel | |
| 5,840,616 A | 11/1998 | Sakaguchi et al. | |
| 5,969,398 A | 10/1999 | Murakami | |
| 6,010,579 A | 1/2000 | Henley et al. | |
| 6,110,845 A | 8/2000 | Seguchi et al. | |

(Continued)

FOREIGN PATENT DOCUMENTS

EP    0955671 A    11/1999
(Continued)

OTHER PUBLICATIONS

Kriegler et al., "The Effect of HCl and Cl$_2$ on the Thermal Oxidation of Silicon," J. Electrochem. Soc. (Journal of the Electrochemical Society): Solid-State Science and Technology, Mar. 1, 1972, vol. 119, No. 3, pp. 388-392.

(Continued)

*Primary Examiner* — Hsien Ming Lee
(74) *Attorney, Agent, or Firm* — Eric J. Robinson; Robinson Intellectual Property Law Office, P.C.

(57) ABSTRACT

An object of an embodiment of the disclosed invention is to provide a method suitable for reprocessing a semiconductor substrate which is reused to manufacture an SOI substrate. A semiconductor substrate is reprocessed in the following manner: etching treatment is performed on a semiconductor substrate in which a step portion including a damaged semiconductor region and an insulating layer exists in a peripheral portion, whereby the insulating layer is removed; etching treatment is performed on the semiconductor substrate with the use of a mixed solution including a substance that oxidizes a semiconductor material included in the semiconductor substrate, a substance that dissolves the oxidized semiconductor material, and a substance that controls oxidation speed of the semiconductor material and dissolution speed of the oxidized semiconductor material, whereby the damaged semiconductor region is selectively removed with a non-damaged semiconductor region left; and heat treatment under an atmosphere including hydrogen is performed.

13 Claims, 28 Drawing Sheets

U.S. PATENT DOCUMENTS

| | | |
|---|---|---|
| 6,127,702 A | 10/2000 | Yamazaki et al. |
| 6,232,142 B1 | 5/2001 | Yasukawa |
| 6,245,645 B1 | 6/2001 | Mitani et al. |
| 6,251,754 B1 | 6/2001 | Ohshima et al. |
| 6,271,101 B1 | 8/2001 | Fukunaga |
| 6,284,628 B1 | 9/2001 | Kuwahara et al. |
| 6,331,473 B1 | 12/2001 | Hirabayashi |
| 6,335,231 B1 | 1/2002 | Yamazaki et al. |
| 6,344,404 B1 | 2/2002 | Cheung et al. |
| 6,372,609 B1 | 4/2002 | Aga et al. |
| 6,380,046 B1 | 4/2002 | Yamazaki |
| 6,388,652 B1 | 5/2002 | Yamazaki et al. |
| 6,426,270 B1 * | 7/2002 | Sakaguchi et al. ............ 438/406 |
| 6,468,923 B1 | 10/2002 | Yonehara et al. |
| 6,500,731 B1 | 12/2002 | Nakagawa et al. |
| 6,521,492 B2 | 2/2003 | Miyasaka et al. |
| 6,534,380 B1 | 3/2003 | Yamauchi et al. |
| 6,548,382 B1 | 4/2003 | Henley et al. |
| 6,596,610 B1 | 7/2003 | Kuwabara et al. |
| 6,602,761 B2 | 8/2003 | Fukunaga |
| 6,613,678 B1 | 9/2003 | Sakaguchi et al. |
| 6,677,222 B1 | 1/2004 | Mishima et al. |
| 6,686,623 B2 | 2/2004 | Yamazaki |
| 6,720,640 B2 | 4/2004 | Kuwabara et al. |
| 6,778,164 B2 | 8/2004 | Yamazaki et al. |
| 6,803,264 B2 | 10/2004 | Yamazaki et al. |
| 6,815,309 B2 | 11/2004 | Letertre et al. |
| 6,875,633 B2 | 4/2005 | Fukunaga |
| 6,927,148 B2 | 8/2005 | Ito |
| 7,022,586 B2 | 4/2006 | Maleville et al. |
| 7,064,049 B2 | 6/2006 | Ito et al. |
| 7,084,016 B1 | 8/2006 | Yamazaki et al. |
| 7,119,365 B2 | 10/2006 | Takafuji et al. |
| 7,153,729 B1 | 12/2006 | Yamazaki et al. |
| 7,176,525 B2 | 2/2007 | Fukunaga |
| 7,183,177 B2 | 2/2007 | Al-Bayati et al. |
| 7,199,024 B2 | 4/2007 | Yamazaki |
| 7,256,776 B2 | 8/2007 | Yamazaki et al. |
| 7,297,611 B2 | 11/2007 | Maleville |
| 7,315,064 B2 | 1/2008 | Mitani et al. |
| 7,354,844 B2 | 4/2008 | Endo et al. |
| 7,364,984 B2 | 4/2008 | Endo et al. |
| 7,387,944 B2 | 6/2008 | Tong et al. |
| 7,402,520 B2 | 7/2008 | Donohoe et al. |
| 7,405,136 B2 | 7/2008 | Delprat et al. |
| 7,413,964 B2 | 8/2008 | Reynaud et al. |
| 7,442,623 B2 | 10/2008 | Endo et al. |
| 7,508,034 B2 | 3/2009 | Takafuji et al. |
| 7,531,425 B2 | 5/2009 | Nakano et al. |
| 7,531,428 B2 | 5/2009 | Dupont |
| 7,579,654 B2 | 8/2009 | Couillard et al. |
| 7,608,521 B2 | 10/2009 | Cites et al. |
| 7,619,250 B2 | 11/2009 | Takafuji et al. |
| 7,755,113 B2 | 7/2010 | Yamazaki et al. |
| 7,759,233 B2 | 7/2010 | Forbes |
| 7,763,541 B2 | 7/2010 | Okuda et al. |
| 7,767,549 B2 | 8/2010 | Okuda et al. |
| 7,767,583 B2 | 8/2010 | Ramappa et al. |
| 7,781,308 B2 | 8/2010 | Isaka et al. |
| 7,781,309 B2 | 8/2010 | Morita et al. |
| 7,790,572 B2 | 9/2010 | Moriwaka |
| 7,799,658 B2 * | 9/2010 | Yamazaki ............ 438/458 |
| 7,808,098 B2 | 10/2010 | Sugiyama et al. |
| 7,825,007 B2 * | 11/2010 | Yamazaki et al. ............ 438/458 |
| 7,851,318 B2 * | 12/2010 | Koyama et al. ............ 438/311 |
| 7,867,877 B2 | 1/2011 | Morita et al. |
| 2001/0029072 A1 | 10/2001 | Kuwahara et al. |
| 2001/0046746 A1 | 11/2001 | Yokokawa et al. |
| 2002/0048844 A1 | 4/2002 | Sakaguchi |
| 2002/0157790 A1 | 10/2002 | Abe et al. |
| 2003/0087503 A1 * | 5/2003 | Sakaguchi et al. ............ 438/406 |
| 2003/0124815 A1 | 7/2003 | Henley et al. |
| 2003/0170990 A1 | 9/2003 | Sakaguchi et al. |
| 2004/0061176 A1 | 4/2004 | Takafuji et al. |
| 2004/0104424 A1 | 6/2004 | Yamazaki |
| 2004/0259328 A1 | 12/2004 | Ito et al. |
| 2005/0009252 A1 | 1/2005 | Yamazaki et al. |
| 2006/0148208 A1 | 7/2006 | Popov et al. |
| 2006/0228846 A1 | 10/2006 | Endo et al. |
| 2007/0063281 A1 | 3/2007 | Takafuji et al. |
| 2007/0108510 A1 | 5/2007 | Fukunaga |
| 2007/0141803 A1 | 6/2007 | Boussagol et al. |
| 2007/0148914 A1 | 6/2007 | Morita et al. |
| 2007/0173000 A1 | 7/2007 | Yamazaki |
| 2007/0184632 A1 | 8/2007 | Yamazaki et al. |
| 2007/0249139 A1 | 10/2007 | Gadkaree et al. |
| 2007/0291022 A1 | 12/2007 | Yamazaki et al. |
| 2008/0124929 A1 | 5/2008 | Okuda et al. |
| 2008/0153272 A1 | 6/2008 | Akiyama et al. |
| 2008/0224274 A1 * | 9/2008 | Yamazaki et al. ............ 257/627 |
| 2008/0224940 A1 | 9/2008 | Sugiyama et al. |
| 2008/0280420 A1 | 11/2008 | Yamazaki |
| 2009/0081848 A1 | 3/2009 | Erokhin et al. |
| 2009/0098704 A1 | 4/2009 | Ohnuma et al. |
| 2009/0098710 A1 * | 4/2009 | Yamazaki ............ 438/458 |
| 2009/0111244 A1 * | 4/2009 | Yamazaki et al. ............ 438/458 |
| 2009/0111245 A1 | 4/2009 | Okabe et al. |
| 2009/0115028 A1 * | 5/2009 | Shimomura et al. ............ 257/623 |
| 2009/0170287 A1 | 7/2009 | Endo et al. |
| 2009/0209085 A1 | 8/2009 | Tamura et al. |
| 2010/0022070 A1 * | 1/2010 | Imahayashi ............ 438/458 |
| 2010/0062546 A1 | 3/2010 | Endo et al. |
| 2010/0273310 A1 | 10/2010 | Hanaoka et al. |
| 2010/0330777 A1 | 12/2010 | Hanaoka |
| 2010/0330778 A1 | 12/2010 | Hanaoka |
| 2011/0053345 A1 | 3/2011 | Hanaoka et al. |
| 2011/0065263 A1 | 3/2011 | Imahayashi et al. |

FOREIGN PATENT DOCUMENTS

| | | |
|---|---|---|
| EP | 0961312 A | 12/1999 |
| EP | 1156531 A | 11/2001 |
| EP | 1202339 A | 5/2002 |
| EP | 1427001 A | 6/2004 |
| EP | 1427002 A | 6/2004 |
| EP | 1791174 A | 5/2007 |
| EP | 1970952 A | 9/2008 |
| EP | 2048697 A | 4/2009 |
| EP | 2091075 A | 8/2009 |
| JP | 2000-036583 A | 2/2000 |
| JP | 2000-223682 | 8/2000 |
| JP | 2001-155978 A | 6/2001 |
| JP | 2002-134375 A | 5/2002 |
| JP | 2004-087606 | 3/2004 |
| JP | 2004-260137 A | 9/2004 |
| JP | 2005-072070 A | 3/2005 |
| JP | 2007-149907 A | 6/2007 |
| JP | 3932369 | 6/2007 |
| JP | 2008-021892 A | 1/2008 |
| JP | 2008-262547 A | 10/2008 |
| JP | 2009-135437 A | 6/2009 |
| JP | 2009-177155 A | 8/2009 |

OTHER PUBLICATIONS

Lu et al., "Ion-cut silicon-on-Insulator fabrication with plasma immersion ion implantation," Appl. Phys. Lett, Nov. 10, 1997, vol. 71, No. 19, pp. 2767-2769.

Vossen et al., Thin Film Processes II, 1991, pp. 317-323, Academic Press, Inc.

'International Search Report (Application No. PCT/JP2010/066123; PCT12768) Dated Nov. 30, 2010.

'Written Opinion (Application No. PCT/JP2010/066123; PCT12768) Dated Nov. 30, 2010.

* cited by examiner

FIG. 10A1
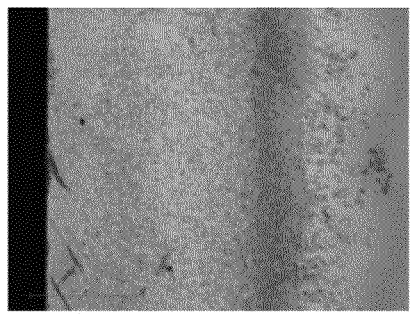
500 μm
FIG. 10A2
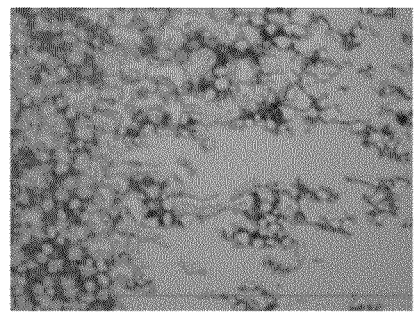
50 μm
FIG. 10B1
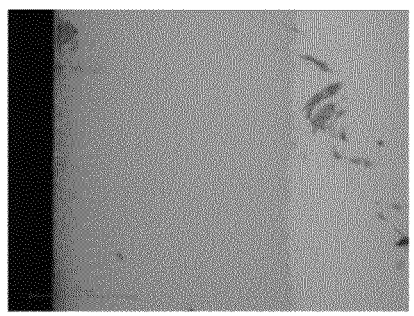
500 μm
FIG. 10B2
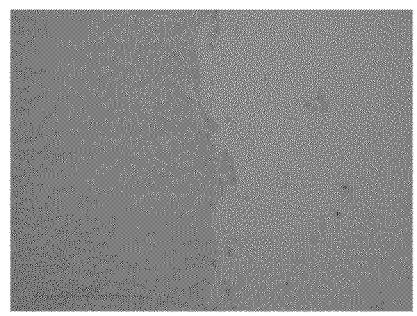
50 μm
FIG. 10C1
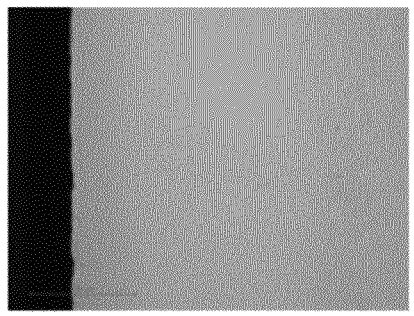
500 μm
FIG. 10C2
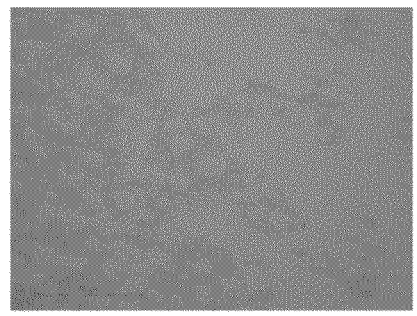
50 μm FIG. 11A1
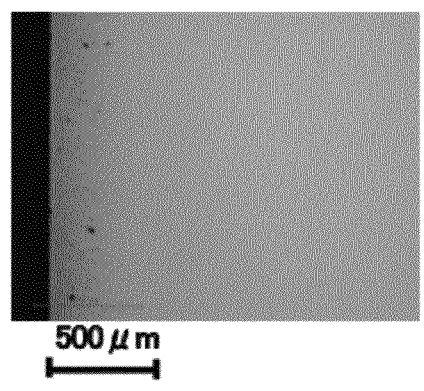
FIG. 11A2
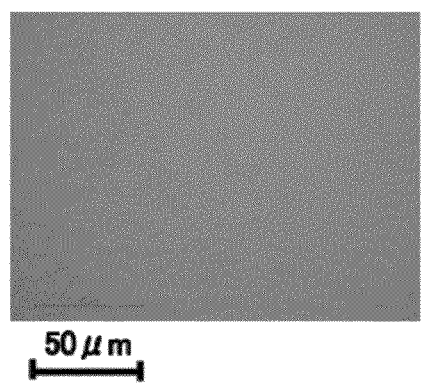
FIG. 11B1
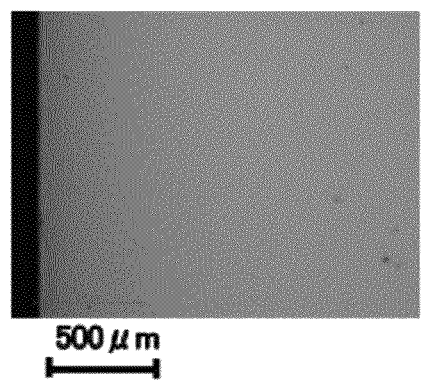
FIG. 11B2
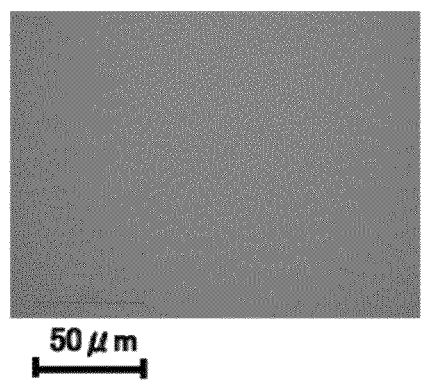
FIG. 11C1
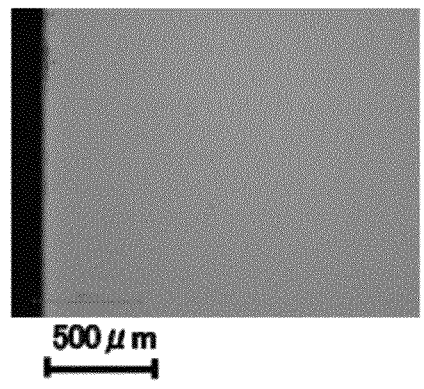
FIG. 11C2
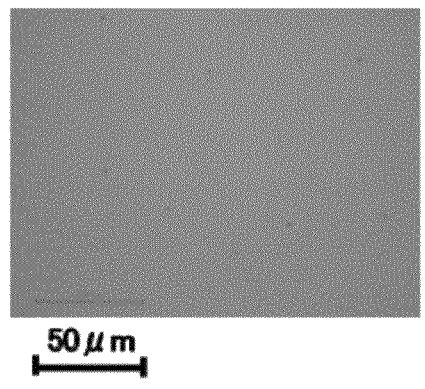

REPROCESSING METHOD OF SEMICONDUCTOR SUBSTRATE, MANUFACTURING METHOD OF REPROCESSED SEMICONDUCTOR SUBSTRATE, AND MANUFACTURING METHOD OF SOI SUBSTRATE

TECHNICAL FIELD

One of technical fields of the disclosed invention relates to a method for reprocessing a semiconductor substrate. In addition, the disclosed invention relates to a method for manufacturing a reprocessed semiconductor substrate with the use of the method for reprocessing a semiconductor substrate, and relates to a method for manufacturing an SOI (silicon on insulator) substrate.

BACKGROUND ART

In recent years, integrated circuits using an SOI (silicon on insulator) substrate that includes a thin single crystal silicon layer formed on an insulating surface have been developed instead of those using a bulk silicon wafer. The characteristics of the thin single crystal silicon layer formed on the insulating surface make it possible to completely separate transistors formed in the integrated circuit from each other. Further, since fully-depleted transistors can be formed, a semiconductor integrated circuit with high added values such as high integration, high speed driving, and low power consumption can be realized.

As a method for manufacturing an SOI substrate, a hydrogen ion implantation separation method is known. The hydrogen ion implantation separation method is a method by which a single crystal silicon layer is obtained in the following manner: a single crystal silicon substrate (a bond substrate) into which hydrogen ions are implanted is bonded to another substrate (a base substrate) with an insulating layer interposed between the substrates, and then the bond substrate is separated along an ion implantation region by heat treatment. With the above hydrogen ion implantation separation method, an SOI substrate in which a single crystal silicon layer is provided over an insulating substrate such as a glass substrate can be manufactured (e.g., see Patent Document 1).

REFERENCE

Patent Document
[Patent Document 1] Japanese Published Patent Application No. 2004-87606

DISCLOSURE OF INVENTION

When a hydrogen ion implantation separation method is employed as a method for manufacturing an SOI substrate, a plurality of SOI substrates can be manufactured from one bond substrate; therefore, there is an advantage that cost for the bond substrate in manufacturing an SOI substrate can be reduced. This is because, when the bond substrate from which a single crystal silicon layer is separated is subjected to reprocessing treatment, the used bond substrate can be reused for manufacturing another SOI substrate.

Here, a peripheral portion of the bond substrate such as a single crystal silicon substrate, which is used for the above hydrogen ion implantation separation method, has a region called an edge roll off (E. R. O.) that is caused by chemical mechanical polishing (CMP) treatment in a manufacturing process of the bond substrate. This region is formed when an edge of the bond substrate is polished with a polishing cloth. The edge roll off region of the bond substrate has a curved surface and a thickness thinner than that in a central region of the bond substrate.

When an SOI substrate is manufactured by the hydrogen ion implantation separation method, a bond substrate and a base substrate are bonded to each other by a mechanism of intermolecular force or the Van der Waals force; therefore, surfaces to be bonded need to have a predetermined degree of planarity. It is natural that the bond substrate and the base substrate be not bonded in the edge roll off region where the surface planarity is not secured.

Thus, in a region of the bond substrate from which the single crystal silicon layer is separated, which corresponds to the above edge roll off region, an unseparated single crystal silicon region and an unseparated insulating layer are left as a step portion. This step portion becomes a problem in a stage of reprocessing treatment of the bond substrate. The difference in height between the step portion and the other region (a region where the bonding is performed properly) is several hundred nanometers at most. However, in order to remove the step portion by polishing a surface of the bond substrate with a CMP method so that the reprocessed substrate can be used for manufacturing an SOI substrate again as a bond substrate, a semiconductor layer needs to be removed by approximately 10 μm, and thus the number of times of reprocessing and use of the bond substrate cannot be sufficiently secured.

Further, a semiconductor region irradiated with hydrogen ions in the manufacturing process of an SOI substrate is left on the surface of the bond wafer having the step portion. Crystal defects, voids, or blisters exist due to hydrogen ion irradiation in the semiconductor region; therefore, a number of projections and depressions exist on the surface of the bond substrate.

In view of the foregoing problem, an object of an embodiment of the disclosed invention is to provide a method suitable for reprocessing a semiconductor substrate. Another object of an embodiment of the disclosed invention is to manufacture a reprocessed semiconductor substrate with the use of the method suitable for reprocessing a semiconductor substrate. Still another object of an embodiment of the disclosed invention is to manufacture an SOI substrate with the use of the reprocessed semiconductor substrate.

In an embodiment of the disclosed invention, a step portion is removed using a method by which a semiconductor region damaged due to ion irradiation or the like can be selectively removed. Further, the above method is used to manufacture a reprocessed semiconductor substrate, and an SOI substrate is manufactured using the reprocessed semiconductor substrate. Detailed description is made below.

One embodiment of the disclosed invention is a method for reprocessing a semiconductor substrate, including the steps of: performing first etching treatment on a semiconductor substrate in which a step portion including a damaged semiconductor region and an insulating layer over the damaged semiconductor region exists in a peripheral portion, whereby the insulating layer is removed; performing second etching treatment on the semiconductor substrate by using a mixed solution which includes a substance that oxidizes a semiconductor material included in the semiconductor substrate, a substance that dissolves the oxidized semiconductor material, and a substance that controls the speed of oxidation of the semiconductor material and the speed of dissolution of the oxidized semiconductor material, whereby the damaged semiconductor region is selectively removed with a non-damaged semiconductor region left; and performing heat treatment for heating the semiconductor substrate after the second etching treatment under an atmosphere including hydrogen.

Another embodiment of the disclosed invention is a method for reprocessing a semiconductor substrate, including the steps of: performing first etching treatment on a semiconductor substrate in which a step portion including a damaged semiconductor region and an insulating layer over the damaged semiconductor region is left in a peripheral portion after part of the semiconductor substrate is separated as a semiconductor layer through ion irradiation and heat treatment, whereby the insulating layer is removed; performing second etching treatment on the semiconductor substrate by using a mixed solution which includes a substance that oxidizes a semiconductor material included in the semiconductor substrate, a substance that dissolves the oxidized semiconductor material, and a substance that controls the speed of oxidation of the semiconductor material and the speed of dissolution of the oxidized semiconductor material, whereby the damaged semiconductor region is selectively removed with a non-damaged semiconductor region left; and performing heat treatment for heating the semiconductor substrate after the second etching treatment under an atmosphere including hydrogen.

Still another embodiment of the disclosed invention is a method for reprocessing a semiconductor substrate, including the steps of: performing first etching treatment on a semiconductor substrate in which a step portion including a damaged semiconductor region and an insulating layer over the damaged semiconductor region is left in a peripheral portion and in which a damaged semiconductor region whose thickness is thinner than that of the damaged semiconductor region is left in a region surrounded by the step portion after part of the semiconductor substrate is separated as a semiconductor layer through ion irradiation and heat treatment, whereby the insulating layer is removed; performing second etching treatment on the semiconductor substrate by using a mixed solution which includes a substance that oxidizes a semiconductor material included in the semiconductor substrate, a substance that dissolves the oxidized semiconductor material, and a substance that controls the speed of oxidation of the semiconductor material and the speed of dissolution of the oxidized semiconductor material, whereby the damaged semiconductor regions are selectively removed with a non-damaged semiconductor region left; and performing heat treatment for heating the semiconductor substrate after the second etching treatment under an atmosphere including hydrogen.

In the second etching treatment, etching selectivity of the damaged semiconductor region to the non-damaged semiconductor region is preferably 2 or higher. Further, the second etching treatment is preferably stopped after the etching selectivity of the peripheral portion of the semiconductor substrate to a central portion of the semiconductor substrate is reduced from 2 or higher to lower than 2.

In addition, the ion irradiation is preferably performed without mass separation. Further, the ion preferably includes an $H_3^+$ ion.

In addition, at least a region where an angle between a tangent plane of the step portion and a back surface of the semiconductor substrate is 0.5° or less is preferably removed by the second etching treatment.

Moreover, it is preferable that nitric acid be used as the substance that oxidizes the semiconductor material included in the semiconductor substrate, hydrofluoric acid be used as the substance that dissolves the oxidized semiconductor material, and acetic acid be used as the substance that controls the speed of oxidization of the semiconductor material and the speed of dissolution of the oxidized semiconductor material. Further, it is preferable to use a solution in which the hydrofluoric acid, the nitric acid, and the acetic acid are mixed at a volume ratio of 1:3:10 or 1:2:10. Note that the concentrations of the hydrofluoric acid, the nitric acid, and the acetic acid are 50 weight %, 70 weight %, and 97.7 weight %, respectively.

By the above methods, a reprocessed semiconductor substrate can be manufactured from the semiconductor substrate. Furthermore, an SOI substrate can be manufactured in the following manner: the reprocessed semiconductor substrate manufactured by any of the above methods is irradiated with ions so that an embrittlement region is formed, the reprocessed semiconductor substrate and a base substrate are bonded with an insulating layer interposed therebetween, and the reprocessed semiconductor substrate is separated by heat treatment so that a semiconductor layer is formed over the base substrate.

Note that in this specification and the like, an SOI substrate refers to a substrate in which a semiconductor layer is formed on an insulating surface, and is not limited to a structure where a silicon layer is provided on an insulating layer. For example, an SOI substrate may have a structure where a silicon layer is directly formed on a glass substrate, a structure where a silicon carbide layer is formed on an insulating layer, or the like.

According to an embodiment of the disclosed invention, a damaged semiconductor region can be selectively removed with a non-damaged semiconductor region (or a semiconductor region in which the degree of damage is low) left. Accordingly, the amount of a semiconductor removed in reprocessing treatment of the semiconductor substrate can be sufficiently reduced, and the number of times of reprocessing and use of the semiconductor substrate can be sufficiently secured.

In addition, heat treatment is performed under an atmosphere including hydrogen after the damaged semiconductor region is selectively removed, so that a reprocessed semiconductor substrate having favorable planarity can be obtained.

Further, when a reprocessed semiconductor substrate is manufactured by the above method for reprocessing a semiconductor substrate, the amount of a semiconductor removed in the reprocessing treatment can be sufficiently reduced. Accordingly, cost for manufacturing the reprocessed semiconductor substrate can be reduced.

Furthermore, when an SOI substrate is manufactured using the above reprocessed semiconductor substrate, cost for manufacturing the SOI substrate can be sufficiently reduced.

BRIEF DESCRIPTION OF DRAWINGS

In the accompanying drawings:

FIGS. 10A1, 10A2, 10B1, 10B2, 10C1, and 10C2 are optical micrographs of a semiconductor substrate;

FIGS. 11A1, 11A2, 11B1, 11B2, 11C1, and 11C2 are optical micrographs of a semiconductor substrate;

BEST MODE FOR CARRYING OUT THE INVENTION

Figure 1A:
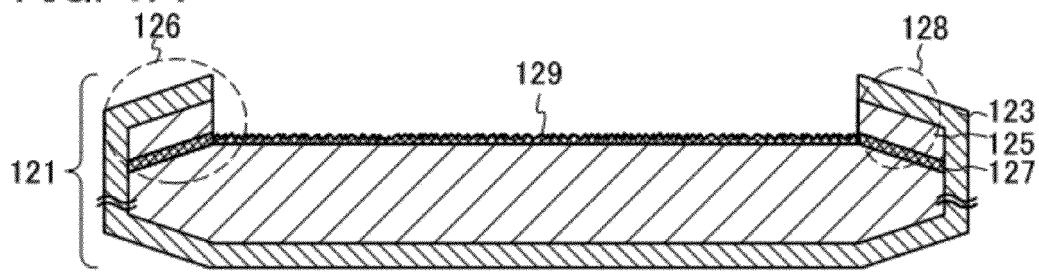
FIGS. 1A to 1D are cross-sectional views illustrating a method of reprocessing treatment for a semiconductor substrate.

Embodiments and examples will be described below with reference to the drawings. Note that the invention can be implemented in many different modes, and it is clear to those skilled in the art that the modes and details can be changed in various ways without departing from the spirit and scope of the invention. Therefore, the invention should not be construed as being limited to the description of the embodiments and examples. Note that the same portions or portions having a similar function are denoted by the same reference numerals in this specification and the like, and description thereof is omitted in some cases.

Embodiment 1

In this embodiment, a method for reprocessing a semiconductor substrate will be described with reference to FIGS. 1A to 1D and FIGS. 2A and 2B.

FIG. 1A illustrates an example of a structure of a semiconductor substrate 121 before reprocessing treatment (a semiconductor substrate from which a semiconductor layer is separated). A step portion 126 exists in a peripheral portion of the semiconductor substrate 121. The step portion 126 includes an insulating layer 123, an unseparated semiconductor region 125, and a semiconductor region 127. Note that both the unseparated semiconductor region 125 and the semiconductor region 127 are damaged and include many crystal defects, voids, blisters, or the like, due to ion irradiation treatment or the like in a manufacturing process of an SOI substrate. In particular, the semiconductor region 127 is a region where damage and embrittlement due to the ion irradiation are remarkable. Therefore, the unseparated semiconductor region 125 and the semiconductor region 127 can be collectively referred to as a damaged semiconductor region. For example, in the case of a single crystal semiconductor substrate, the damaged semiconductor region refers to a region part of which includes disorder of alignment of atoms in a crystal (a crystal structure), a crystal defect, a distortion of a crystal lattice, or the like, which is caused by ion irradiation or the like, while a single crystal semiconductor region is a region in which atoms in a crystal are aligned in a spatially regular manner. In addition, a non-damaged semiconductor region refers to a single crystal semiconductor region in which atoms in a crystal are aligned in a spatially aligned manner and which has the same quality as a single crystal semiconductor region which is not irradiated with ions or the like.

The above step portion 126 includes a so-called edge roll off (E. R. O.) region of the semiconductor substrate. The edge roll off region is caused by surface treatment (CMP treatment) of the semiconductor substrate. Since the edge roll off region of the semiconductor substrate has a smaller thickness than a central region of the semiconductor substrate, bonding is not performed in the edge roll off region at the time of manufacturing an SOI substrate. As a result, the step portion 126 is left in the edge roll off region of the semiconductor substrate 121.

Note that a semiconductor region 129 irradiated with ions exists in a region of the semiconductor substrate 121, other than the step portion 126, (especially in a region surrounded by the above edge roll off region). The semiconductor region 129 is formed in such a manner that part of a region irradiated with ions, which is formed in the manufacturing process of the SOI substrate, is left in the semiconductor substrate 121 after the semiconductor layer is separated.

Here, the semiconductor region 129 is thin enough as compared to the semiconductor regions (the semiconductor region 125 and the semiconductor region 127) in the step portion 126. Further, the semiconductor region 129 is damaged by ion irradiation treatment or the like and includes many crystal defects or the like. Therefore, the semiconductor region 129 as well as the semiconductor region 125 and the semiconductor region 127 can be referred to as a damaged semiconductor region.

Figure 2A:
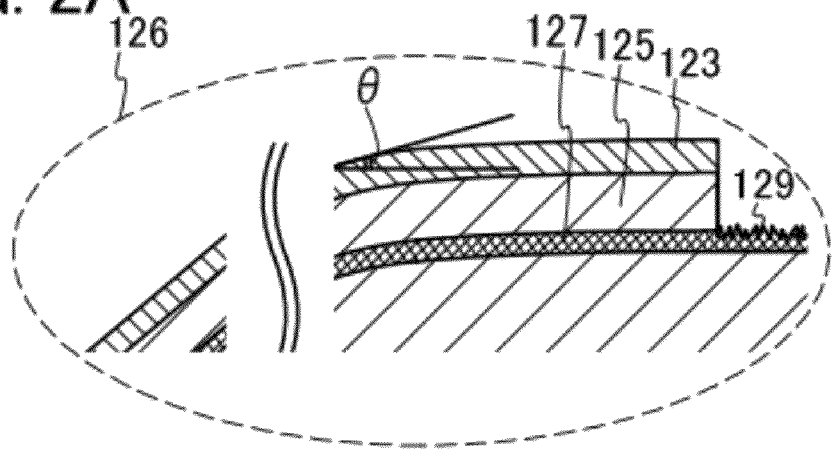
FIGS. 2A and 2B are enlarged views of a step portion of a semiconductor substrate.

FIG. 2A illustrates a schematic view in which the step portion 126 is enlarged. The step portion 126 includes a region corresponding to the edge roll off region and a region corresponding to a chamfer portion. In this embodiment, the edge roll off region refers to a set of points at which an angle between a tangent plane of a surface of the step portion 126 and a reference surface is 0.5° or less. Here, as the reference surface, a plane parallel to a front surface or a back surface of the semiconductor substrate is employed.

Alternatively, by setting a region at a distance of 0.2 mm from the end of the substrate as the chamfer portion, the edge roll off region can be defined as a region which is inside the chamfer portion and in which bonding is not performed.

Specifically, for example, a region at a distance of 0.2 mm to 0.9 mm from the end of the substrate can be referred to as the edge roll off region.

Note that the chamfer portion does not affect the bonding between a base substrate and a bond substrate; therefore, the planarity of the chamfer portion does not matter in reprocessing treatment of the substrate. On the other hand, the vicinity of the edge roll off region has an influence on the bonding between the base substrate and the bond substrate. Therefore, a reprocessed semiconductor substrate cannot be used in a manufacturing process of an SOI substrate in some cases, which depends on the planarity of the edge roll off region. For this reason, it is very important to remove the step portion 126 in the edge roll off region so that the planarity thereof is improved in the reprocessing treatment of the semiconductor substrate.

Figure 2B:
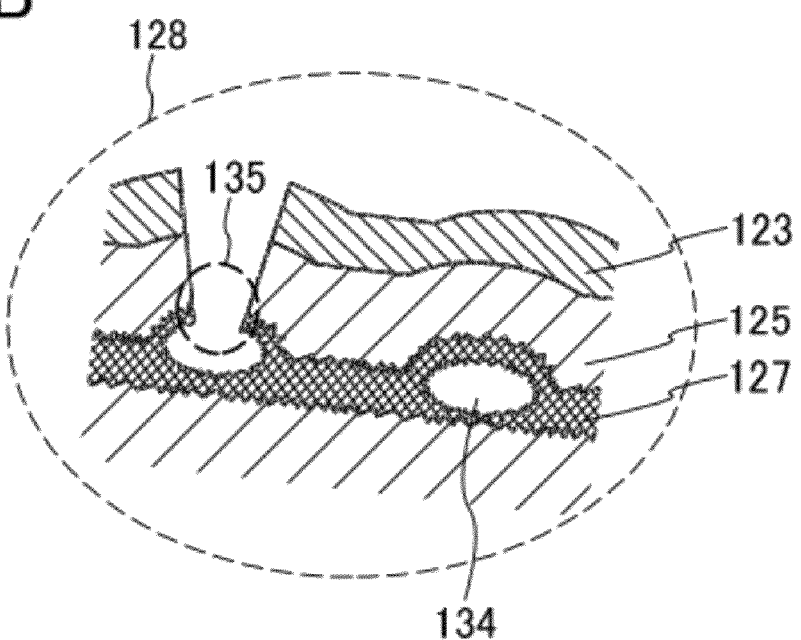

FIG. 2B illustrates a schematic view in which a step portion 128 illustrated in FIG. 1A is enlarged. Note that both the unseparated semiconductor region 125 and the semiconductor region 127 are damaged and include many crystal defects, voids, blisters 134, or the like, due to irradiation treatment of ions or the like in a manufacturing process of an SOI substrate. A region 135 surrounded by a doted line shows a state where the semiconductor layer and the insulating film over the blisters is damaged. A number of projections and depressions exist on the surface of the insulating layer 123.

Reprocessing treatment of the semiconductor substrate includes at least etching treatment (hereinafter referred to as first etching treatment) for removing the insulating layer 123, etching treatment (hereinafter referred to as second etching treatment) for removing the damaged semiconductor region, and heat treatment for planarizing the semiconductor substrate after the second etching treatment. These are described in detail below.

First, the first etching treatment is described with reference to FIG. 1A. As described above, the first etching treatment is etching treatment for removing the insulating layer 123 from the semiconductor substrate 121. Here, the insulating layer 123 can be removed by wet etching treatment using a solution containing hydrofluoric acid as an etchant. As the solution containing hydrofluoric acid, a mixed solution containing hydrofluoric acid, ammonium fluoride, and a surfactant (e.g., product name: LAL 500, produced by Stella Chemifa Corporation) or the like is preferably used. This wet etching treatment is preferably performed for 20 seconds to 1200 seconds, for example, approximately 300 seconds.

Since wet etching treatment can be performed in such a manner that the semiconductor substrate 121 is soaked in a solution in a treatment tank, a plurality of semiconductor substrates 121 can be processed at once. Accordingly, efficiency of the reprocessing treatment can be increased. Further, since the insulating layer 123 is removed by the first etching treatment and does not need to be removed by the second etching treatment, the etching time can be shortened. Furthermore, since the semiconductor is hardly etched by the first etching treatment, the amount of the semiconductor substrate 121 removed by the etching can be reduced and the number of times of reprocessing can be increased.

In the first etching treatment, dry etching treatment may be employed as long as the insulating layer 123 can be removed. Alternatively, wet etching treatment and dry etching treatment may be used in combination. For the dry etching treatment, a parallel plate reactive ion etching (RIE) method, an inductively coupled plasma (ICP) etching method, or the like can be used.

Figure 1B:
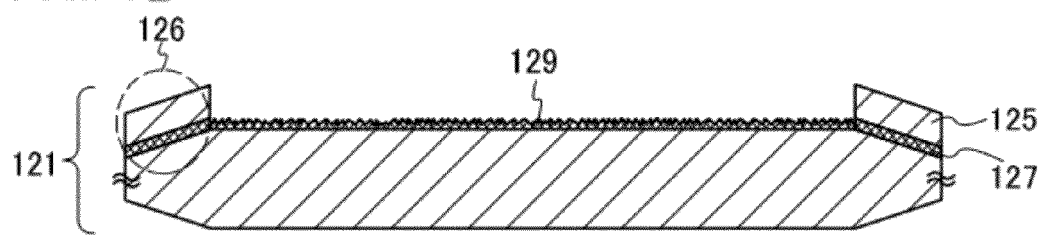

Next, the second etching treatment is described with reference to FIG. 1B. In the second etching treatment, the damaged semiconductor regions, that is, the unseparated semiconductor region 125 and the semiconductor region 127, which are included in the step portion 126, and the semiconductor region 129 irradiated with ions, are selectively removed. More specifically, wet etching treatment is performed using, as an etchant, a mixed solution which includes a substance that oxidizes a semiconductor material, a substance that dissolves the oxidized semiconductor material, and a substance that controls the speed of oxidation of the semiconductor material and the speed of dissolution of the oxidized semiconductor material.

In the above treatment, nitric acid is preferably used for a chemical solution including the substance that oxidizes the semiconductor material. Hydrofluoric acid is preferably used for a chemical solution including the substance that dissolves the oxidized semiconductor material. Acetic acid is preferably used for a chemical solution including the substance that controls the speed of oxidation of the semiconductor material and the speed of dissolution of the oxidized semiconductor material. The composition of the etchant is preferably set as follows: the volume of 70 weight % nitric acid is more than 0.01 times and less than one time as large as that of 97.7 weight % acetic acid and is more than 0.1 times and less than 100 times as large as that of 50 weight % hydrofluoric acid, and the volume of 50 weight % hydrofluoric acid is more than 0.01 times and less than 0.5 times as large as that of 97.7 weight % acetic acid. For example, it is preferable that the volume ratio of hydrofluoric acid, nitric acid, and acetic acid be 1:3:10, 1:2:10, 1.5:3:10, or the like. Note that the volume ratio 1:3:10 is expressed as $HF:HNO_3:CH_3COOH:H_2O=2.05:3.29:11.55:7.42$ in a molar ratio of molecules. There is no particular limitation on the composition of the other molecules. The etching treatment is preferably performed for approximately 1 minute to 20 minutes. For example, the etching treatment is preferably performed for approximately 2 minutes to 4 minutes in the case where the volume ratio of hydrofluoric acid, nitric acid, and acetic acid is 1:3:10 and for approximately 6 minutes to 12 minutes in the case where the volume ratio of hydrofluoric acid, nitric acid, and acetic acid is 1:2:10. Further, it is preferable that the temperature of the mixed solution be approximately 10° C. to 30° C., for example, 22° C. to 23° C.

In the above expressions using a ratio, the chemical solutions or the molar numbers each have a margin of error of ±10%. For example, in the expression that the volume ratio of hydrofluoric acid, nitric acid, and acetic acid is 1:3:10, x:y:z (hydrofluoric acid (x), nitric acid (y), and acetic acid (z)) may be in a range of x=0.9 to 1.1, y=2.7 to 3.3, and z=9 to 11. Similarly, in the expression that the volume ratio of hydrofluoric acid, nitric acid, and acetic acid is 1:2:10, x:y:z (hydrofluoric acid (x), nitric acid (y), and acetic acid (z)) may be in a range of x=0.9 to 1.1, y=1.8 to 2.2, and z=9 to 11.

Crystal defects, voids, blisters, and the like due to ion irradiation exist in the damaged semiconductor region, and an etchant penetrates easily thereinto. Accordingly, in the damaged semiconductor region, wet etching treatment progresses not only from a surface but also from the inside. Specifically, the etching tends to progress in such a manner that a deep hole is formed in a direction perpendicular to the plane surface of the substrate and then the hole is expanded. In other words, in the damaged semiconductor region, the etching treatment progresses at a higher etching rate than in a less-damaged semiconductor region or the non-damaged semiconductor region. Here, "etching rate" means the etching amount (amount etched) per unit time. In addition, "etching selectivity" means, in the case where two different layers are etched, a ratio of an etching rate of each layer. In addition, the less-damaged semiconductor region refers to a semiconductor region in which the degree of damage is relatively low as compared to that of the unseparated semiconductor region 125, the semiconductor region 127, the semiconductor region 129 irradiated with ions, or the like.

More specifically, the etching rate of the damaged semiconductor region is twice or more as high as that of the non-damaged semiconductor region (or the less-damaged semiconductor region). That is, the etching selectivity of the damaged semiconductor region to the non-damaged semiconductor region (or the less-damaged semiconductor region) is 2 or higher.

In this manner, when the wet etching treatment is performed using, as an etchant, the mixed solution which includes the substance that oxidizes the semiconductor material, the substance that dissolves the oxidized semiconductor material, and the substance that controls the speed of oxidation of the semiconductor material and the speed of dissolution of the oxidized semiconductor material, the damaged semiconductor region can be selectively removed. Accordingly, the amount of the semiconductor removed in the reprocessing treatment can be reduced, and the number times of reprocessing and use can be increased. Further, by the wet etching treatment, a plurality of semiconductor substrates 121 can be processed at once; therefore, efficiency of the reprocessing treatment can be increased. Furthermore, since the second etching treatment can be performed in a short time, efficiency of the reprocessing treatment can be increased also for this reason.

Note that the thickness of the damaged semiconductor region in the step portion 126 (the semiconductor region 125 and the semiconductor region 127) is largely different from that of the damaged semiconductor region in the other region (the semiconductor region 129). Therefore, the etching selectivity of the step portion 126 (the peripheral portion) to the other region (the central portion) is not uniform during the second etching treatment.

Specifics are described below. Immediately after the second etching treatment is started, the damaged semiconductor region is first etched both in the step portion 126 and in the other region; thus, the etching selectivity becomes similar (specifically, approximately 1). After the damaged semiconductor region in the region other than the step portion 126 (the semiconductor region 129) is etched to be removed, the less-damaged semiconductor region or the non-damaged semiconductor region is exposed in the region other than the step portion 126; thus, the etching rate of the less-damaged semiconductor region or the non-damaged semiconductor region is reduced. Therefore, the damaged semiconductor region in the step portion 126 is preferentially removed, and the etching selectivity of the damaged semiconductor region to the less-damaged semiconductor region or the non-damaged semiconductor region becomes high (specifically, 2 or higher). After the damaged semiconductor region in the step portion 126 (the semiconductor region 125 and the semiconductor region 127) is etched to be removed, the less-damaged semiconductor region or the non-damaged semiconductor region is exposed also in the step portion 126; thus, the etching selectivity becomes similar again (specifically, approximately 1).

In this manner, since the etching selectivity varies during the second etching treatment, the etching can be finished in consideration of the etching selectivity. For example, by stopping the etching treatment at the stage where the etching selectivity of the damaged semiconductor region to the less-damaged semiconductor region or the non-damaged semiconductor region is reduced to lower than 2, the damaged semiconductor region can be removed while the amount of the semiconductor removed by the second etching treatment is reduced. In this case, the reprocessing treatment can be surely performed and the number of times of reprocessing can be sufficiently secured. Note that the etching selectivity may be a value (a difference value) obtained by comparing the amounts of reduced thickness in a predetermined time (e.g., 30 seconds or 1 minute) or a value (a differential value) obtained by comparing the amounts of reduced thickness in an instant.

Note that although not illustrated here, the step portion 126 is damaged or partly damaged in some cases when the semiconductor layer is separated from the semiconductor substrate 121. In such cases, the etchant penetrates from the damaged region into a periphery thereof through the first etching treatment and the second etching treatment, and the damaged semiconductor region which is left in the non-damaged semiconductor region (or the less-damaged semiconductor region) is selectively removed.

Figure 1C:
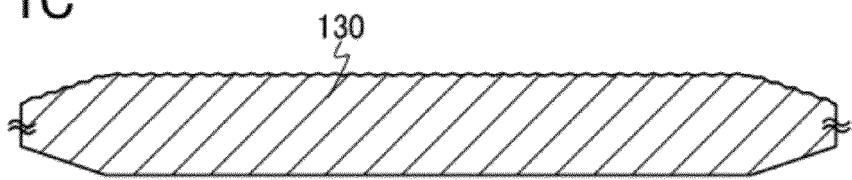
Figure 1D:
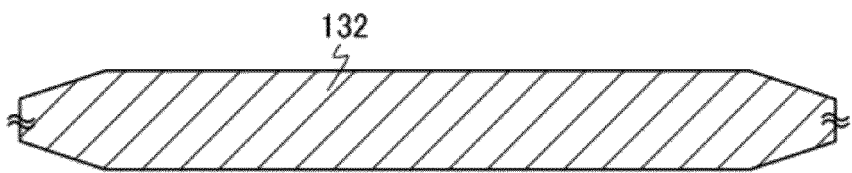

Next, planarization treatment is performed on a semiconductor substrate 130 after the second etching treatment, so that a reprocessed semiconductor substrate 132 is manufactured (see FIG. 1D). This treatment is performed because the semiconductor substrate 130 cannot be used in a manufacturing process of an SOI substrate when a surface of the semiconductor substrate 130 after the second etching treatment does not have enough planarity as illustrated in FIG. 1C. Note that in this embodiment, the case where the semiconductor region 129 is completely removed by the second etching treatment is described; however, in the case where the semiconductor region 129 cannot be sufficiently removed by the second etching treatment, it is preferable that the remaining semiconductor region 129 be removed together by planarization treatment described below.

As the planarization treatment, the semiconductor substrate 130 after the second etching treatment can be subjected to heat treatment at a temperature of greater than or equal to 1100° C. and less than or equal to 1300° C. for greater than or equal to 30 minutes and less than or equal to 240 minutes under a hydrogen atmosphere.

As a heating means, a rapid thermal anneal (RTA) apparatus, a resistance heating furnace, a microwave heating apparatus, or the like can be used.

Note that the heat treatment may be performed under an argon atmosphere or an atmosphere of a mixture of hydrogen and argon as well as a hydrogen atmosphere. For example, in the case where the atmosphere of a mixture of hydrogen and argon is employed, the heat treatment can be performed at a temperature of greater than or equal to 1100° C. and less than or equal to 1300° C. for greater than or equal to 30 minutes and less than or equal to 240 minutes under an argon atmosphere whose volume is greater than or equal to 90 vol % and less than or equal to 100 vol % with respect to a gas introduced into a heating furnace. In the case where the heat treatment is performed under the atmosphere of a mixture of hydrogen and argon, the proportion of hydrogen to the gas introduced into the heating furnace may preferably be 4 vol %, for example.

Note that the atmosphere of the heat treatment is not limited to the above, and an atmosphere of other gas can be employed as long as the surface of the semiconductor substrate 130 after the second etching treatment can be planarized under the atmosphere.

Note that another heat treatment under an argon atmosphere or an atmosphere of a mixture of oxygen and nitrogen may be performed before or after the heat treatment under the hydrogen atmosphere. Since out-diffusion of oxygen in the semiconductor substrate 130 is promoted by performing such heat treatment, the concentrations of oxygen that exists between lattices in the semiconductor substrate 130 can be reduced, and generation of oxidation-induced stacking fault (OSF) to the semiconductor substrate can be suppressed.

Note that although the case where at least the heat treatment is performed as the planarization treatment is described in this embodiment, without limitation thereto, polishing treatment such as a CMP method may be combined therewith to perform the planarization treatment. A polishing treatment may be performed after or before the heat treatment. The polishing treatment using a CMP method may be performed once or a plurality of times. When the polishing treatment is performed a plurality of times, for example, it is preferable that first polishing with a high polishing rate be performed and then finishing polishing with a low polishing rate be performed. At the first polishing, a polyurethane polishing cloth is preferably used, and the grain diameter of slurry is preferably 120 nm to 180 nm, for example, approximately 150 nm. At the finishing polishing, a suede polishing cloth is preferably used, and the grain diameter of slurry is preferably 45 nm to 75 nm, for example, approximately 60 nm. Further, when the polishing treatment is performed a plurality of times at different polishing rates, the semiconductor substrate 130 can be planarized in a short time.

The surface of the semiconductor substrate 130 is planarized through the heat treatment; therefore, the reprocessed semiconductor substrate 132 which is planarized to have average surface roughness (Ra) of 0.2 nm or less, preferably, 0.1 nm or less can be manufactured (see FIG. 1D).

As described in this embodiment, after an insulating layer is removed through the first etching treatment, the second etching treatment is performed using the mixed solution which includes the substance that oxidizes the semiconductor material, the substance that dissolves the oxidized semiconductor material, and the substance that controls the speed of oxidation of the semiconductor material and the speed of dissolution of the oxidized semiconductor material, so that the damaged semiconductor region remaining in the periphery of the semiconductor substrate can be selectively removed. Therefore, the amount of semiconductor removed can be reduced, and the number of times of reprocessing and use of the semiconductor substrate can be increased. In addition, the heat treatment is performed under an atmosphere including hydrogen after the damaged semiconductor region is selectively removed, so that a reprocessed semiconductor substrate having favorable planarity can be obtained.

The structure described in this embodiment can be used in appropriate combination with the structure described in any of the other embodiments.

Embodiment 2

In a method for manufacturing an SOI substrate of this embodiment, an SOI substrate is manufactured by bonding a semiconductor layer separated from a semiconductor substrate which is a bond substrate to a base substrate. The semiconductor substrate from which the semiconductor layer has been separated is subjected to reprocessing treatment and reused as a bond substrate. An example of the method for manufacturing an SOI substrate of this embodiment will be described below with reference to FIGS. 2A and 2B, FIGS. 3A to 3C, FIGS. 4A to 4C, FIGS. 5A to 5C, and a manufacturing process chart of an SOI substrate of FIG. 6.

First, a process of forming an embrittlement region 104 in a semiconductor substrate 100 to prepare for bonding with a base substrate 120 is described. This process relates to treatment for the semiconductor substrate 100 and corresponds to Process A in FIG. 6.

Figure 3A:
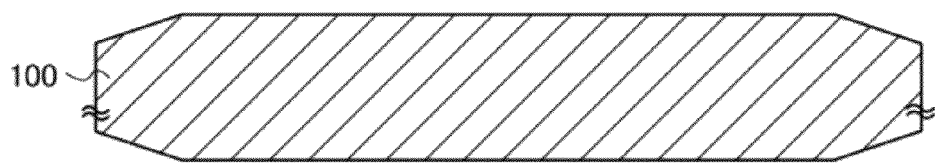
FIGS. 3A to 3C are cross-sectional views illustrating a method for manufacturing an SOI substrate.
Figure 6:
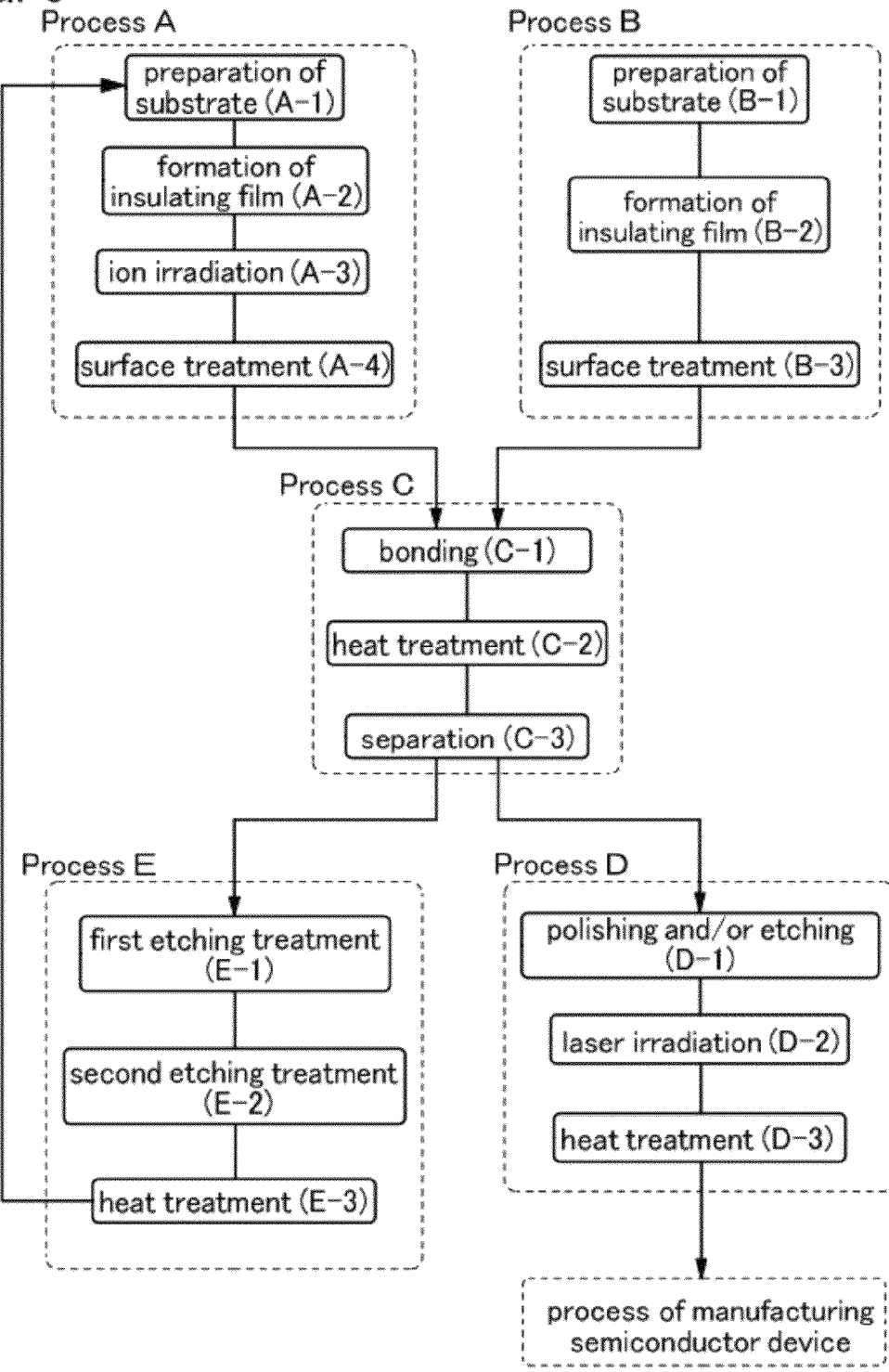
FIG. 6 illustrates a manufacturing process of an SOI substrate.

First, the semiconductor substrate 100 is prepared (see FIG. 3A and the step A-1 in FIG. 6). As the semiconductor substrate 100, for example, a single crystal semiconductor substrate or a polycrystalline semiconductor substrate of silicon or the like can be used. Typical examples of commercially available silicon substrates include circular silicon substrates which are 5 inches (125 mm) in diameter, 6 inches (150 mm) in diameter, 8 inches (200 mm) in diameter, 12 inches (300 mm) in diameter, and 16 inches (400 mm) in diameter. Further, in a peripheral portion of a silicon substrate, there is a chamfer portion for preventing chipping or cracking as illustrated in FIG. 2A. Note that the shape of the substrate is not limited to the circular shape, and a silicon substrate which is processed into a rectangular shape or the like can also be used. The case where a rectangular single crystal silicon substrate is used as the semiconductor substrate 100 is described below.

Note that a surface of the semiconductor substrate 100 is preferably cleaned using a sulfuric acid/hydrogen peroxide mixture (SPM), an ammonium hydroxide/hydrogen peroxide mixture (APM), a hydrochloric acid/hydrogen peroxide mixture (HPM), dilute hydrofluoric acid (DHF), or the like, as appropriate. Further, dilute hydrofluoric acid and ozone water may be alternately used to clean the surface of the semiconductor substrate 100.

Figure 3B:
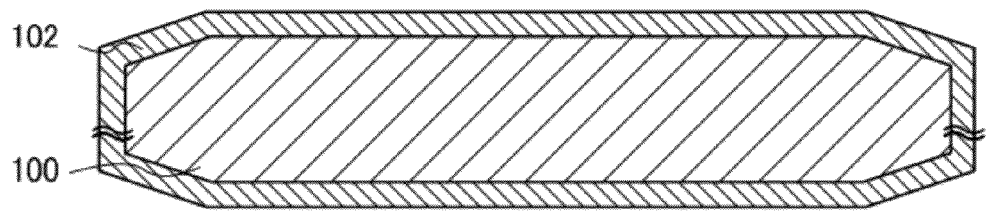
Figure 3C:
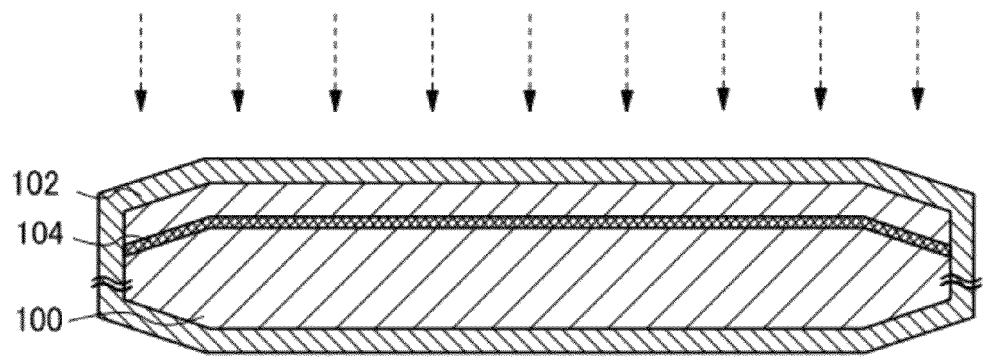

After the surface of the semiconductor substrate 100 is cleaned, an insulating layer 102 is formed over the semiconductor substrate 100 (see FIG. 3B and the step A-2 in FIG. 6). The insulating layer 102 may be formed using a single insulating film or a stacked layer including a plurality of insulating films. The insulating layer 102 can be formed using an insulating film which contains silicon as a component, such as a silicon oxide film, a silicon nitride film, a silicon oxynitride film, or a silicon nitride oxide film. In this embodiment, the case where a silicon oxide film is used as the insulating layer 102 is described as an example.

Note that in this specification and the like, a silicon oxynitride film means a film that contains more oxygen atoms than nitrogen atoms, and contains oxygen, nitrogen, silicon, and hydrogen at concentrations ranging from 50 atomic % to 70 atomic %, 0.5 atomic % to 15 atomic %, 25 atomic % to 35 atomic %, and 0.1 atomic % to 10 atomic %, respectively, when they are measured by Rutherford backscattering spectrometry (RBS) and hydrogen forward scattering spectrometry (HFS). Further, a silicon nitride oxide film means a film that contains more nitrogen atoms than oxygen atoms, and contains oxygen, nitrogen, silicon, and hydrogen at concentrations ranging from 5 atomic % to 30 atomic %, 20 atomic % to 55 atomic %, 25 atomic % to 35 atomic %, and 10 atomic % to 30 atomic %, respectively, when they are measured by RBS and HFS. Note that percentages of nitrogen, oxygen, silicon, and hydrogen fall within the ranges given above when the total number of atoms contained in the silicon oxynitride film or the silicon nitride oxide film is defined as 100 atomic %.

In the case where a silicon oxide film is used as the insulating layer 102, the insulating layer 102 can be formed with a vapor deposition method such as a thermal CVD method, a plasma CVD method, an atmospheric pressure CVD method, or a bias ECRCVD method using a mixed gas of silane and oxygen, a mixed gas of tetraethoxysilane (TEOS) and oxygen, or the like. In this case, a surface of the insulating layer 102 may be densified by oxygen plasma treatment.

Alternatively, a silicon oxide film which is formed by a chemical vapor deposition method using an organosilane gas may be used as the insulating layer 102. For an organosilane gas, a silicon-containing compound such as tetraethoxysilane (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), or trisdimethylaminosilane (chemical formula: $SiH(N(CH_3)_2)_3$) can be used.

Further alternatively, the insulating layer 102 can be formed using an oxide film obtained by oxidizing the semiconductor substrate 100. Thermal oxidation treatment for forming the oxide film may be dry oxidation, and may be performed under an oxidation atmosphere to which a halogen-containing gas is added. As the halogen-containing gas, one or plural kinds of gases selected from HCl, HF, $NF_3$, HBr, $Cl_2$, $ClF_3$, $BCl_3$, $F_2$, $Br_2$, and the like can be used. Note that the insulating layer 102 is formed to cover the semiconductor substrate 100 in FIG. 3B; however, this embodiment is not limited to this structure. In the case where the insulating layer 102 is formed with a CVD method or the like over the semiconductor substrate 100, the insulating layer 102 may be formed over only one of the surfaces of the semiconductor substrate 100.

As an example of formation conditions of the thermal oxide film, heat treatment is performed at higher than or equal to 700° C. and lower than or equal to 1100° C. (typically at approximately 950° C.) under an atmosphere containing HCl at a rate of 0.5 vol % to 10 vol % (preferably 3 vol %) with respect to oxygen. Treatment time may be 0.1 hour to 6 hours, preferably, 0.5 hour to 1 hour. The thickness of the oxide film to be formed can be set in the range of 10 nm to 1100 nm (preferably, 50 nm to 150 nm), for example, 100 nm.

By such thermal oxidation treatment under an atmosphere containing a halogen element, heavy metal that is an extrinsic impurity (e.g., Fe, Cr, Ni, or Mo) can be removed.

Further, the insulating layer 102 containing a halogen element such as chlorine can serve to getter impurities (e.g., mobile ions of Na or the like) which adversely affect the semiconductor substrate 100. Specifically, by heat treatment which is performed after the insulating layer 102 is formed, impurities contained in the semiconductor substrate 100 are separated out to the insulating layer 102, reacted with halogen atoms (e.g., chlorine atoms), and captured. Accordingly, the impurities captured in the insulating layer 102 can be fixed and prevented from contaminating the semiconductor substrate 100. Further, when the insulating layer 102 is bonded to a glass substrate, the insulating layer 102 can also function as a film for fixing impurities such as Na contained in glass.

In particular, the inclusion of halogen such as chlorine in the insulating layer 102 by heat treatment under an atmosphere containing halogen is effective in removing contaminants of the semiconductor substrate 100 when cleaning of the semiconductor substrate 100 is insufficient or when the semiconductor substrate 100 is repeatedly subjected to reprocessing treatment and used.

Moreover, the halogen element contained in the oxidation treatment atmosphere terminates defects on the surface of the semiconductor substrate 100; therefore, the local level density of an interface between the oxide film and the semiconductor substrate 100 can be reduced.

The halogen element contained in the insulating layer 102 makes distortions in the insulating layer 102. As a result, water absorption rate of the insulating layer 102 is improved and diffusion rate of water is increased. That is, when water exists at the surface of the insulating layer 102, the water which exists at the surface can be rapidly absorbed and diffused into the insulating layer 102.

In the case where, as a base substrate, a glass substrate which contains impurities which decrease reliability of a semiconductor device, such as alkali metal or alkaline earth metal, is used, the insulating layer 102 preferably includes at least one or more films which can prevent the impurities in the base substrate from diffusing into the semiconductor layer of the SOI substrate. Examples of such a film include a silicon nitride film, a silicon nitride oxide film, and the like. With such a film included in the insulating layer 102, the insulating layer 102 can function as a barrier film (also referred to as a blocking film).

For example, a silicon nitride film can be formed using a mixed gas of silane and ammonium with a vapor deposition method such as a plasma CVD method. In addition, for example, a silicon nitride oxide film can be formed using a mixed gas of silane, ammonia, and a compound containing oxygen (e.g., oxygen, dinitrogen monoxide, nitric oxide, nitrogen dioxide, or the like) with a vapor deposition method such as a plasma CVD method.

For example, in the case where a barrier film having a single-layer structure is formed as the insulating layer 102, the insulating layer 102 can be formed using a silicon nitride film or a silicon nitride oxide film with a thickness of greater than or equal to 15 nm and less than or equal to 300 nm.

In the case where a two-layer barrier film is formed as the insulating layer 102, the upper layer is formed using an insulating film with a high barrier property. An insulating film of the upper layer can be formed using, for example, a silicon nitride film or a silicon nitride oxide film having a thickness of 15 nm to 300 nm. These films have a high blocking effect for preventing impurity diffusion, but their internal stress is also high. Therefore, as an insulating film of the lower layer that is in contact with the semiconductor substrate 100, a film that has an effect of relieving the stress of the insulating film of the upper layer is preferably selected. As the insulating film with an effect of relieving the stress of the insulating film of the upper layer, a silicon oxide film, a silicon oxynitride film, a thermal oxide film formed by thermally oxidizing the semiconductor substrate 100, and the like are given. The thickness of the insulating film of the lower layer can be greater than or equal to 5 nm and less than or equal to 200 nm.

For example, in order for the insulating layer 102 to function as a barrier film, the insulating layer 102 is preferably formed using a combination of a silicon oxide film and a silicon nitride film, a silicon oxynitride film and a silicon nitride film, a silicon oxide film and a silicon nitride oxide film, a silicon oxynitride film and a silicon nitride oxide film, or the like for the upper layer and the lower layer.

Next, the semiconductor substrate 100 is irradiated with an ion beam containing ions accelerated by an electric field through the insulating layer 102, as indicated by arrows. Thus, the embrittlement region 104 is formed in a region at a desired depth from the surface of the semiconductor substrate 100 (see FIG. 3C and the step A-3 in FIG. 6). The depth at which the embrittlement region 104 is formed is substantially the same as the average penetration depth of the ions, and can be adjusted by the acceleration energy of the ion beam and the incident angle of the ion beam. In addition, the acceleration energy can be adjusted by acceleration voltage and the like. The thickness of a semiconductor layer 124 which is separated from the semiconductor substrate 100 later is determined by the depth at which the embrittlement region 104 is formed. The depth at which the embrittlement region 104 is formed can be set in the range of, for example, greater than or equal to 10 nm and less than or equal to 500 nm, preferably, greater than or equal to 50 nm and less than or equal to 200 nm from the surface of the semiconductor substrate 100; for example, the depth is preferably approximately 100 nm from the surface of the semiconductor substrate 100. Note that irradiation with ions is performed after formation of the insulating layer 102 in this embodiment; however, without being limited thereto, the irradiation with ions may be performed before the formation of the insulating layer 102.

The embrittlement region 104 can be formed by ion doping treatment. The ion doping treatment can be performed with an ion doping apparatus. A typical example of an ion doping apparatus is a non-mass-separation apparatus with which an object placed in a chamber is irradiated with all ion species generated by excitation of a process gas into plasma. The non-mass-separation apparatus is an apparatus with which an object is irradiated with all ion species without mass separation of ion species in plasma.

Main components of an ion doping apparatus are as follows: a chamber in which an object is placed; an ion source for generating desired ions; and an acceleration mechanism for acceleration of ions for irradiation therewith. The ion source includes a gas supply device which supplies a source gas for generating desired ion species, an electrode for exciting the source gas to generate plasma, and the like. As the electrode for generating plasma, a capacitively-coupled high-frequency discharge electrode, a filament electrode, or the like is used. The acceleration mechanism includes electrodes such as an extraction electrode, an acceleration electrode, a deceleration electrode, and a ground electrode; a power source for supplying power to these electrodes; and the like. These electrodes included in the acceleration mechanism are provided with a plurality of openings or slits, through which ions that are generated from the ion source are accelerated. Note that components of the ion doping apparatus are not limited to those described above and may be changed as needed.

In this embodiment, the case where the semiconductor substrate 100 is irradiated with ions generated from a hydrogen gas using an ion doping apparatus is described. A hydrogen-containing gas such as $H_2$ is supplied as a plasma source gas. A hydrogen gas is excited to generate plasma, ions contained in plasma are accelerated without mass separation, and the semiconductor substrate 100 is irradiated with the accelerated ions.

In the above ion irradiation treatment, the percentage of $H_3^+$ ions to the total amount of ion species ($H^+$, $H_2^+$, and $H_3^+$) that are generated from a hydrogen gas is set to 50% or higher. Preferably, the percentage of $H_3^+$ ions is set to 80% or higher. This is because an increase in the percentage of $H_3^+$ ions in plasma enables the semiconductor substrate 100 to be efficiently irradiated with hydrogen ions. Note that the mass of an $H_3^+$ ion is three times as large as that of an $H^+$ ion; therefore, when irradiation with one hydrogen atom is performed at a depth, the acceleration voltage for an $H_3^+$ ion can be three times as high as that of an $H^+$ ion. For this reason, the take time in the ion irradiation step can be shortened, and productivity and throughput can be improved. By irradiation with ions having the same mass, the semiconductor substrate 100 can be irradiated with ions in a concentrated manner at the same depth.

Ion doping apparatuses are inexpensive and excellent in use for large-area treatment. Therefore, by irradiation with $H_3^+$ ions using an ion doping apparatus, significantly large effects such as improvement in semiconductor characteristics, an increase in area, reduction in cost, and an improvement in productivity can be obtained.

Further, the embrittlement region 104 may be formed by ion implantation treatment using an ion implantation apparatus. The ion implantation apparatus is a mass-separation apparatus with which an object that is placed in a chamber is irradiated with a specific ion species through mass separation of a plurality of ion species that are generated by plasma excitation of a source gas. In the case where an ion implantation apparatus is used, $H^+$ ions, $H_2^+$ ions, and $H_3^+$ ions which are generated by excitation of a hydrogen gas or $PH_3$ are mass-separated, and the semiconductor substrate 100 is irradiated with any of these ions.

With an ion implantation apparatus, the semiconductor substrate 100 can be irradiated with one kind of ions, and the semiconductor substrate 100 can be irradiated with ions in a concentrated manner at the same depth. Therefore, the profile of the ions with which the semiconductor substrate 100 is irradiated can be sharpened, and thus the surface planarity of the semiconductor layer to be separated can be easily increased. Moreover, the ion implantation apparatus is preferable because, owing to its electrode structure, contamination by heavy metal is relatively low and thus deterioration of characteristics of the semiconductor layer can be suppressed.

Next, the semiconductor substrate 100 over which the insulating layer 102 is formed is cleaned. This cleaning step can be performed by ultrasonic cleaning with the use of pure water, by two-fluid jet cleaning with the use of pure water and nitrogen, or the like. The ultrasonic cleaning is preferably megahertz ultrasonic cleaning (megasonic cleaning). After the above ultrasonic cleaning or the two-fluid jet cleaning, the semiconductor substrate 100 may be further cleaned with ozone water. By the cleaning with ozone water, removal of organic substances and surface activation treatment for improving the hydrophilicity of the surface of the insulating layer 102 can be performed.

The surface activation of the insulating layer 102 can be performed by irradiation treatment with an atomic beam or an ion beam, ultraviolet treatment, ozone treatment, plasma treatment, plasma treatment with bias application, or radical treatment instead of the cleaning with ozone water (see the step A-4 in FIG. 6). In the case where an atomic beam or an ion beam is used, an inert gas neutral atom beam or an inert gas ion beam of argon or the like can be used.

Here, an example of ozone treatment is described. For example, the ozone treatment can be performed on a surface of an object by irradiation with ultraviolet (UV) rays under an atmosphere containing oxygen. The ozone treatment in which irradiation with ultraviolet rays is performed under an atmosphere containing oxygen is also called UV ozone treatment, ultraviolet ozone treatment, or the like. Under an atmosphere containing oxygen, irradiation with ultraviolet light having a wavelength of less than 200 nm and ultraviolet light having a wavelength of greater than or equal to 200 nm is performed, whereby ozone can be generated and singlet oxygen can be generated by ozone. In addition, irradiation with ultraviolet light having a wavelength of less than 180 nm is performed, whereby ozone can be generated and singlet oxygen can be generated by ozone.

Examples of reactions which occur by performing irradiation with light having a wavelength of less than 200 nm and light having a wavelength of greater than or equal to 200 nm under an atmosphere containing oxygen are described below.

$$O_2 + h\nu_1(\lambda_1 \text{ nm}) \rightarrow O(^3P) + O(^3P) \tag{1}$$

$$O(^3P) + O_2 \rightarrow O_3 \tag{2}$$

$$O_3 + h\nu_2(\lambda_2 \text{ nm}) \rightarrow O(^1D) + O_2 \tag{3}$$

In the reaction formula (1), by irradiation with light ($h\nu_1$) having a wavelength ($\lambda_1$ nm) of less than 200 nm under an atmosphere containing oxygen ($O_2$), oxygen atoms ($O(^3P)$) in a ground state are generated. Then, in the reaction formula (2), the oxygen atom ($O(^3P)$) in a ground state and oxygen ($O_2$) react with each other; accordingly, ozone ($O_3$) is generated. Then, in the reaction formula (3), by irradiation with light ($h\nu_2$) having a wavelength ($\lambda_2$ nm) of greater than or equal to 200 nm under an atmosphere containing generated ozone ($O_3$), singlet oxygen $O(^1D)$ in an excited state is generated. Under an atmosphere containing oxygen, ozone is generated by irradiation with ultraviolet light having a wavelength of less than 200 nm while ozone is decomposed and singlet oxygen is generated by irradiation with ultraviolet light having a wavelength of greater than or equal to 200 nm. The ozone treatment described above, for example, can be performed by irradiation with a low-pressure mercury lamp ($\lambda_1$=185 nm, $\lambda_2$=254 nm) under an atmosphere containing oxygen.

In addition, examples of reactions which occur by performing irradiation with light having a wavelength of less than 180 nm under an atmosphere containing oxygen are described.

$$O_2 + h\nu_3(\lambda_3 \text{ nm}) \rightarrow O(^1D) + O(^3P) \quad (4)$$

$$O(^3P) + O_2 \rightarrow O_3 \quad (5)$$

$$O_3 + h\nu_3(\lambda_3 \text{ nm}) \rightarrow O(^1D) + O_2 \quad (6)$$

In the above reaction formula (4), by irradiation with light ($h\nu_3$) having a wavelength ($\lambda_3$ nm) of less than 180 nm under an atmosphere containing oxygen ($O_2$), singlet oxygen $O(^1D)$ in an excited state and an oxygen atom ($O(^3P)$) in a ground state are generated. Next, in the reaction formula (5), an oxygen atom ($O(^3P)$) in a ground state and oxygen ($O_2$) are reacted with each other; accordingly, ozone ($O_3$) is generated. In the reaction formula (6), by irradiation with light ($h\nu_3$) having a wavelength ($\lambda_3$ nm) of less than 180 nm under an atmosphere containing generated ozone ($O_3$), singlet oxygen in an excited state and oxygen are generated. Under an atmosphere containing oxygen, by irradiation with ultraviolet light having a wavelength of less than 180 nm, ozone is generated and singlet oxygen is generated by decomposing ozone or oxygen. The ozone treatment described above, for example, can be performed by irradiation with a Xe excimer UV lamp ($\lambda_3$=172 nm) under an atmosphere containing oxygen.

Chemical bonding of an organic substance attached to a surface of an object is cleaved by irradiation with the light having a wavelength of less than 200 nm, and the organic substance attached to the surface of the object or the organic substance whose chemical bonding is cleaved can be removed by oxidative decomposition with ozone or singlet oxygen generated by ozone. By performing such ozone treatment as described above, a hydrophilicity and purity of the surface of the object can be increased, and favorable bonding can be performed.

Under an atmosphere containing oxygen, ozone is generated by performing irradiation with ultraviolet rays. Ozone is effective in removal of the organic substance attached to the surface of the object. In addition, singlet oxygen is effective in removal of the organic substance attached to the surface of the object as much as or more than ozone. Ozone and singlet oxygen are examples of oxygen in an active state, and collectively referred to as active oxygen. As described with the above reaction formulae and the like, since there are a reaction where ozone is generated at the time of generating singlet oxygen and a reaction where singlet oxygen is generated by ozone, such reactions including a reaction to which singlet oxygen contributes are referred to as ozone treatment here for convenience.

Next, a process of preparing bonding of the base substrate 120 to the semiconductor substrate 100 is described. This process relates to treatment for the base substrate 120 and corresponds to Process B in FIG. 6.

First, the base substrate 120 is prepared (see the step B-1 in FIG. 6). As the base substrate 120, a variety of glass substrates used in the electronics industry, such as a substrate of aluminosilicate glass, barium borosilicate glass, or aluminoborosilicate glass; a quartz substrate; a ceramic substrate; a sapphire substrate; or the like can be used. In addition, as the base substrate 120, a single crystal semiconductor substrate (e.g., a single crystal silicon substrate) or a polycrystalline semiconductor substrate (e.g., a polycrystalline silicon substrate) may be used. For example, a polycrystalline silicon substrate has advantages of being less expensive than a single crystal silicon substrate and having higher heat resistance than a glass substrate.

In the case where a glass substrate is used as the base substrate 120, for example, a mother glass substrate which is developed for manufacturing liquid crystal panels is preferably used. As a mother glass substrate, substrates having the following sizes are known: the third generation (550 mm×650 mm), the 3.5-th generation (600 mm×720 mm), the fourth generation (680 mm×880 mm or 730 mm×920 mm), the fifth generation (1100 mm×1300 mm), the sixth generation (1500 mm×1850 mm), the seventh generation (1870 mm×2200 mm), the eighth generation (2200 mm×2400 mm), the ninth generation (2400 mm×2800 mm), the tenth generation (2850 mm×3050 mm), and the like. By manufacturing an SOI substrate with the use of a large-sized mother glass substrate as the base substrate 120, the SOI substrate can have a large area. An increase in the area of the SOI substrate allows many ICs to be manufactured all at once, and thus the number of semiconductor devices manufactured from one substrate is increased; therefore, productivity can be dramatically increased.

Further, an insulating layer 122 is preferably formed over the base substrate 120 (see the step B-2 in FIG. 6). Needless to say, the insulating layer 122 is not necessarily provided over the base substrate 120. However, for example, by forming, over the base substrate 120, a silicon nitride film, a silicon nitride oxide film, an aluminum nitride film, an aluminum nitride oxide film, or the like, which functions as a barrier film, as the insulating layer 122, impurities such as alkali metal or alkaline earth metal in the base substrate 120 can be prevented from entering the semiconductor substrate 100.

Since the insulating layer 122 is used as a bonding layer, a surface of the insulating layer 122 is preferably planarized in order to avoid defective bonding. Specifically, the insulating layer 122 is formed to have an average surface roughness (Ra) of 0.50 nm or less and a root-mean-square roughness (Rms) of 0.60 nm or less, preferably, an average surface roughness of 0.35 nm or less and a root-mean-square roughness of 0.45 nm or less. The thickness can be set as appropriate in the range of greater than or equal to 10 nm and less than or equal to 200 nm, preferably, greater than or equal to 50 nm and less than or equal to 100 nm.

A surface of the base substrate 120 is cleaned before the bonding. The surface of the base substrate 120 can be cleaned with hydrochloric acid and hydrogen peroxide water or by megahertz ultrasonic cleaning, two-fluid jet cleaning, cleaning with ozone water or the like. In a manner similar to that of the insulating layer 102, surface activation treatment such as irradiation treatment with an atomic beam or an ion beam, ultraviolet treatment, ozone treatment, plasma treatment, plasma treatment with bias application, or radical treatment is preferably performed on the surface of the insulating layer 122 before the bonding (see the step B-3 in FIG. 6).

Next, a process of bonding the semiconductor substrate 100 to the base substrate 120 and separating the semiconductor substrate 100 into the semiconductor layer 124 and the semiconductor substrate 121 is described. This process corresponds to Process C in FIG. 6.

Figure 4A:
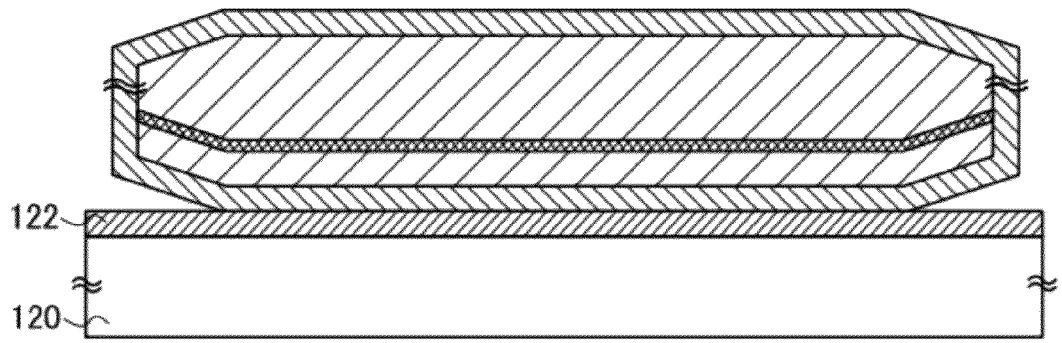
FIGS. 4A to 4C are cross-sectional views illustrating a method for manufacturing an SOI substrate.

First, the semiconductor substrate 100 processed through the above process is bonded to the base substrate 120 (see FIG. 4A and the step C-1 in FIG. 6). Here, the semiconductor substrate 100 and the base substrate 120 are bonded to each other with the insulating layer 102 and the insulating layer 122 interposed therebetween; however, this embodiment is not limited to this structure in the case where the insulating layers are not formed.

The bonding can be performed by applying pressure of approximately 0.001 N/cm$^2$ to 100 N/cm$^2$, preferably, approximately 1 N/cm$^2$ to 20 N/cm$^2$ to one part at an end of the base substrate 120 so that bonding surfaces are in contact with each other. When pressure is applied so that the semiconductor substrate 100 is in contact with or closely attached to the base substrate 120, bonding of the substrates starts and spreads spontaneously to the entire surface. In this manner, the bonding between the base substrate 120 and the semiconductor substrate 100 is completed. This bonding is based on a principle of the Van der Waals force or the like, and strong bonding can be achieved even at room temperature.

Note that a region called an edge roll off region exists in a peripheral portion of the semiconductor substrate 100. In the edge roll off region, the semiconductor substrate 100 (the insulating layer 102) is not in contact with the base substrate 120 (the insulating layer 122) in some cases. Also in a chamfer portion which exists outside the edge roll off region (on an end side of the semiconductor substrate 100), the base substrate 120 and the semiconductor substrate 100 are not in contact with each other.

In a CMP method used for manufacturing the semiconductor substrate 100, owing to its principle, polishing tends to progress in the peripheral portion of the semiconductor substrate at higher speed than in a central portion thereof. Accordingly, in the peripheral portion of the semiconductor substrate 100, a region where the thickness of the semiconductor substrate 100 is thinner than that in the central portion and the planarity is low is formed. This is the region called an edge roll off region. Bonding with the base substrate 120 is not performed in such an edge roll off region in some cases. Further, in the case where an end portion of the semiconductor substrate 100 is chamfered, bonding cannot be performed at the chamfer portion.

In the case where a plurality of semiconductor substrates 100 are bonded to one base substrate 120, pressure is preferably applied to each of the semiconductor substrates 100. This is because there might be some cases where a semiconductor substrate 100 is not in contact with the base substrate 120 due to differences in the thickness of the semiconductor substrates 100, which depends on an arrangement method of the base substrate 120 and the plurality of semiconductor substrate 100. Note that even in the case where there is a slight difference in the thickness of the semiconductor substrates 100, bonding can be favorably performed when the semiconductor substrates 100 can be closely attached to the base substrate 120 owing to bend of the base substrate 120 or the like; therefore, this embodiment is not limited thereto.

After the semiconductor substrate 100 is bonded to the base substrate 120, heat treatment for increasing the bonding strength is preferably performed (see the step C-2 in FIG. 6). The temperature of the heat treatment is preferably set to a temperature at which a crack is not caused in the embrittlement region 104, for example, higher than or equal to 200° C. and lower than or equal to 450° C. Alternatively, when the semiconductor substrate 100 is bonded to the base substrate 120 while being heated in this temperature range, a similar effect can be obtained. Note that it is preferable that the above heat treatment be successively performed in an apparatus or a place where the bonding has been performed. This is for prevention of separation of the substrates due to transportation thereof before the heat treatment.

Note that when a particle or the like is attached to the bonding surface at the time of bonding the semiconductor substrate 100 to the base substrate 120, the portion where the particle or the like is attached is not bonded. In order to avoid attachment of a particle, the semiconductor substrate 100 and the base substrate 120 are preferably bonded in a treatment chamber where air tightness is secured. At the time of bonding the semiconductor substrate 100 to the base substrate 120, the treatment chamber may be in a state of reduced pressure (e.g., approximately $5.0 \times 10^{-3}$ Pa) and the atmosphere of the bonding treatment is cleaned.

Figure 4B:
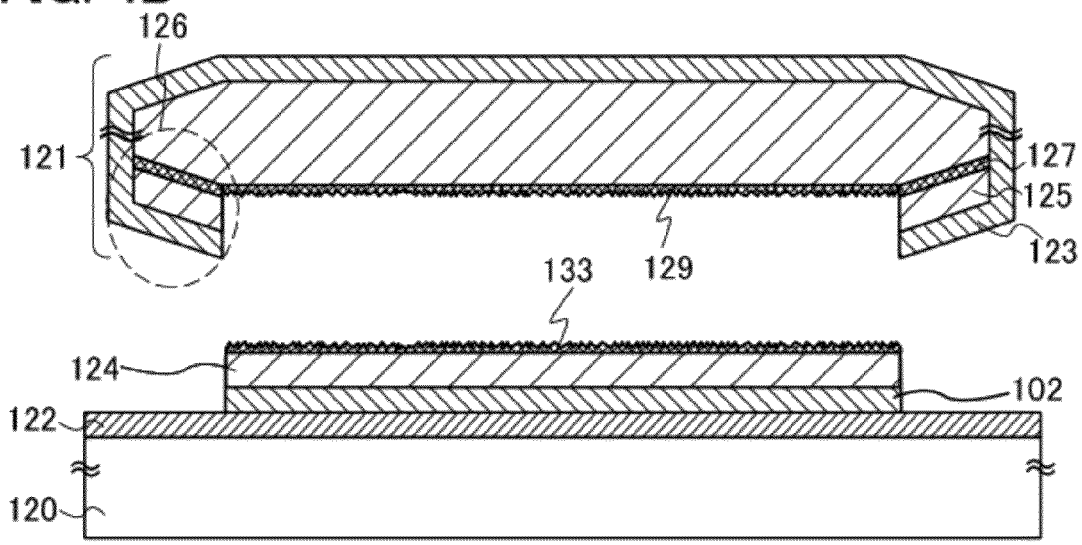
Figure 4C:
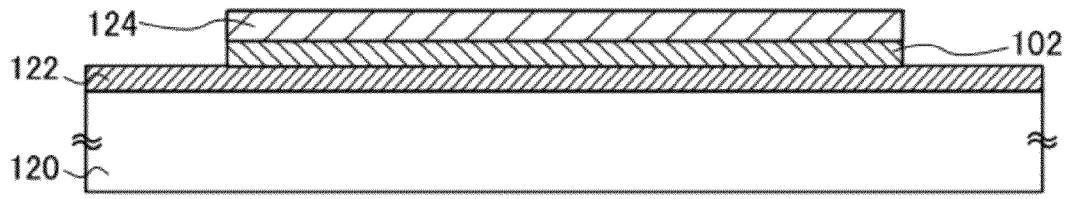

Next, the heat treatment is performed so that the semiconductor substrate 100 is separated along the embrittlement region 104, and thus the semiconductor layer 124 is formed over the base substrate 120 while the semiconductor substrate 121 is formed (see FIG. 4B and the step C-3 in FIG. 6). Since the semiconductor substrate 100 and the base substrate 120 are bonded to each other in a region other than the edge roll off region and the chamfer portion, the semiconductor layer 124 which is separated from the semiconductor substrate 100 is fixed to the base substrate 120.

Here, the heat treatment for separating the semiconductor layer 124 is performed at a temperature below the strain point of the base substrate 120. This heat treatment can be performed using a rapid thermal anneal (RTA) apparatus, a resistance heating furnace, a microwave heating apparatus, or the like. Examples of RTA apparatuses include a gas rapid thermal anneal (GRTA) apparatus, a lamp rapid thermal anneal (LRTA) apparatus, and the like. In the case where a GRTA apparatus is used, the temperature can be set at higher than or equal to 550° C. and lower than or equal to 650° C., and the treatment time can be set to longer than or equal to 0.5 minute and shorter than or equal to 60 minutes. In the case where a resistance heating furnace is used, the temperature can be set at higher than or equal to 200° C. and lower than or equal to 650° C., and the treatment time can be set to longer than or equal to 2 hours and shorter than or equal to 4 hours.

Further, the above heat treatment may be performed by irradiation with a microwave or the like. As a specific example, the semiconductor substrate 100 can be separated by being irradiated with a microwave with a frequency of 2.45 GHz at 900 W for approximately 5 minutes to 30 minutes.

In interfaces along which the semiconductor layer 124 and the semiconductor substrate 121 have been separated, the semiconductor region 129 irradiated with ions and a semiconductor region 133 irradiated with ions are left. These regions correspond to the embrittlement region 104 before the separation. Therefore, the semiconductor region 129 and the semiconductor region 133 include a lot of hydrogen and crystal defects.

Further, the step portion 126 exists in a region of the semiconductor substrate 121, in which the bonding is not performed (specifically a region corresponding to the edge roll off region and the chamfer portion of the semiconductor substrate 100). The step portion 126 includes the semiconductor region 127, the unseparated semiconductor region 125, and the insulating layer 123. The semiconductor region 127, as well as the semiconductor region 129 and the like, has been part of the embrittlement region 104, and thus includes a lot of hydrogen and crystal defects. In addition, the semiconductor region 125 includes less hydrogen than the semiconductor region 127 or the like but includes crystal defects due to ion irradiation or the like.

Next, a process of planarizing a surface of the semiconductor layer 124 which is bonded to the base substrate 120 to recover crystallinity is described. This process corresponds to Process D in FIG. 6.

The semiconductor region 133 over the semiconductor layer 124 which is closely attached to the base substrate 120 has crystal defects and the planarity is lowered due to formation of the embrittlement region 104 and separation of the semiconductor substrate 100 along the embrittlement region 104. Therefore, the semiconductor region 133 may be removed by polishing or the like so that the surface of the semiconductor layer 124 is planarized (see FIG. 4C and the step D-1 in FIG. 6). The planarization is not necessarily performed; however, the planarization enables improvement in characteristics of an interface between the semiconductor layer and a layer (e.g., an insulating layer) formed on a surface of the semiconductor layer in a later step. Specifically, polishing can be performed by chemical mechanical polishing (CMP), liquid jet polishing, or the like. Here, at the time of removing the semiconductor region 133, the semiconductor layer 124 is also polished to be a thin film in some cases.

Further, in the case where the peripheral portion of the semiconductor layer 124 is easily broken or in the case where the semiconductor layer 124 has poor linearity, the following process may be performed after removal of the peripheral portion.

Further, the semiconductor region 133 can be removed by etching so that the semiconductor layer 124 is planarized. The above etching can be performed with a dry etching method such as a reactive ion etching (RIE) method, an inductively coupled plasma (ICP) etching method, an electron cyclotron resonance (ECR) etching method, a parallel plate (capacitively coupled) etching method, a magnetron plasma etching method, a dual-frequency plasma etching method, or a helicon wave plasma etching method, for example. Note that both the polishing and the etching may be employed so that the semiconductor region 133 is removed and the surface of the semiconductor layer 124 is planarized.

Furthermore, by the polishing and the etching, the surface of the semiconductor layer 124 is planarized, and the semiconductor layer 124 can be reduced in thickness so as to have a thickness which is suitable for a semiconductor element that is completed later.

Laser irradiation may be performed on the semiconductor layer 124 in order to reduce crystal defects and improve the planarity (see the step D-2 in FIG. 6). Alternatively, without removal of the semiconductor region 133, laser irradiation may be performed on the semiconductor region 133 and the semiconductor layer 124.

In the case where the semiconductor region 133 is removed and the surface of the semiconductor layer 124 is planarized by dry etching before the laser irradiation, defects might occur in the vicinity of the surface of the semiconductor layer 124. However, by the above laser irradiation, such defects can be repaired.

Since an increase in the temperature of the base substrate 120 can be suppressed in the laser irradiation step, a substrate having low heat resistance can be used as the base substrate 120. It is preferable that the semiconductor region 133 be completely melted and the semiconductor layer 124 be partly melted by the laser irradiation. This is because when the semiconductor layer 124 is completely melted, recrystallization of the semiconductor layer 124 is accompanied with disordered nucleation of the semiconductor layer 124 in a liquid phase and the crystallinity of the semiconductor layer 124 is lowered. By partly melting the semiconductor layer 124, crystal growth progresses from a solid phase portion which is not melted; thus, crystal defects in the semiconductor layer 124 are reduced and the crystallinity is recovered. Note that complete melting of the semiconductor layer 124 indicates that the semiconductor layer 124 is melted up to the interface between the semiconductor layer 124 and the insulating layer 102 to be in a liquid state. On the other hand, a partly melted state of the semiconductor layer 124 indicates that part of the semiconductor layer 124 (here an upper layer) is melted and becomes a liquid phase while another part thereof (here a lower layer) remains in a solid phase.

After the laser irradiation, the surface of the semiconductor layer 124 may be etched. In this case, before the laser irradiation, the semiconductor region 133 may be etched or may not be etched. By this etching, the surface of the semiconductor layer 124 is planarized, and the semiconductor layer 124 can be reduced in thickness so as to have a thickness which is suitable for the semiconductor element that is formed later.

After the laser irradiation, the semiconductor layer 124 is preferably subjected to heat treatment at higher than or equal to 500° C. and lower than or equal to 650° C. (see the step D-3 in FIG. 6). By this heat treatment, defects in the semiconductor layer 124 can be further reduced and distortion of the semiconductor layer 124 can be alleviated. For the heat treatment, a rapid thermal annealing (RTA) apparatus, a resistance heating furnace, a microwave heating apparatus, or the like can be used. Examples of RTA apparatuses include a gas rapid thermal anneal (GRTA) apparatus, a lamp rapid thermal anneal (LRTA) apparatus, and the like. For example, when a resistance heating furnace is used, the heat treatment may be performed approximately at 600° C. for 4 hours.

When the SOI substrate obtained through the above process is used for a subsequent process of manufacturing a semiconductor device, various kinds of semiconductor devices can be manufactured (see FIG. 6).

Next, a process of performing reprocessing treatment on the semiconductor substrate 121 and manufacturing a reprocessed semiconductor substrate is described. This process corresponds to Process E in FIG. 6. Note that the above embodiments can be referred to for details of this process and only the outline is described here.

Figure 5A:
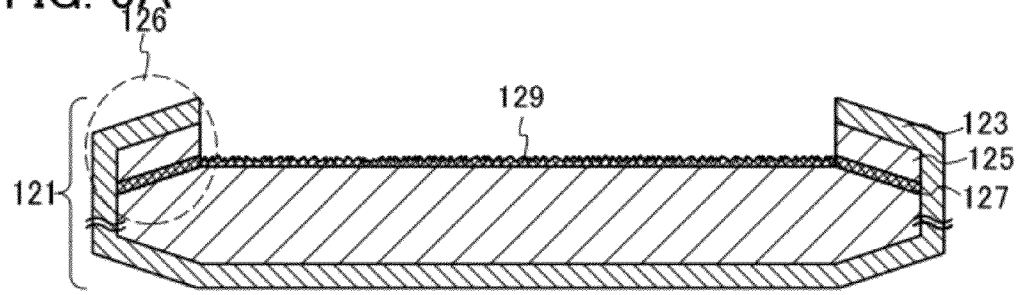
FIGS. 5A to 5C are cross-sectional views illustrating a method for manufacturing an SOI substrate.

The step portion 126 is formed in the peripheral portion of the semiconductor substrate 121 (see FIG. 5A). The step portion 126 includes the semiconductor region 127, the unseparated semiconductor region 125, and the insulating layer 123. The semiconductor region 125, the semiconductor region 127, and the semiconductor region 129 can be collectively referred to as a damaged semiconductor region.

Figure 5B:
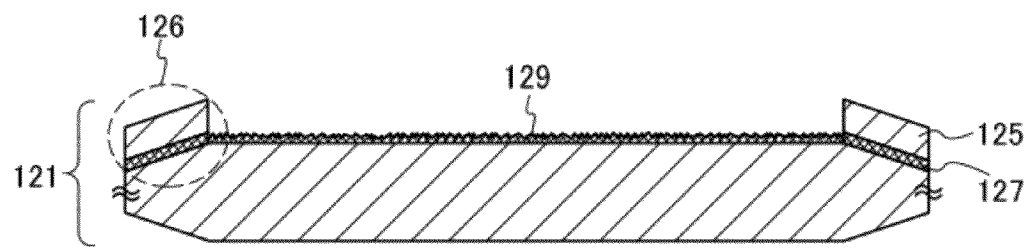

The first etching treatment is performed on the semiconductor substrate 121, and the insulating layer 123 of the semiconductor substrate 121 is removed (see FIG. 5B and the step E-1 in FIG. 6). The above embodiments may be referred to for details of this step.

Figure 5C:
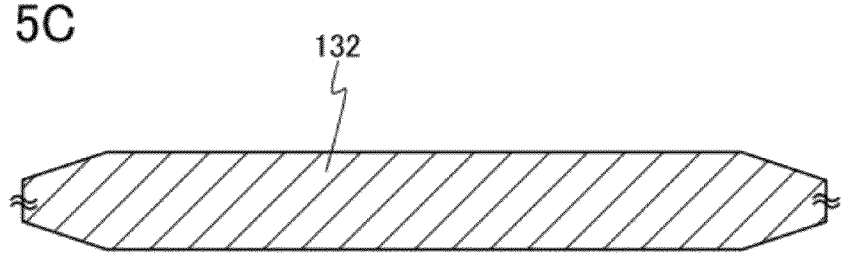

Next, the second etching treatment is performed, so that the semiconductor region 125 and the semiconductor region 127 which are included in the step portion 126 of the semiconductor substrate 121 are selectively removed and the reprocessed semiconductor substrate 132 is formed (see FIG. 5C and the step E-2 in FIG. 6). At this time, the semiconductor region 129 is also removed. The above embodiments can also be referred to for details of this step.

Here, in the case where the planarity of the semiconductor substrate 121 after the second etching treatment is not enough, the semiconductor substrate 121 can be planarized by heat treatment under an atmosphere containing hydrogen (see the step E-3 in FIG. 6). The above embodiments can be referred to for details.

In this manner, by the heat treatment under an atmosphere containing hydrogen after the step portion 126 is removed from the semiconductor substrate 121 through the first etching treatment and the second etching treatment, the reprocessed semiconductor substrate 132 can have high planarity.

In the above manner, the semiconductor substrate 121 is reprocessed into the reprocessed semiconductor substrate 132. The obtained reprocessed semiconductor substrate 132 can be reused as the semiconductor substrate 100 in Process A.

As described in this embodiment, the semiconductor substrate processed through the reprocessing treatment process is repeatedly used, whereby manufacturing cost for an SOI substrate can be reduced. In particular, when the method described in this embodiment or the like is employed, a damaged semiconductor region can be selectively removed; therefore, the amount of the semiconductor removed by the reprocessing treatment can be reduced and the number of times of reprocessing can be sufficiently secured. Further, the heat treatment under an atmosphere containing hydrogen is performed after the damaged semiconductor region is selectively removed, whereby a reprocessed semiconductor substrate having favorable planarity can be obtained.

The structure described in this embodiment can be used in appropriate combination with the structure described in any of the other embodiments.

Embodiment 3

In this embodiment, the case where an SOI substrate is manufactured using a silicon substrate or the like with high heat resistance as a base substrate will be described. Note that a method described in this embodiment is common to the above embodiment in many points. Therefore, different points will be mainly described in this embodiment. Drawings will not be particularly shown in this embodiment because drawings of this embodiment are in common with those of the above embodiment.

In a semiconductor substrate that is used as a bond substrate, an insulating layer and an embrittlement region are formed. Treatment and the like for the semiconductor substrate, which includes the formation of the insulating layer and the embrittlement region, are similar to those in the above embodiment. Therefore, description in the above embodiment may be referred to for such treatment and the like.

In this embodiment, a substrate with high heat resistance is used as a base substrate. Examples of a substrate with high heat resistance include a quartz substrate, a sapphire substrate, a semiconductor substrate (e.g., a single crystal silicon substrate or a polycrystalline silicon substrate), and the like. In this embodiment, the case where a single crystal silicon substrate is used as the base substrate is described.

A typical example of a single crystal silicon substrate is a circular substrate which is 5 inches (125 mm) in diameter, 6 inches (150 mm) in diameter, 8 inches (200 mm) in diameter, 12 inches (300 mm) in diameter, or 16 inches (400 mm) in diameter. Note that the shape is not limited to the circular shape, and a silicon substrate which is processed into a rectangular shape or the like can also be used. In the description given below, the case where a rectangular single crystal silicon substrate is used as the base substrate is described. Note that the size of the base substrate may be substantially the same as or different from that of the bond substrate.

Note that a surface of the base substrate is preferably cleaned using a sulfuric acid/hydrogen peroxide mixture (SPM), an ammonium hydroxide/hydrogen peroxide mixture (APM), a hydrochloric acid/hydrogen peroxide mixture (HPM), dilute hydrofluoric acid (DHF), or the like, as appropriate. Further, dilute hydrofluoric acid and ozone water may be alternately used to clean the surface of the base substrate.

An insulating layer may be formed over the base substrate. In the case where an insulating layer is formed over the base substrate, an insulating layer on the bond substrate side can be omitted. The insulating layer may be formed using a single insulating film or a stacked layer including a plurality of insulating films. The insulating layer can be formed using an insulating film which contains silicon as a component, such as a silicon oxide film, a silicon nitride film, a silicon oxynitride film, or a silicon nitride oxide film.

For example, the above insulating layer can be formed by thermal oxidation treatment. Although dry oxidation is preferably employed as the thermal oxidation treatment, the thermal oxidation treatment may be performed under an oxidation atmosphere to which a halogen-containing gas is added. As the halogen-containing gas, one or plural kinds of gases selected from HCl, HF, $NF_3$, HBr, $Cl_2$, $ClF_3$, $BCl_3$, $F_2$, $Br_2$, and the like can be used.

The surface of the base substrate is cleaned before bonding. The surface of the base substrate can be cleaned with hydrochloric acid and hydrogen peroxide water or by megahertz ultrasonic cleaning, two-fluid jet cleaning, cleaning with ozone water, or the like. Further, the bonding may be performed after the surface is subjected to surface activation treatment such as irradiation treatment with an atomic beam or an ion beam, ultraviolet treatment, ozone treatment, plasma treatment, plasma treatment with bias application, or radical treatment.

Next, the semiconductor substrate (the bond substrate) and the base substrate are bonded to each other, and the semiconductor substrate is separated. Accordingly, a semiconductor layer is formed over the base substrate. The above embodiment can be referred to for details of this process.

In this embodiment, the single crystal silicon substrate with high heat resistance is used as the base substrate. Therefore, the upper limit of the temperature of various heat treatments can be raised up to the vicinity of a melting point of the single crystal silicon substrate.

For example, the upper limit of the temperature of heat treatment for separating the semiconductor substrate can be set at approximately 1200° C. When the temperature of the heat treatment is set at 700° C. or higher, bonding strength with the base substrate can be further increased.

Next, a surface of the semiconductor layer bonded to the base substrate is planarized, and the crystallinity is recovered.

In the semiconductor layer which is closely attached to the base substrate, crystal defects due to formation of the embrittlement region and separation of the semiconductor substrate along the embrittlement region are formed, and the planarity of the semiconductor layer is lowered. Therefore, heat treatment is preferably performed to reduce the crystal defects and to improve the planarity of the surface. The heat treatment is preferably performed under the temperature condition of 800° C. to 1300° C., typically, 850° C. to 1200° C. When heat treatment is performed under such a relatively high temperature condition, crystal defects can be sufficiently reduced and the planarity of the surface can be improved.

For the heat treatment, a rapid thermal anneal (RTA) apparatus, a resistance heating furnace, a microwave heating apparatus, or the like can be used. For example, in the case where a resistance heating furnace is used, the heat treatment may be performed approximately at 950° C. to 1150° C. for 1 minute to 4 hours. Note that the heat treatment for separating the semiconductor substrate, if performed at higher temperature, can be performed instead of this heat treatment.

The semiconductor layer may be irradiated with laser light before or after the heat treatment. By the laser irradiation, crystal defects that cannot be repaired by the heat treatment can be repaired. The above embodiment can be referred to for details of the laser irradiation.

In addition, before or after the heat treatment, a semiconductor region in an upper portion of the semiconductor layer may be removed by polishing or the like so that the surface thereof is planarized. By this planarization treatment, the surface of the semiconductor layer can be further planarized. Specifically, the polishing can be performed by chemical mechanical polishing (CMP), liquid jet polishing, or the like. Note that the semiconductor layer may be reduced in thickness by this treatment in some cases.

Alternatively, the semiconductor region in the upper portion of the semiconductor layer can be removed by etching so that the surface thereof is planarized. The above etching can be performed with a dry etching method such as a reactive ion etching (RIE) method, an inductively coupled plasma (ICP) etching method, an electron cyclotron resonance (ECR) etching method, a parallel plate (capacitively coupled) etching method, a magnetron plasma etching method, a dual-frequency plasma etching method, or a helicon wave plasma etching method, for example. Note that the planarization may be performed using both the polishing and the etching.

Furthermore, by the polishing and the etching, in addition to the planarization of the surface of the semiconductor layer, the semiconductor layer can be reduced in thickness so as to have a thickness which is suitable for the semiconductor element that is formed later.

When the SOI substrate obtained through the above process is used for a subsequent process of manufacturing a semiconductor device, various kinds of semiconductor devices can be manufactured.

The above embodiment can be referred to for details of the process of performing reprocessing treatment on the semiconductor substrate and manufacturing a reprocessed semiconductor substrate.

As described in this embodiment, the semiconductor substrate processed through the reprocessing treatment process is repeatedly used, whereby manufacturing cost for an SOI substrate can be reduced. In particular, in the case where such heat treatment at high temperature as described in this embodiment is employed, an SOI substrate having favorable characteristics can be manufactured even when a slight defect remains in the semiconductor substrate.

The structure described in this embodiment can be used in appropriate combination with the structure described in any of the other embodiments.

Embodiment 4

Figure 7:
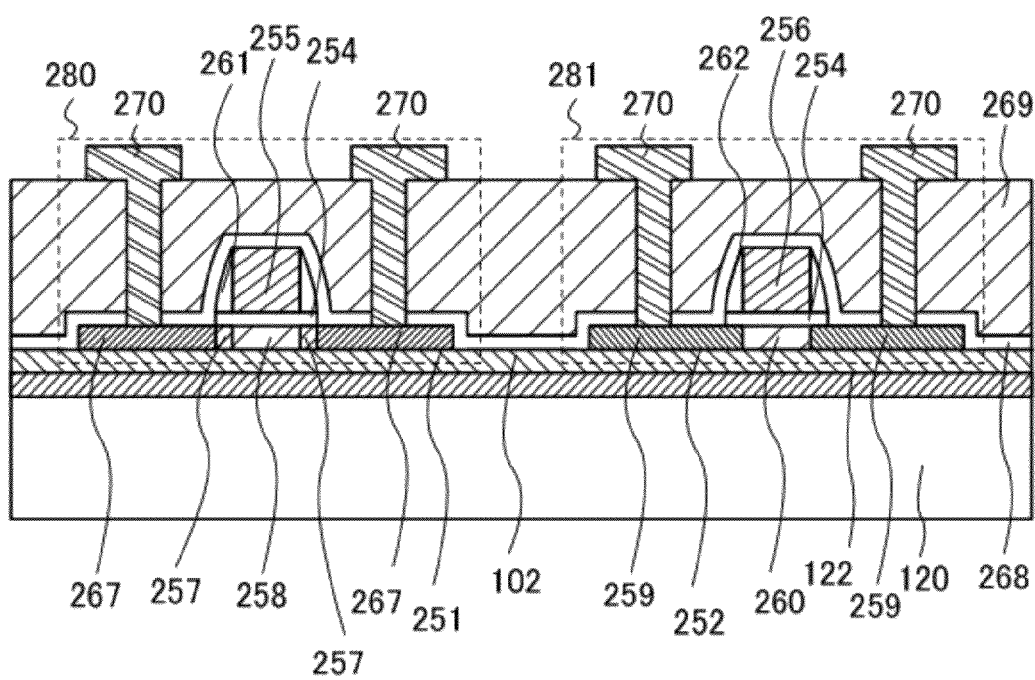
FIG. 7 is a cross-sectional view illustrating a semiconductor device which includes an SOI substrate.

An example of a semiconductor device which includes the SOI substrate manufactured in any of the above embodiments is illustrated in FIG. 7.

FIG. 7 illustrates an example of a semiconductor device including a transistor 280 which is an n-channel thin film transistor and a transistor 281 which is a p-channel thin film transistor. The transistor 280 and the transistor 281 are formed over the base substrate 120 with the insulating layer 102 and the insulating layer 122 interposed therebetween. Various kinds of semiconductor devices can be formed by combining such a plurality of thin film transistors (TFTs). A method for manufacturing the semiconductor device illustrated in FIG. 7 is described below.

First, an SOI substrate is prepared. As the SOI substrate, the SOI substrate manufactured in any of the above embodiments can be used.

Next, a semiconductor layer is etched to be divided into an island-shaped semiconductor layer 251 and an island-shaped semiconductor layer 252. The semiconductor layer 251 is included in the n-channel TFT, and the semiconductor layer 252 is included in the p-channel TFT.

An insulating layer 254 is formed over the semiconductor layer 251 and the semiconductor layer 252, and then a gate electrode 255 and a gate electrode 256 are respectively formed over the semiconductor layer 251 and the semiconductor layer 252 with the insulating layer 254 interposed therebetween.

In order to control threshold voltage of the TFTs, it is preferable to add an impurity element which serves as an acceptor, such as boron, aluminum, or gallium, or an impurity element which serves as a donor, such as phosphorus or arsenic, to the semiconductor layers. For example, an impurity element which serves as an acceptor is added to a region where the n-channel TFT is to be formed, and an impurity element which serves as a donor is added to a region where the p-channel TFT is to be formed.

Next, an n-type low-concentration impurity region 257 is formed in the semiconductor layer 251, and a p-type high-concentration impurity region 259 is formed in the semiconductor layer 252. Specifically, first, the semiconductor layer 252 used for the p-channel TFT is covered with a resist mask and an impurity element is added to the semiconductor layer 251, so that the n-type low-concentration impurity region 257 is formed in the semiconductor layer 251. Phosphorus or arsenic may be added as the impurity element. The gate electrode 255 serves as a mask, whereby the n-type low-concentration impurity region 257 is formed in the semiconductor layer 251 in a self-aligned manner. Further, a region of the semiconductor layer 251, which overlaps with the gate electrode 255, serves as a channel formation region 258. Next, after the mask which covers the semiconductor layer 252 is removed, the semiconductor layer 251 used for the n-channel TFT is covered with a resist mask. Then, an impurity element is added to the semiconductor layer 252. Boron, aluminum, gallium, or the like may be added as the impurity element. Here, the gate electrode 256 functions as a mask, and the p-type high-concentration impurity region 259 is formed in the semiconductor layer 252 in a self-aligned manner. A region of the semiconductor layer 252, which overlaps with the gate electrode 256, serves as a channel formation region 260. Note that the method in which the n-type low-concentration impurity region 257 is formed and then the p-type high-concentration impurity region 259 is formed is described in this embodiment; however, the p-type high-concentration impurity region 259 can be formed first.

Next, after the resist mask which covers the semiconductor layer 251 is removed, an insulating layer having a single-layer structure or a stacked structure, which includes a nitride such as silicon nitride or an oxide such as silicon oxide, is formed with a plasma CVD method or the like. This insulating layer is anisotropically etched in a perpendicular direction, whereby a sidewall insulating layer 261 and a sidewall insulating layer 262 are formed in contact with side surfaces of the gate electrode 255 and the gate electrode 256, respectively. Note that the insulating layer 254 is also etched by the above anisotropic etching.

Next, the semiconductor layer 252 is covered with a resist mask, and an impurity element is added to the semiconductor layer 251 at a high dose. By this treatment, the gate electrode 255 and the sidewall insulating layer 261 serve as masks, and an n-type high-concentration impurity region 267 is formed.

After activation treatment (heat treatment) of the impurity elements, an insulating layer 268 containing hydrogen is formed. After the formation of the insulating layer 268, heat treatment is performed at higher than or equal to 350° C. and lower than or equal to 450° C., whereby hydrogen contained in the insulating layer 268 is diffused into the semiconductor layer 251 and the semiconductor layer 252. The insulating layer 268 can be formed by deposition of silicon nitride or silicon nitride oxide with a plasma CVD method at a process temperature of 350° C. or lower. By supplying hydrogen to the semiconductor layer 251 and the semiconductor layer 252, defects which serve as trapping centers in the semiconductor layer 251 or the semiconductor layer 252, or at the interfaces between the semiconductor layers and the insulating layer 254 can be repaired effectively.

After that, an interlayer insulating layer 269 is formed. The interlayer insulating layer 269 can be formed to have a single-layer structure or a stacked structure including an insulating film containing an inorganic material such as silicon oxide or borophosphosilicate glass (BPSG) or an insulating film containing an organic material such as polyimide or acrylic. After contact holes are formed in the interlayer insulating layer 269, wirings 270 are formed. For example, the wirings 270 can be formed using a conductive film with a three-layer structure in which a low-resistance metal film such as an aluminum film or an aluminum alloy film is sandwiched between barrier metal films. The barrier metal films can be formed using molybdenum, chromium, titanium, or the like.

Through the above process, a semiconductor device having the n-channel TFT and the p-channel TFT can be manufactured. The SOI substrate used for the semiconductor device of this embodiment is manufactured at extremely low cost, as described in the above embodiments. Accordingly, cost for manufacturing the semiconductor device can be reduced.

Note that the semiconductor device illustrated in FIG. 7 and a manufacturing method thereof are described in this embodiment; however, the structure of a semiconductor device of an embodiment of the disclosed invention is not limited thereto. The semiconductor device may include a capacitor, a resistor, a photoelectric conversion element, a light-emitting element, or the like in addition to a TFT.

The structure described in this embodiment can be used in appropriate combination with the structure described in any of the other embodiments.

Example 1

In this example, an insulating layer was removed from a semiconductor substrate formed in manufacturing an SOI substrate, and wet etching was performed on the semiconductor substrate with the use of various kinds of etchants. The results are shown below.

First, semiconductor substrates used in this example are described.

In this example, a rectangular single crystal silicon substrate with a size of 5 inches square was employed as the semiconductor substrates. First, thermal oxidation was performed on the semiconductor substrates under an HCl atmosphere to form a thermal oxide film with a thickness of 100 nm on a surface of each of the substrates. The thermal oxidation was performed at 950° C. for 4 hours under a thermal oxidation atmosphere where the rate of HCl to oxygen was 3 vol %.

Next, each of the semiconductor substrates was irradiated with hydrogen through the surface of the thermal oxide film with the use of an ion doping apparatus. In this example, by irradiation with ionized hydrogen, an embrittlement region was formed in each of the semiconductor substrates. The condition of the ion doping was set as follows: the acceleration voltage of 40 kV and the dose of $2.0 \times 10^{16}$ ions/cm$^2$.

Then, each of the semiconductor substrates was bonded to a glass substrate with the thermal oxide film interposed therebetween. After that, heat treatment at 200° C. for 120 minutes and then heat treatment at 600° C. for 120 minutes were performed, so that a thin single crystal silicon layer was separated from each of the semiconductor substrates along the embrittlement region. Accordingly, SOI substrates were manufactured, and at the same time, semiconductor substrates each having a step portion in a peripheral portion thereof were formed.

Next, treatment performed on the above semiconductor substrates is described.

First, in order to remove the insulating layer which was formed to cover each of the semiconductor substrates, the semiconductor substrates were subjected to wet etching treatment using a mixed solution (product name: LAL500, produced by Stella Chemifa Corporation) containing hydrofluoric acid, ammonium fluoride, and a surfactant. At this time, the solution temperature was room temperature and the etching time was 300 seconds.

Next, the semiconductor substrates from which the insulating layer had been removed were subjected to wet etching with the use of any of the following as etchants: a mixed solution (hereinafter referred to as a mixed solution A) where hydrofluoric acid, nitric acid, and acetic acid were mixed at a volume ratio of 1:3:10; a mixed solution (hereinafter referred to as a mixed solution B) where hydrofluoric acid, nitric acid, and acetic acid were mixed at a volume ratio of 1:100:100; a mixed solution (hereinafter referred to as a mixed solution C) where hydrofluoric acid, nitric acid, and acetic acid were mixed at a volume ratio of 1:0.1:10; a mixed solution (hereinafter referred to as a mixed solution D) where hydrofluoric acid, nitric acid, and acetic acid were mixed at a volume ratio of 1:10:10; a mixed solution (hereinafter referred to as a mixed solution E) where hydrofluoric acid and hydrogen peroxide water were mixed at a volume ratio of 1:5; and an aqueous solution (hereinafter referred to as a TMAH aqueous solution) which contains tetramethylammonium hydroxide (TMAH) at 2.38 weight %. In preparing the above mixed solutions A to E, the following was used: hydrofluoric acid at a concentration of 50 weight % (produced by Stella Chemifa Corporation); nitric acid at a concentration of 70 weight % (produced by Wako Pure Chemical Industries, Ltd.); acetic acid at a concentration of 97.7 weight % (produced by Kishida Chemical Co., Ltd.); and hydrogen peroxide water at a concentration of 31 weight % (produced by Mitsubishi Gas Chemical Company, Inc.). The solution temperature of the etchants was set at room temperature, and the times for etching using the etchants were, each for 30 seconds, 1 minute, 2 minutes, 4 minutes, 6 minutes, and 8 minutes. Details of the above etchants are shown in Table 1.

TABLE 1

| Etchant | Etchant manufacturing condition |
| --- | --- |
| Mixed solution A | hydrofluoric acid:nitric acid:acetic acid (1:3:10) |
| Mixed solution B | hydrofluoric acid:nitric acid:acetic acid (1:100:100) |

TABLE 1-continued

| Etchant | Etchant manufacturing condition |
| --- | --- |
| Mixed solution C | hydrofluoric acid:nitric acid:acetic acid (1:0.1:10) |
| Mixed solution D | hydrofluoric acid:nitric acid:acetic acid (1:10:10) |
| Mixed solution E | hydrofluoric acid:hydrogen peroxide water (1:5) |
| TMAH aqueous solution | TMAH aqueous solution (2.38 weight %) |

*The mixture ratios are all represented in volume ratios

The semiconductor substrates were subjected to wet etching using the above six kinds of etchants for the respective periods of time, a step formed in the peripheral portion of each of the substrates was measured (with the use of Surfcoder ET4100 (a step measurement apparatus) manufactured by Kosaka Laboratory Ltd.), and the etching amount of the semiconductor substrates in the central portion of the substrates was measured (with the use of Sorter 1000 manufactured by Lapmaster SFT Corporation and LK-G30 manufactured by Keyence Corporation). Further, the peripheral portions of the substrates on which etching using the mixed solution A had been performed were photographed (as Nomarski images, with the use of an optical microscope MX61L manufactured by Olympus Corporation). Here, the central portion of the substrate refers to a region of the substrate other than the peripheral portion where a step was formed.

Figure 8A:
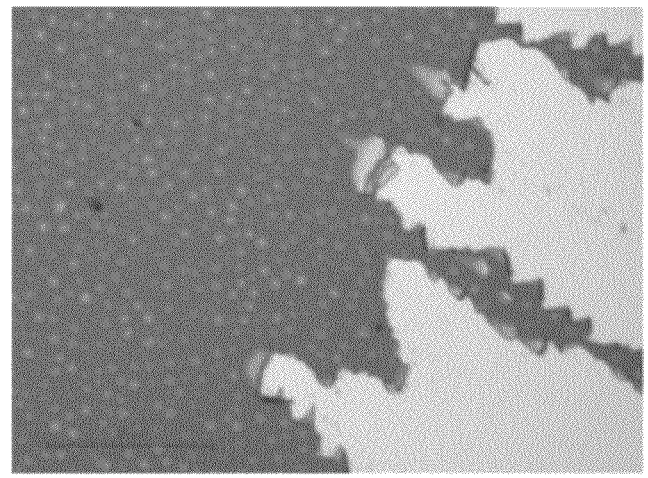
FIGS. 8A and 8B are optical micrographs of a semiconductor substrate.
Figure 8B:
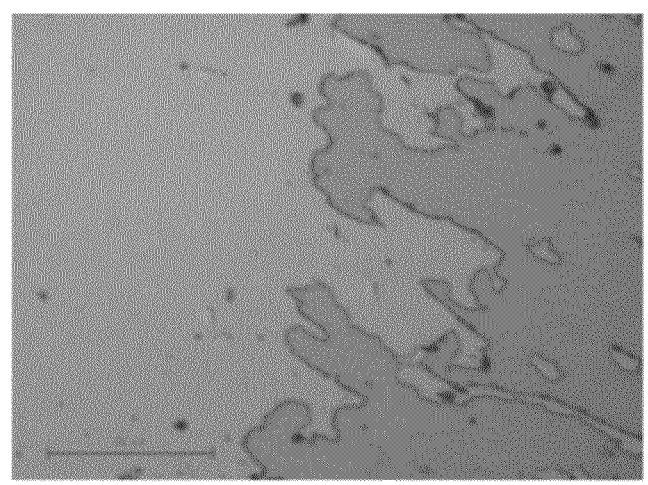
Figure 9A:
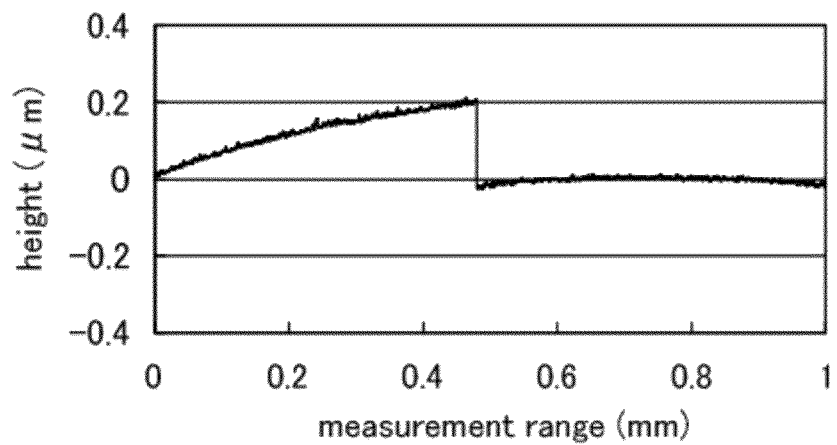
FIGS. 9A and 9B are graphs each showing a step of a semiconductor substrate.
Figure 9B:
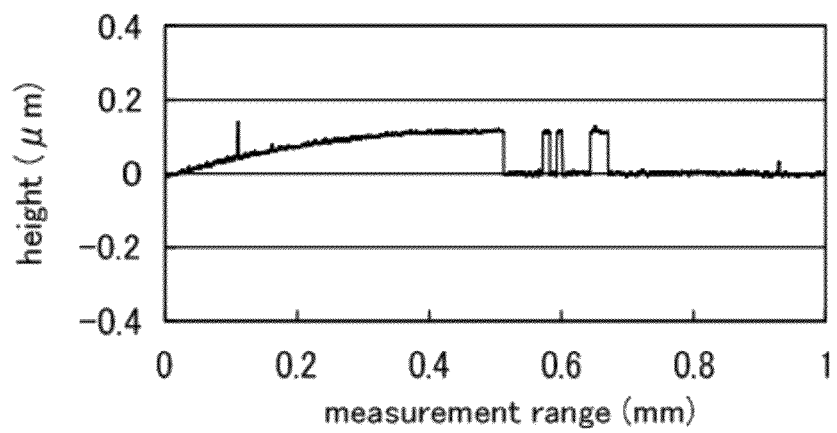

FIG. 8A is an optical micrograph of the peripheral portion immediately after separation of the semiconductor substrate, and FIG. 8B is an optical micrograph of the peripheral portion after removal of the insulating layer. FIGS. 9A and 9B show results of step measurement of the peripheral portion of the substrate, corresponding to FIGS. 8A and 8B, respectively. Here, a measurement range is an arbitrary portion where a step portion or a portion where a step has been existed is within the measurement range (1 mm). In the graphs showing the step measurement results, the vertical axis represents a height (μm) where the central portion of the substrate is a reference (0) and the horizontal axis represents a length (mm) which has been measured. This can be applied to the other graphs of step measurement below.

On the left side of the micrographs of FIGS. 8A and 8B, a step of the peripheral portion of the substrate is shown. In FIG. 8A, the remaining insulating layer is observed, and in FIG. 8B, it is observed that the insulating layer was removed and silicon in the lower layer was left. Further, in the peripheral portion of the substrate, projections and depressions due to microvoids were formed and the planarity was low. On the right side of the micrographs, silicon in the central portion of the substrate is observed.

The same result can be observed in the graphs of FIGS. 9A and 9B. FIG. 9A shows that the step between the peripheral portion of the substrate and the central portion of the substrate was approximately 0.2 μm, whereas FIG. 9B shows that the insulating layer was removed and the step between the peripheral portion of the substrate and the central portion of the substrate was reduced to approximately 0.1 μm.

Next, optical micrographs of the peripheral portions of the semiconductor substrates which were subjected to wet etching using the mixed solution A for 30 seconds, 1 minute, 2 minutes, 4 minutes, 6 minutes, and 8 minutes are shown in FIGS. 10A1, 10A2, 10B1, 10B2, 10C1, and 10C2 and FIGS. 11A1, 11A2, 11B1, 11B2, 11C1, and 11C2. Here, FIGS. 10A1 and 10A2 are optical micrographs of the condition of 30 seconds; FIGS. 10B1 and 10B2 are optical micrographs of the condition of 1 minute; FIGS. 10C1 and 10C2 are optical micrographs of the condition of 2 minutes; FIGS. 11A1 and 11A2 are optical micrographs of the condition of 4 minutes; FIGS. 11B1 and 11B2 are optical micrographs of the condition of 6 minutes; and FIGS. 11C1 and 11C2 are optical micrographs of the condition of 8 minutes. In addition, FIGS. 10A1, 10B1, and 10C1 and FIGS. 11A1, 11B1, and 11C1 are optical micrographs at 50-fold magnification; FIGS. 10A2, 10B2, and 10C2 and FIGS. 11A2, 11B2, and 11C2 are optical micrographs at 500-fold magnification.

Figure 12A:
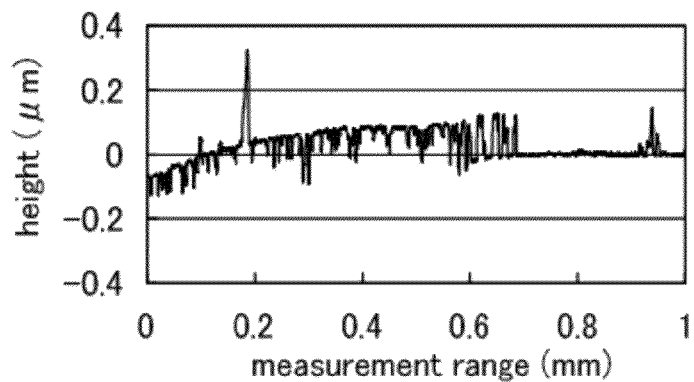
FIGS. 12A to 12C are graphs each showing a step of a semiconductor substrate.
Figure 12B:
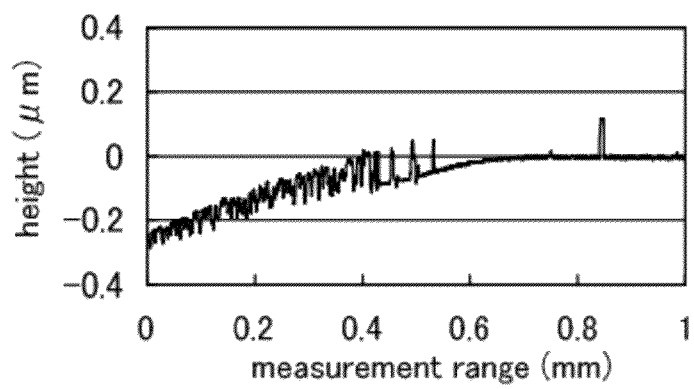
Figure 12C:
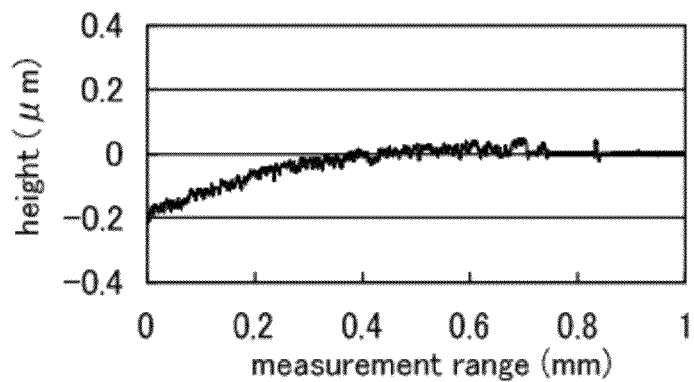
Figure 13A:
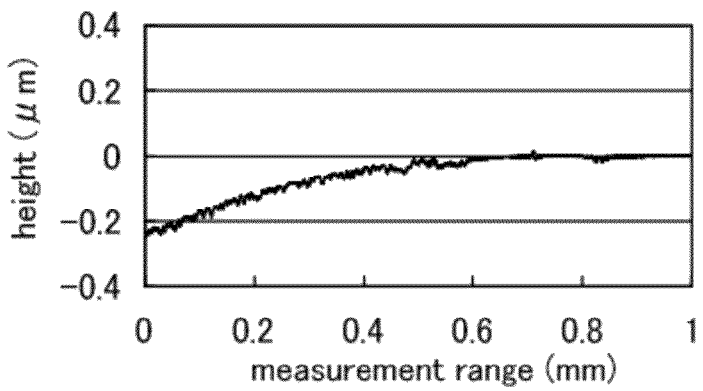
FIGS. 13A to 13C are graphs each showing a step of a semiconductor substrate.
Figure 13B:
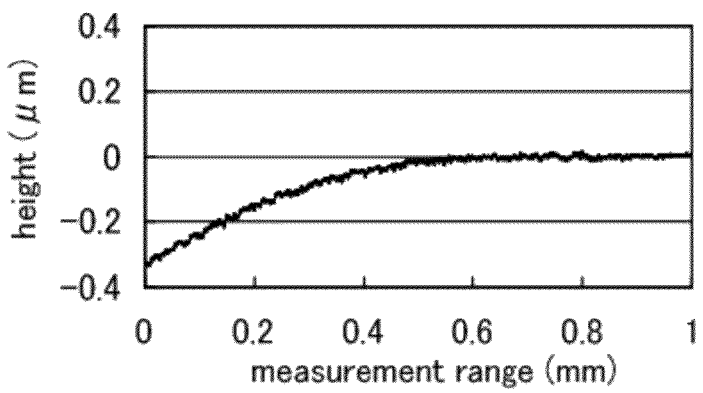
Figure 13C:
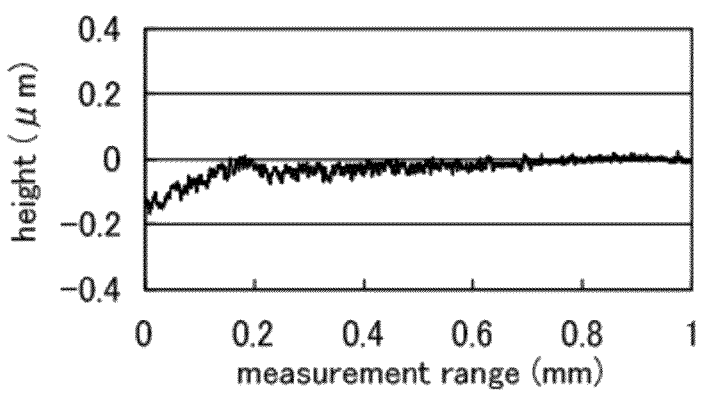
Figure 14A:
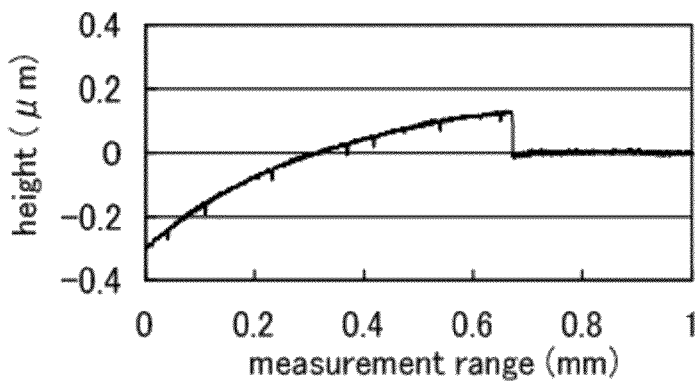
FIGS. 14A to 14C are graphs each showing a step of a semiconductor substrate.
Figure 14B:
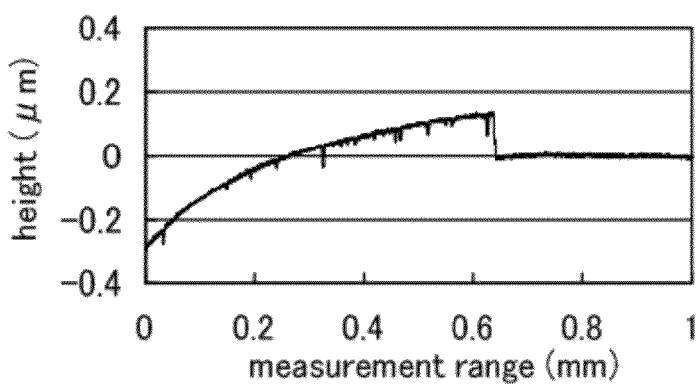
Figure 14C:
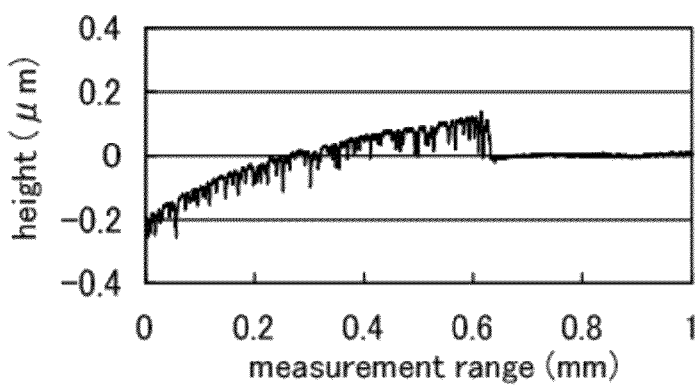
Figure 15A:
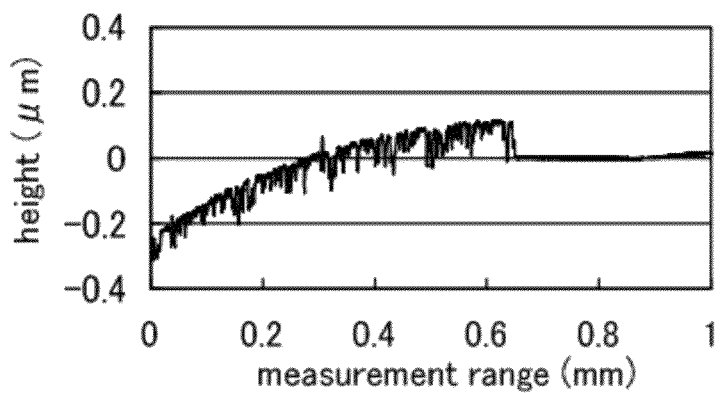
FIGS. 15A to 15C are graphs each showing a step of a semiconductor substrate.
Figure 15B:
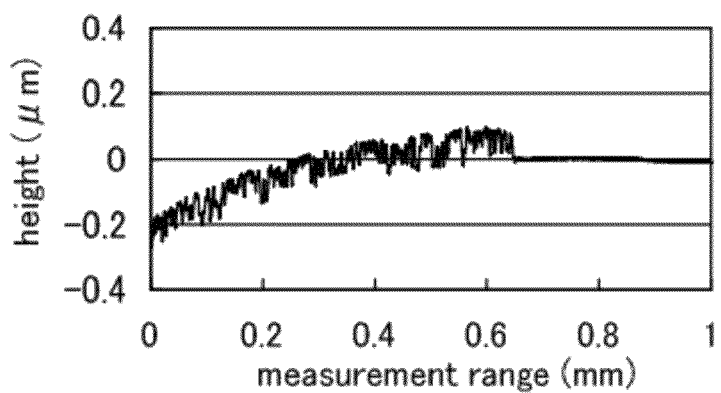
Figure 15C:
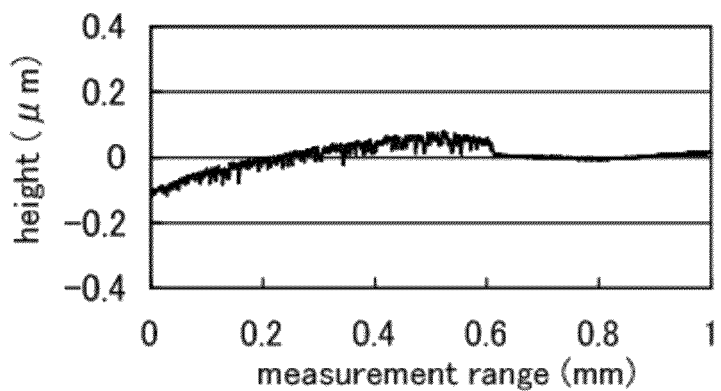
Figure 16A:
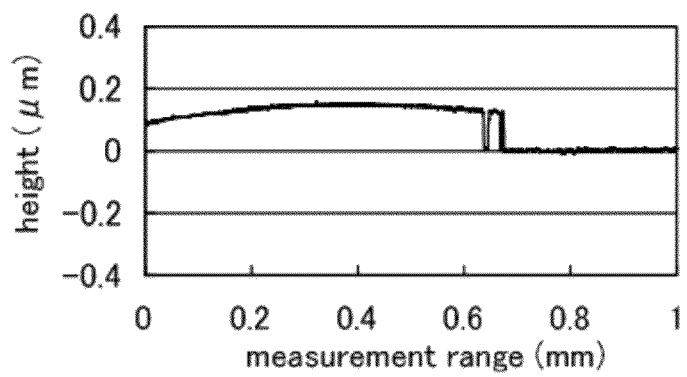
FIGS. 16A to 16C are graphs each showing a step of a semiconductor substrate.
Figure 16B:
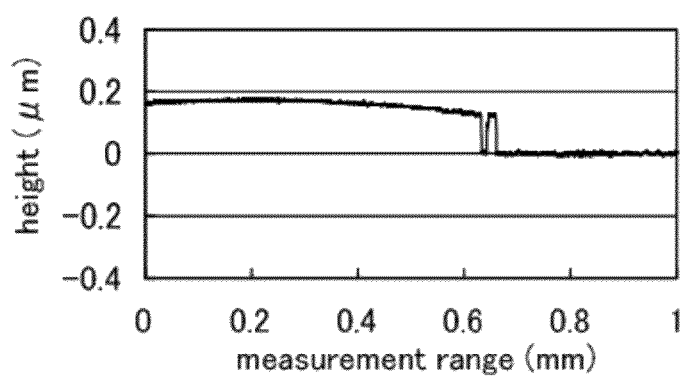
Figure 16C:
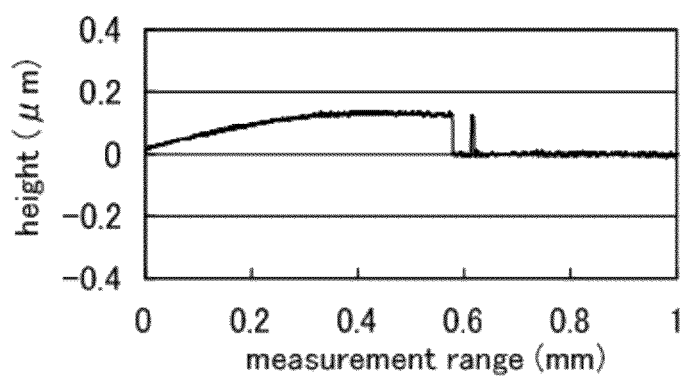
Figure 17A:
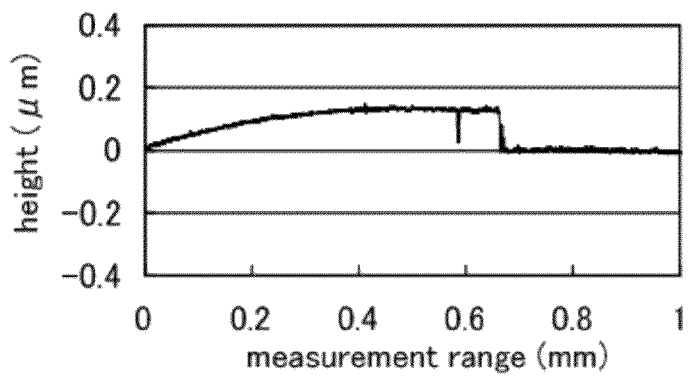
FIGS. 17A to 17C are graphs each showing a step of a semiconductor substrate.
Figure 17B:
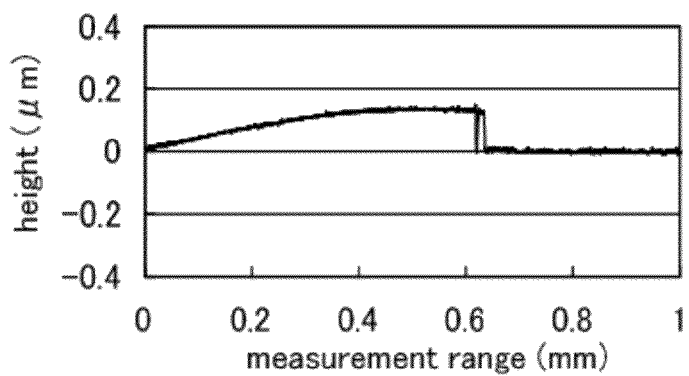
Figure 17C:
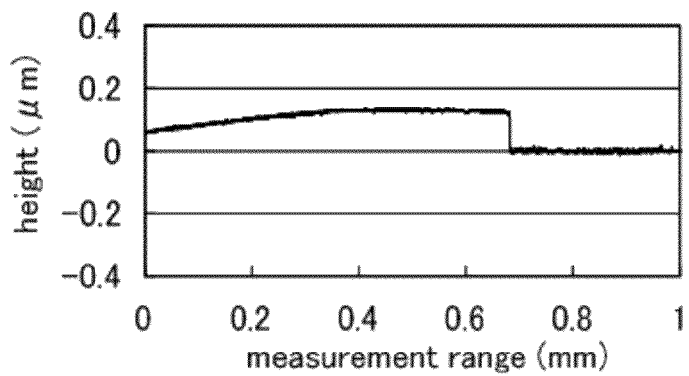
Figure 18A:
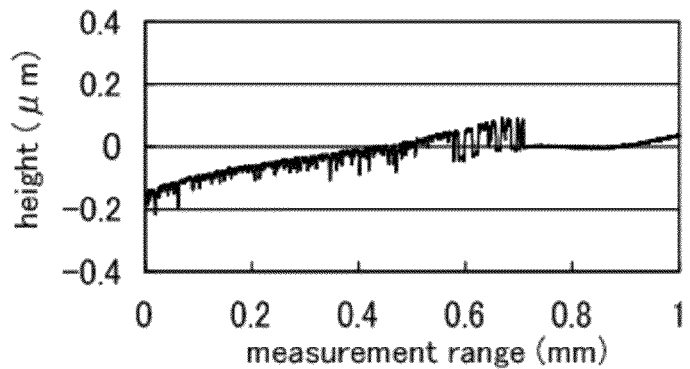
FIGS. 18A to 18C are graphs each showing a step of a semiconductor substrate.
Figure 18B:
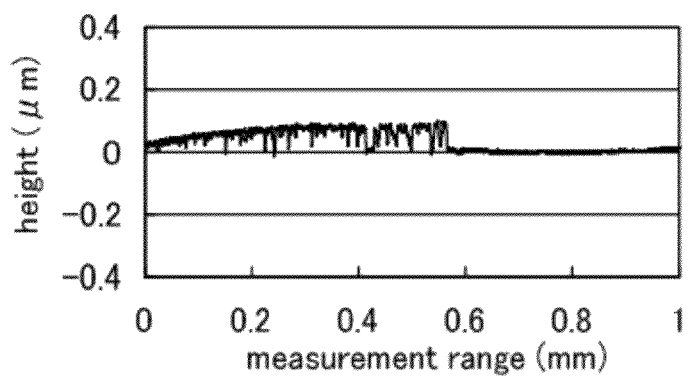
Figure 18C:
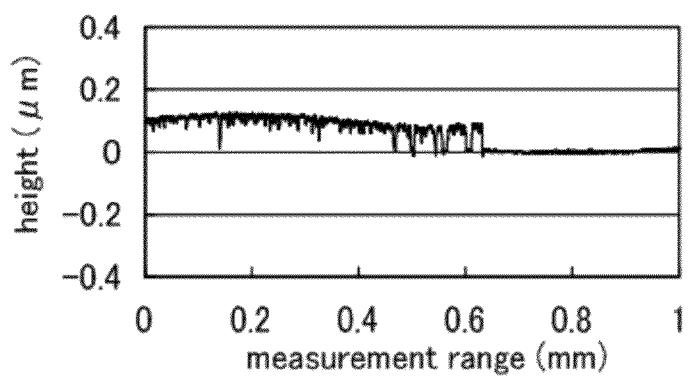
Figure 19A:
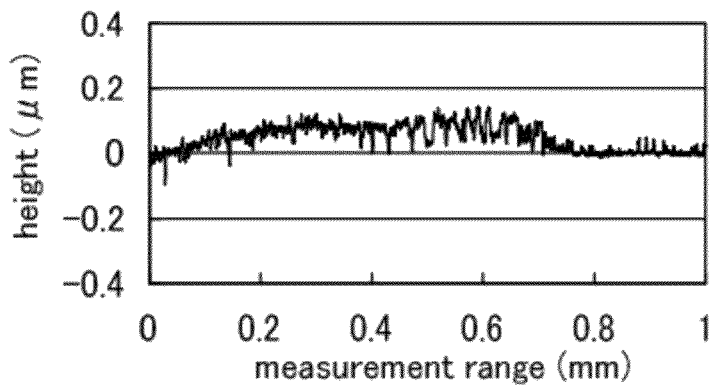
FIGS. 19A to 19C are graphs each showing a step of a semiconductor substrate.
Figure 19B:
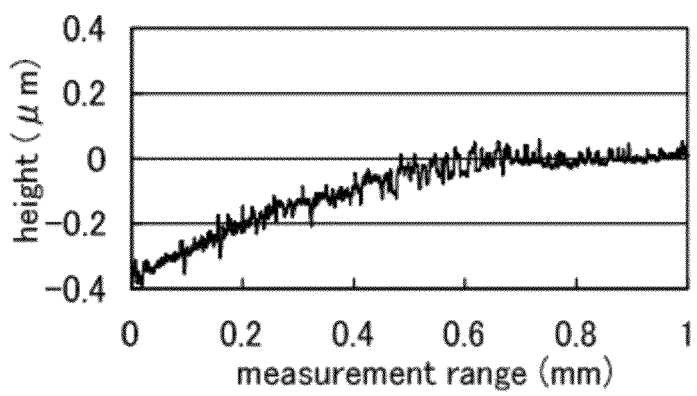
Figure 19C:
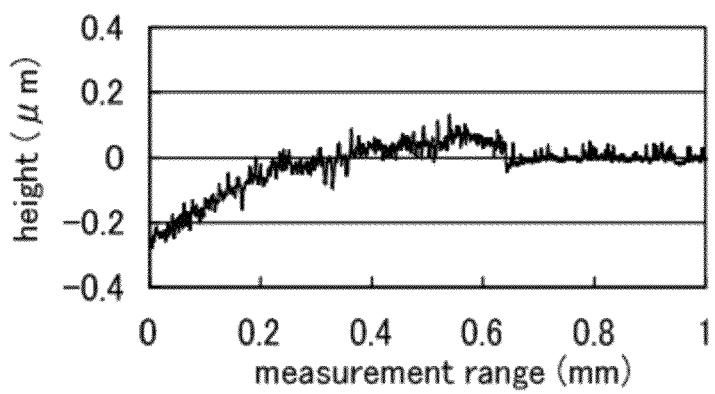
Figure 20A:
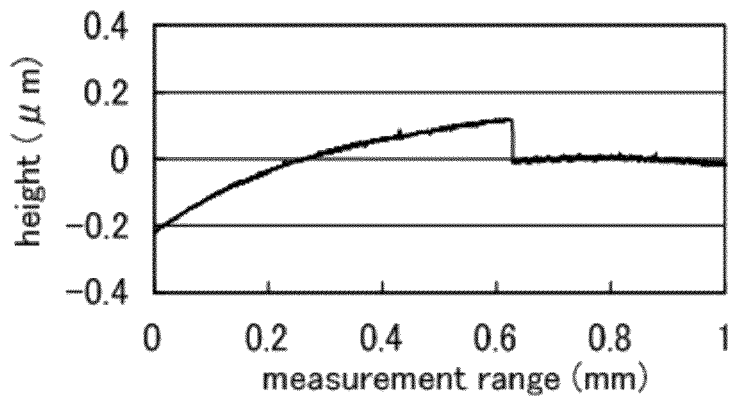
FIGS. 20A to 20C are graphs each showing a step of a semiconductor substrate.
Figure 20B:
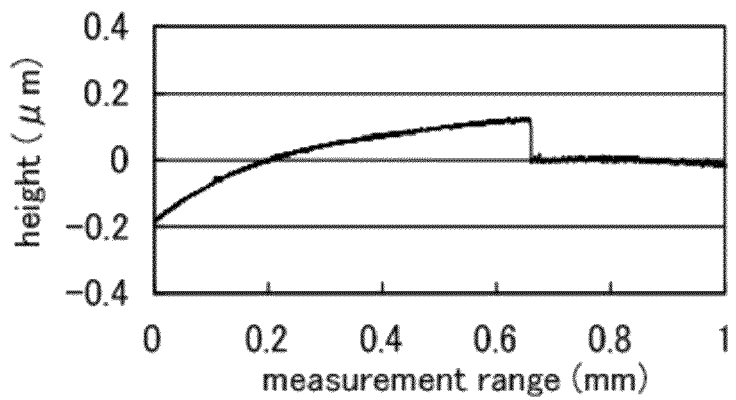
Figure 20C:
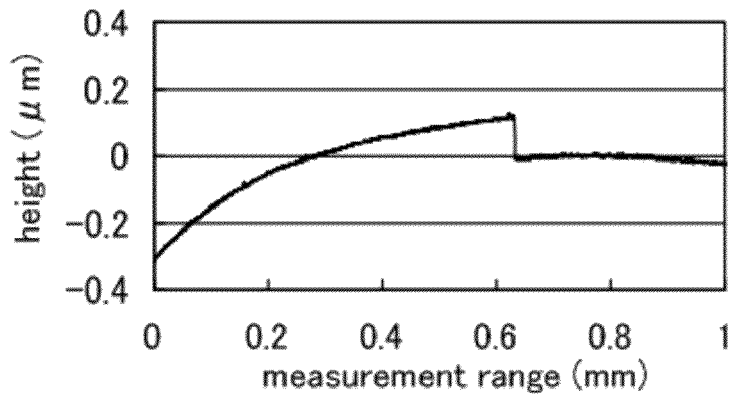
Figure 21A:
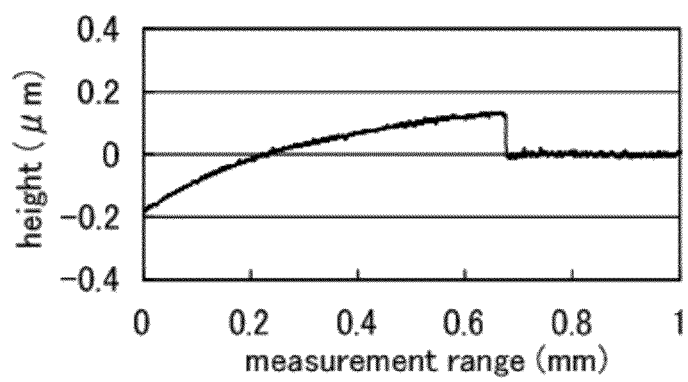
FIGS. 21A to 21C are graphs each showing a step of a semiconductor substrate.
Figure 21B:
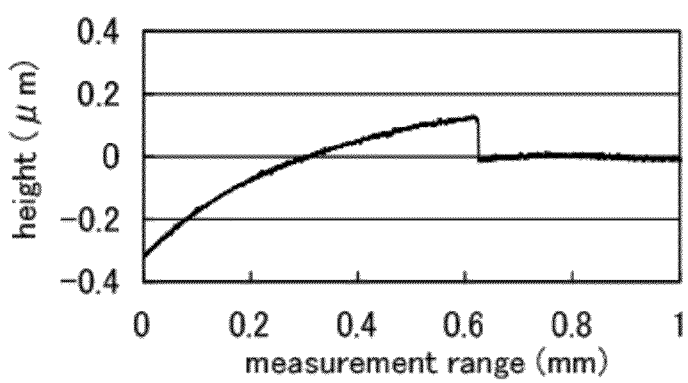
Figure 21C:
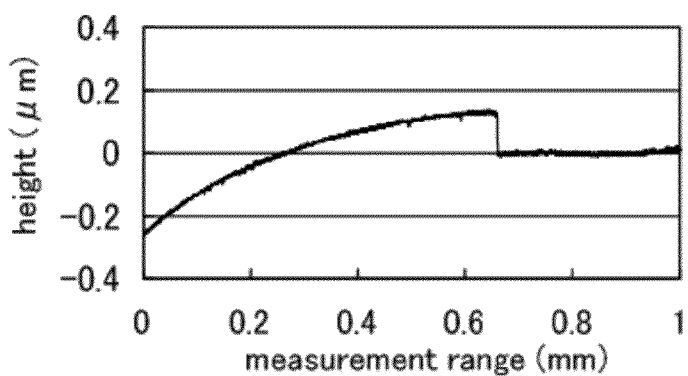
Figure 22A:
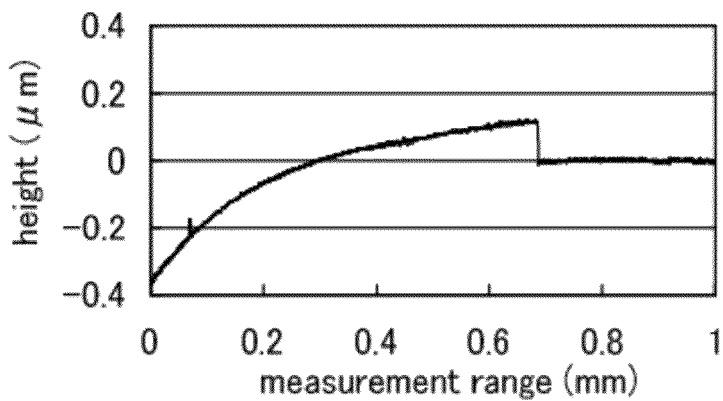
FIGS. 22A to 22C are graphs each showing a step of a semiconductor substrate.
Figure 22B:
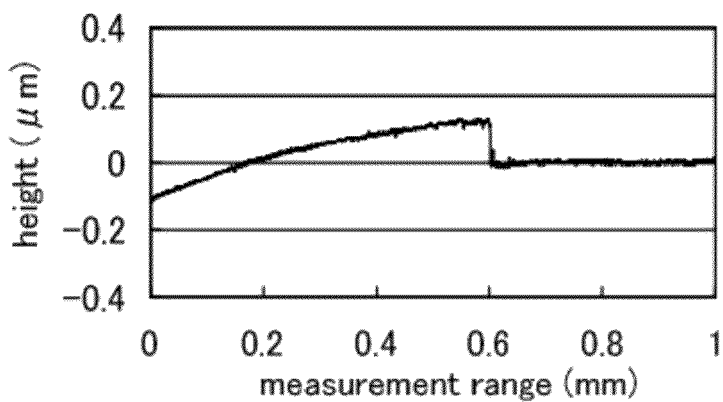
Figure 22C:
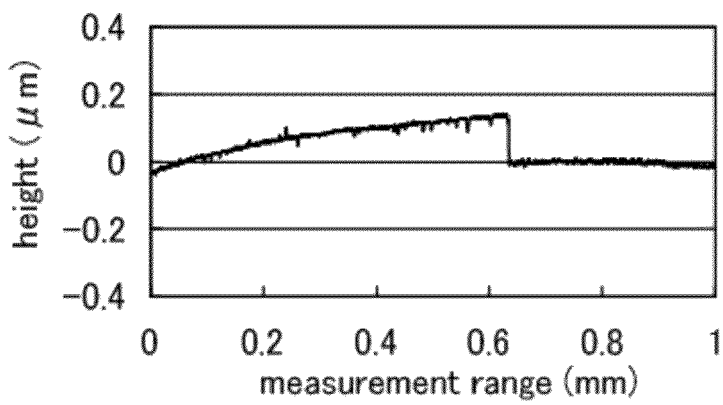
Figure 23A:
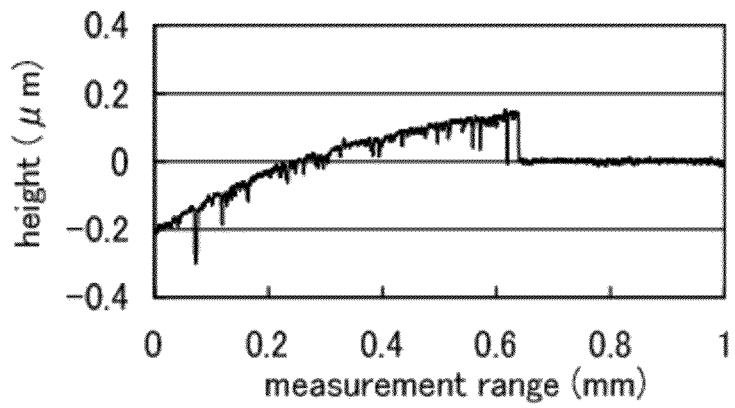
FIGS. 23A to 23C are graphs each showing a step of a semiconductor substrate.
Figure 23B:
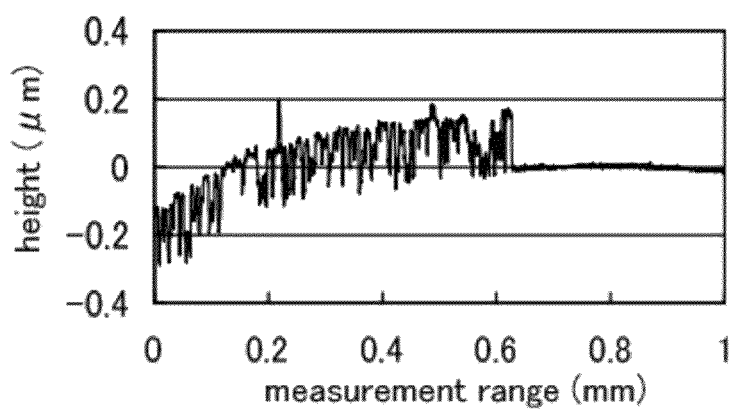
Figure 23C:
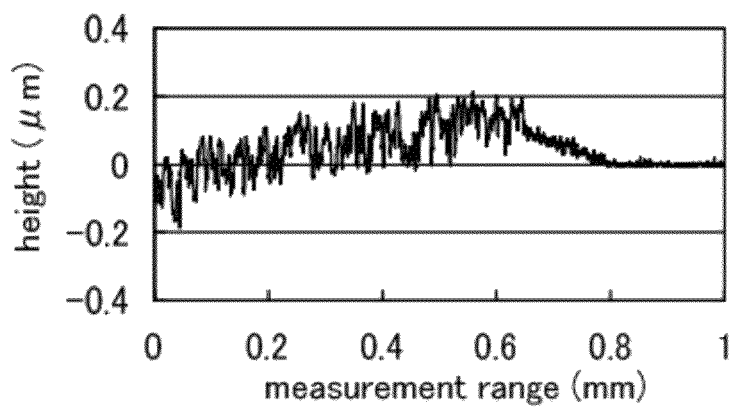

FIGS. 12A to 12C and FIGS. 13A to 13C show results of step measurement of the peripheral portions of the substrates. FIGS. 12A, 12B, and 12C show results of step measurement of the peripheral portions of the substrates under the respective conditions of 30 seconds, 1 minutes, and 2 minutes, and FIGS. 13A, 13B, and 13C show results of step measurement of the peripheral portions of the substrates under the respective conditions of 4 minutes, 6 minutes, and 8 minutes.

Further, FIGS. 14A to 14C, FIGS. 15A to 15C, FIGS. 16A to 16C, FIGS. 17A to 17C, FIGS. 18A to 18C, FIGS. 19A to 19C, FIGS. 20A to 20C, FIGS. 21A to 21C, FIGS. 22A to 22C, and FIGS. 23A to 23C show results of step measurement of the peripheral portions of the semiconductor substrates on which wet etching was performed using the mixed solution B, the mixed solution C, the mixed solution D, the mixed solution E, and the TMAH aqueous solution, each for 30 seconds, 1 minute, 2 minutes, 4 minutes, 6 minutes, and 8 minutes. FIGS. 14A to 14C and FIGS. 15A to 15C show a result in the case where the mixed solution B was used, FIGS. 16A to 16C and FIGS. 17A to 17C show a result in the case where the mixed solution C was used, FIGS. 18A to 18C and FIGS. 19A to 19C show a result in the case where the mixed solution D was used, FIGS. 20A to 20C and FIGS. 21A to 21C show a result in the case where the mixed solution E was used, and FIGS. 22A to 22C and FIGS. 23A to 23C show a result in the cases where the TMAH aqueous solution was used. As for FIGS. 14A to 14C, FIGS. 15A to 15C, FIGS. 16A to 16C, FIGS. 17A to 17C, FIGS. 18A to 18C, FIGS. 19A to 19C, FIGS. 20A to 20C, FIGS. 21A to 21C, FIGS. 22A to 22C, and FIGS. 23A to 23C, graphs of A, B, C in the even-numbered figures show results of step measurement of the peripheral portions of the substrates under the condition of 30 seconds, 1 minute, and 2 minutes, respectively; and graphs of A, B, and C in the odd-numbered figures show results of step measurement of the peripheral portions of the substrates under the condition of 4 minutes, 6 minutes, and 8 minutes, respectively.

Figure 24:
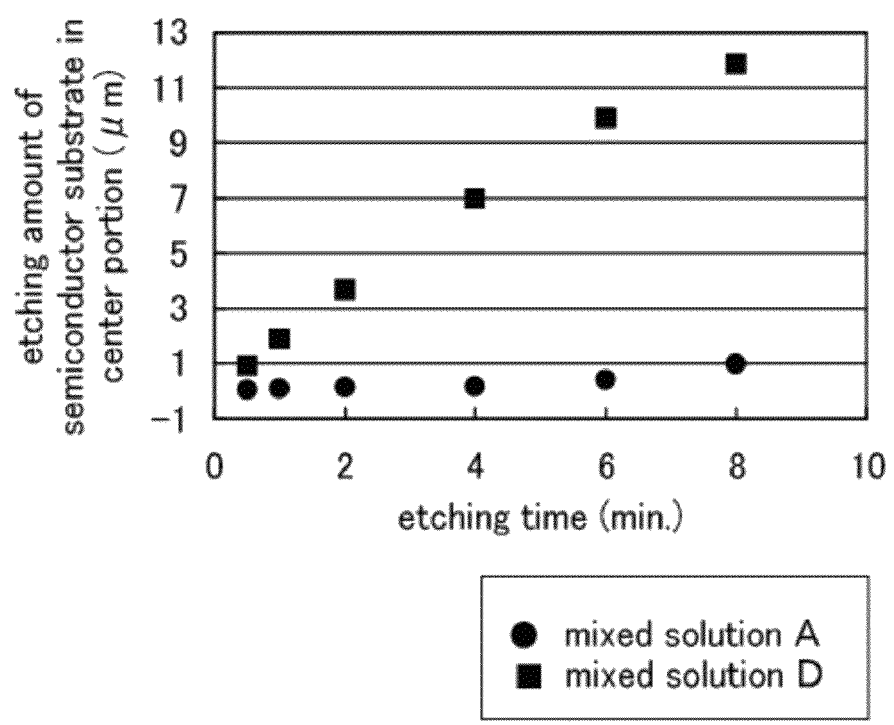
FIG. 24 illustrates a relation between an etching time and an etching amount.

Further, FIG. 24 shows results of measuring the etching amount in the central portions of the substrates in the cases where wet etching with the use of the mixed solution A and the mixed solution D was performed. In FIG. 24, a circle and a square represent the results of the cases where the mixed solution A and the mixed solution D were used, respectively. The vertical axis in the graph of FIG. 24 represents an etching amount (μm) of the semiconductor substrate in the central portion of the semiconductor substrate and the horizontal axis represents etching time (min).

Here, the etching amount in the central portion of the substrate was calculated from change in the thickness of the central portion of the substrate before and after the etching. The thickness of the substrate was calculated from a difference between the values of laser displacement sensors (LK-G30 manufactured by Keyence Corporation) that were provided above and below a measurement stage (Sorter 1000 manufactured by Lapmaster SFT Corporation). The measurement of the substrate thickness was performed on 10 points× 10 points in a region of 107 mm square in the central portion of the substrate. Further, the etching amount in the central portion of the substrate was obtained by comparing the average values of the measurement results. The repetition accuracy of the laser displacement sensor is ±0.05 µm, and the repetition accuracy of the thickness of the substrate is ±0.5 µm.

From comparison of the optical micrographs of FIGS. 10A1, 10A2, 10B1, 10B2, 10C1, and 10C2 and FIGS. 11A1, 11A2, 11B1, 11B2, 11C1, and 11C2, it is found that steps on the left side of the micrographs were reduced as the etching time was increased. For example, as shown in FIGS. 11A1 and 11A2, when the etching time was 4 minutes, few steps were observed. The same conclusion can be obtained from FIGS. 12A to 12C and FIGS. 13A to 13C which are graphs of the step measurement. FIGS. 12A to 12C and FIGS. 13A to 13C indicate that wet etching using the mixed solution A progresses in such a manner that a hole is formed in a step of the peripheral portion of the substrate in a direction perpendicular to the plane surface of the substrate and then the hole is expanded. This indicates that the mixed solution A penetrates the semiconductor region (the damaged semiconductor region including crystal defects or microvoids) included in the step in the peripheral portion of the substrate and then the step is removed from the inside of the semiconductor region. Such wet etching using the mixed solution A tends to progress in a manner different from that in the case where another etchant is used, which is described later.

The graph of FIG. 24 showing the etching amount in the central portion of the semiconductor substrate indicates that the etching amount of the semiconductor substrate is small enough at least until an etching time of 6 minutes and is in the range of margin of error in the measurement of the substrate thickness.

Table 2 shows a relation of etching time to etching amount (µm) in the central portion of the semiconductor substrate and etching amount (µm) in the peripheral portion of the semiconductor substrate in the case where the mixed solution A was used. Table 2 also shows etching selectivity (selectivity 1) and etching selectivity of differences (selectivity 2) obtained from the etching amount in the central portion of the semiconductor substrate and the etching amount in the peripheral portion of the semiconductor substrate.

TABLE 2

| Etching time (min) | Etching amount in central portion of semiconductor substrate (µm) | Etching amount in peripheral portion of semiconductor substrate (µm) | Selectivity 1 | Selectivity 2 |
| --- | --- | --- | --- | --- |
| 0 | 0 | 0 | — | — |
|  |  |  |  | 1.052 |
| 1 | 0.096 | 0.101 | 1.052 |  |
|  |  |  |  | 2.818 |
| 2 | 0.14 | 0.225 | 1.607 |  |
|  |  |  |  | 2.609 |
| 4 | 0.163 | 0.285 | 1.748 |  |
|  |  |  |  | 1.065 |
| 6 | 0.408 | 0.546 | 1.338 |  |

Here, the selectivity 1 is obtained by dividing the average value of the etching amount in the peripheral portion of the semiconductor substrate by the average value of the etching amount in the central portion of the semiconductor substrate. The etching selectivity of differences (the selectivity 2) is obtained from the etching amount of 0 minute to 1 minute, the etching amount of 1 minute to 2 minutes, the etching amount of 2 minutes to 4 minutes, and the etching amount of 4 minutes to 6 minutes. For example, the etching amount in the central portion of the semiconductor substrate from 1 minute to 2 minutes is calculated as follows: 0.14−0.096=0.044 (µm). The etching amount in the peripheral portion of the semiconductor substrate from 1 minute to 2 minutes is calculated as follows: 0.225−0.101=0.124 (µm). Accordingly, the selectivity 2 in this case is obtained as follows: 0.124/0.044=2.818.

According to Table 2, the etching selectivity of differences (the selectivity 2) varies with etching time. Specifically, the selectivity is approximately 1 (1.052) soon after the etching is started, becomes 2 or higher (2.818 and 2.609), and then returns to approximately 1 (1.065). This is considered to be caused by the following reason. First, at the beginning of the etching, the damaged semiconductor region left in the central portion of the semiconductor substrate is removed together with the damaged semiconductor region in the peripheral portion of the semiconductor substrate; therefore, there is no large difference in the etching rate between the peripheral portion of the semiconductor substrate and the central portion of the semiconductor substrate. Consequently, the selectivity is approximately 1. After the damaged semiconductor region in the central portion of the semiconductor substrate is removed, the etching rate is lowered in the central portion of the semiconductor substrate while the etching rate is not lowered in the peripheral portion of the semiconductor substrate because the damaged semiconductor region still remains therein. Consequently, the selectivity is increased (specifically, 2 or higher). After that, the damaged semiconductor region in the peripheral portion of the semiconductor substrate is removed and the etching rates of the peripheral portion of the semiconductor substrate and the central portion of the semiconductor substrate become substantially equal. That is, the selectivity returns to approximately 1. Owing to such variation in selectivity, the damaged semiconductor region is selectively removed. As seen from Table 2, it is preferable to use the selectivity 2 for timing to stop the etching treatment because the variation is large and apparent.

The selectivity 1 in the etching time of 2 minutes and the selectivity 1 in the etching time of 4 minutes are as high as 1.607 and 1.748, respectively. Further, the selectivity 2 in the etching time of 1 minute to 2 minutes and the selectivity 2 in the etching time of 2 minutes to 4 minutes are as high as 2.818 and 2.609, respectively. In this manner, with the use of the mixed solution A (the mixed solution where hydrofluoric acid, nitric acid, and acetic acid are mixed at a volume ratio of 1:3:10), the step in the peripheral portion of the semiconductor substrate can be selectively removed in a short time.

It is found that, in the etching using the mixed solution B, etching progresses at a slow pace and the step is not removed even when the etching time is set to 8 minutes (see FIGS. 14A to 14C and FIGS. 15A to 15C). Further, the step in the peripheral portion of the substrate is gradually etched from the surface and a deep hole is not formed, which is different from the case where the mixed solution A was used. Thus, the following is found: even when the semiconductor substrate is etched using the mixed solution B, the step in the peripheral portion of the substrate is not removed or is removed over a long period of time.

The step in the peripheral portion of the substrate is not removed by the etching using the mixed solution C (see FIGS. 16A to 16C and FIGS. 17A to 17C). Thus, it is found that the semiconductor substrate is hardly etched even when the semiconductor substrate is subjected to the etching using the mixed solution C.

In the etching using the mixed solution D, the etching amount in the central portion of the substrate is increased in proportion to the etching time (see FIG. 24), while the step remains in the peripheral portion of the substrate (see FIGS. 18A to 18C and FIGS. 19A to 19C). Thus, it is found that, even by using the mixed solution D as an etchant, the entire semiconductor substrate is evenly etched and the step in the peripheral portion of the substrate cannot be selectively removed.

By the etching using the mixed solution E, the step in the peripheral portion of the substrate is not removed as in the case where the mixed solution C was used (see FIGS. 20A to 20C and FIGS. 21A to 21C). Thus, it is found that the semiconductor substrate is hardly etched even when the semiconductor substrate is subjected to the etching using the mixed solution E.

In the etching using the TMAH aqueous solution, etching progresses at a slow pace, and the step is not removed even when the etching time is set to 8 minutes (see FIGS. 22A to 22C and FIGS. 23A to 23C). Thus, the following is found: even when the semiconductor substrate is etched using the TMAH aqueous solution, the step in the peripheral portion of the substrate is not removed or is removed over a long period of time.

Here, the mixed solution A, the mixed solution B, the mixed solution C, and the mixed solution D are each a ternary mixed solution containing hydrofluoric acid, nitric acid, and acetic acid. A function and reaction of each element are as follows.

Nitric acid oxidizes silicon. This reaction is represented by the formula (1).

$$3Si + 4HNO_3 \rightarrow 3SiO_2 + 2H_2O + 4NO \quad (1)$$

Hydrofluoric acid dissolves silicon oxide. This reaction is represented by the formula (2).

$$SiO_2 + 6HF \rightarrow 2H^+ + [SiF_6]^{2-} + 2H_2O \quad (2)$$

Acetic acid stabilizes the mixed solution and suppresses rapid etching.

As described above, the ternary mixed solution containing hydrofluoric acid, nitric acid, and acetic acid has a function of etching silicon by repeating the oxidation of silicon shown in the formula (1) and the dissolution of silicon oxide shown in the formula (2). Therefore, in the case where the amount of hydrofluoric acid is large in the ternary mixed solution containing hydrofluoric acid, nitric acid, and acetic acid, oxidation of silicon by nitric acid shown in the formula (1) is a rate-limiting factor. In the case where the amount of nitric acid is large, dissolution of silicon oxide by hydrofluoric acid shown in the formula (2) is a rate-limiting factor.

Accordingly, the following assumption can be made: since the amount of nitric acid contained in the mixed solution C was small, oxidation of silicon was a rate-limiting factor in the wet etching. The same can be said for the mixed solution E in which hydrogen peroxide oxidizes silicon. It is assumed that wet etching did not progress in the mixed solution E because of small oxidizing power of hydrogen peroxide.

As for the mixed solution D, the following assumption can be made: reactions of the formula (1) and the formula (2) progressed rapidly because the amount of hydrofluoric acid and nitric acid was large; as a result, the selectivity between the peripheral portion of the substrate and the central portion of the substrate was not able to be obtained and thus wet etching was performed evenly on the entire substrate.

In addition, it is assumed that since the amount of hydrofluoric acid was small in the mixed solution B, dissolution of silicon oxide was a rate-limiting factor and wet etching did not progress. This is because, when the amount of hydrofluoric acid is small, etching from the inside of the damaged semiconductor region due to crystal defects or microvoids is less likely to be caused and etching from the surface of the damaged semiconductor region preferentially progresses.

On the other hand, the mixed solution A contains hydrofluoric acid, nitric acid, and acetic acid at a favorable balance; therefore, neither of the reactions of the formula (1) and the formula (2) is a rate-limiting factor. Moreover, effect of suppression of etching can be obtained by acetic acid, and thus the entire substrate is prevented from being evenly etched.

When the step in the peripheral portion of the substrate is thus etched using the mixed solution A (the mixed solution containing hydrofluoric acid, nitric acid, and acetic acid at a volume ratio of 1:3:10), the step portion in the peripheral portion of the substrate can be removed in a short time with the selectivity between the peripheral portion of the substrate and the central portion of the substrate maintained. Consequently, the reprocessing treatment of the semiconductor substrate can be performed surely and effectively.

Example 2

This example shows results of comparing the case where a combination of wet etching treatment using the mixed solution of hydrofluoric acid, nitric acid, and acetic acid and CMP treatment was employed as reprocessing treatment, with the case where CMP treatment was mainly employed without using the wet etching treatment. As for CMP treatment, after treatment with a high polishing rate, treatment with a low polishing rate (finishing polishing) was performed. Note that in the case where the above wet etching treatment was not employed, the time for CMP treatment was set longer so that the reprocessing treatment equivalent to that in the case where the wet etching treatment was employed is realized.

A semiconductor substrate to be subjected to the reprocessing treatment was manufactured in a manner similar to that of the above example. The above example can be referred to for details.

A reprocessed semiconductor substrate (hereinafter referred to as a substrate A) which was processed by the above wet etching treatment and CMP treatment with a short polishing time was manufactured in the following manner.

First, in order to remove the insulating layer which was formed to cover the semiconductor substrate, the semiconductor substrate was subjected to wet etching treatment using a mixed solution (product name: LAL500, produced by Stella Chemifa Corporation) containing hydrofluoric acid, ammonium fluoride, and a surfactant. At this time, the solution temperature was room temperature and the etching time was 300 seconds.

Next, the semiconductor substrate from which the insulating layer had been removed was subjected to wet etching treatment using a mixed solution (corresponding to the mixed solution A in the above example) where hydrofluoric acid, nitric acid, and acetic acid were mixed at a volume ratio of 1:3:10. At this time, the solution temperature was room temperature and the etching time was 120 seconds. Note that in producing the above mixed solution, hydrofluoric acid at a concentration of 50 weight % (produced by Stella Chemifa Corporation); nitric acid at a concentration of 70 weight % (produced by Wako Pure Chemical Industries, Ltd.); and acetic acid at a concentration of 97.7 weight % (produced by Kishida Chemical Co., Ltd.) were used.

Next, the semiconductor substrate was subjected to CMP treatment with a high polishing rate. In the CMP treatment, a polyurethane polishing cloth and silica-based slurry (ILD1300, produced by Nitta Haas Incorporated, a grain size of 150 nm, and 20-fold dilution) were used. The slurry flow rate was 200 ml/min, the polishing pressure was 0.02 MPa, the spindle rotation speed was 30 rpm, the table rotation speed was 30 rpm, and the treatment time was 3 minutes.

After that, CMP treatment with a low polishing rate was performed on the semiconductor substrate. In this CMP treatment, a suede polishing cloth (Supreme, manufactured by Nitta Haas Incorporated) and silica-based slurry (NP8020, produced by Nitta Haas Incorporated, a grain size of 60 nm, and 20-fold dilution) were used. The slurry flow rate was 200 ml/min, the polishing pressure was 0.01 MPa, the spindle rotation speed was 30 rpm, the table rotation speed was 30 rpm, and the treatment time was 3 minutes.

Meanwhile, a reprocessed semiconductor substrate (hereinafter referred to as a substrate B) on which the above wet etching treatment was not performed was manufactured in the following manner.

First, in order to remove the insulating layer which was formed to cover the semiconductor substrate, the semiconductor substrate was subjected to wet etching treatment using a mixed solution (product name: LAL500, produced by Stella Chemifa Corporation) containing hydrofluoric acid, ammonium fluoride, and a surfactant. At this time, the solution temperature was room temperature and the etching time was 300 seconds.

Next, the semiconductor substrate was subjected to CMP treatment with a high polishing rate. In the CMP treatment, a polyurethane polishing cloth and silica-based slurry (ILD1300, produced by Nitta Haas Incorporated, a grain size of 150 nm, and 20-fold dilution) were used. The slurry flow rate was 200 ml/min, the polishing pressure was 0.02 MPa, the spindle rotation speed was 30 rpm, the table rotation speed was 30 rpm, and the treatment time was 12 minutes.

After that, CMP treatment with a low polishing rate was performed on the semiconductor substrate. In this CMP treatment, a suede polishing cloth (Supreme, manufactured by Nitta Haas Incorporated) and silica-based slurry (NP8020, produced by Nitta Haas Incorporated, a grain size of 60 nm, and 20-fold dilution) were used. The slurry flow rate was 200 ml/min, the polishing pressure was 0.01 MPa, the spindle rotation speed was 30 rpm, the table rotation speed was 30 rpm, and the treatment time was 10 minutes.

The two kinds of reprocessed semiconductor substrates manufactured by the above methods were subjected to observation with an optical microscope, step measurement with a step measurement apparatus (with the use of Surfcoder manufactured by Kosaka Laboratory Ltd.), evaluation of planarity with scanning probe microscopes (SPA-500 and SPI3800N manufactured by SII Nano Technology Inc.), and measurement of the amount of reduction in the thickness of the semiconductor substrate in the reprocessing treatment (with the use of Sorter 1000 manufactured by Lapmaster SFT Corporation).

Figure 25A:
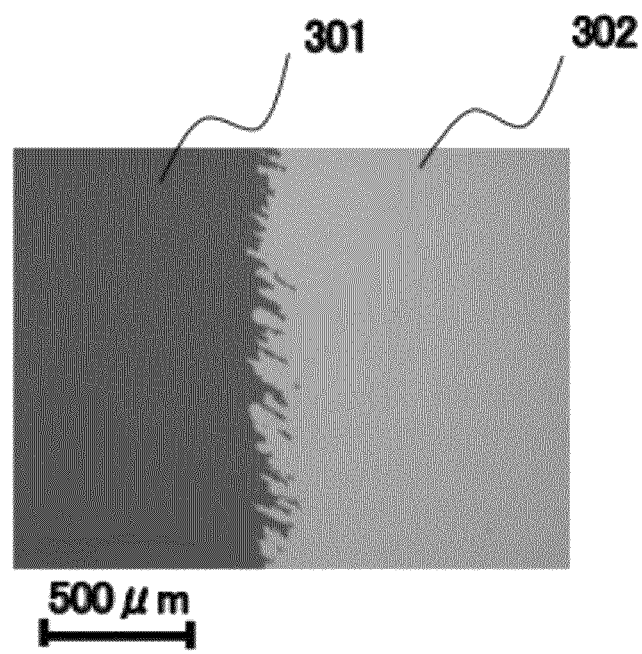
FIGS. 25A and 25B are optical micrographs of a semiconductor substrate.
Figure 25B:
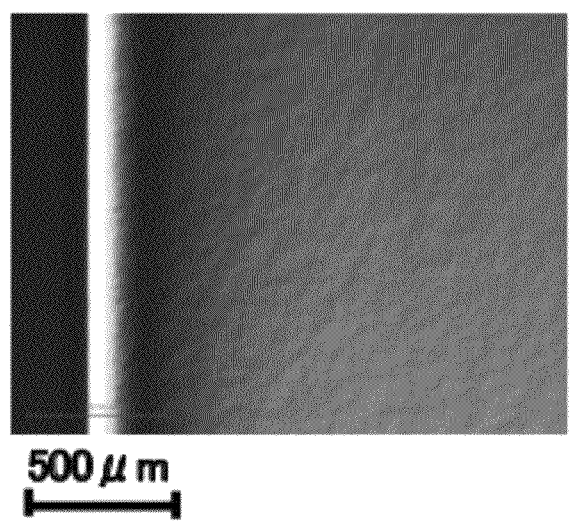
Figure 26A:
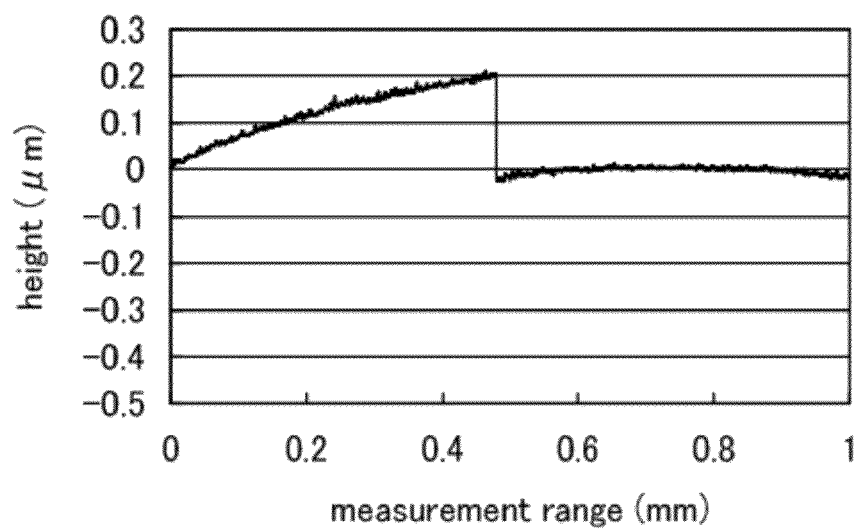
FIGS. 26A and 26B are graphs each showing a step of a semiconductor substrate.
Figure 26B:
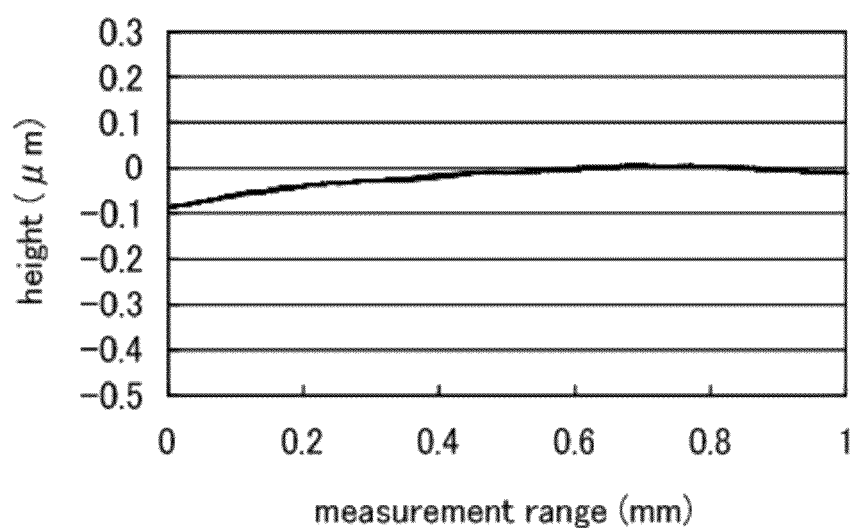

FIGS. 25A and 25B are optical micrographs (Nomarski images at 50-fold magnification) of the peripheral portion of the semiconductor substrate before the reprocessing treatment and of the peripheral portion of the semiconductor substrate (the substrate A) after the above reprocessing treatment, respectively. Similarly, the results of step measurement are shown in FIGS. 26A and 26B.

As shown in FIG. 25A, the semiconductor substrate before the reprocessing treatment has a step (a step portion 301) in its peripheral portion, and an insulating layer and silicon are respectively observed in the step portion 301 and a central portion 302. According to FIG. 26A, it can be seen that a step with a thickness of approximately 0.2 µm exists in the peripheral portion of the semiconductor substrate before the reprocessing treatment.

On the other hand, in the semiconductor substrate shown in FIG. 25B, the step which has once existed in the peripheral portion is not observed and silicon is observed in the entire surface. Note that a vertical white line on the left side of FIG. 25B represents an edge of the substrate. FIG. 26B also indicates that the step is removed.

Next, results of evaluating the planarity of the two kinds of reprocessed semiconductor substrates with the use of a scanning probe microscope are shown. Conditions of the measurement with the scanning probe microscope were as follows: the scan rate was 1.0 Hz, the measurement area was 1 µm×1 µm, and the measurement points were 2. The measurement was conducted using dynamic force mode (DFM). Here, the dynamic force mode is a mode for measuring the surface shape of a sample in a state where a cantilever is resonated while the distance between a probe and the sample is controlled so that the vibration amplitude of the cantilever is maintained constant.

The planarity of the reprocessed semiconductor substrate was evaluated using the average plane roughness (Ra) and the maximum peak-to-valley height (P-V). Here, the average surface roughness (Ra) is obtained by three-dimension expansion of center line average surface roughness Ra which is defined by JISB0601:2001 (ISO 4287:1997) so that Ra can be applied to a measurement surface, and is an average value of the absolute values of deviations from a reference surface to a specific surface. The maximum peak-to-valley height (P-V) is a difference between the height of the highest peak and the height of the lowest valley in the specific surface. The peak and the valley refer to a peak and a valley obtained by three-dimensional expansion of the "peak" and the "valley" defined by JISB0601:2001(ISO 4287:1997). The peak refers to the highest point of the peaks. The valley refers to the lowest point of the valleys.

Results of planarity evaluation of the reprocessed semiconductor substrates with the scanning probe microscope are shown in Table 3.

TABLE 3

|  | Substrate A | | Substrate B | |
| --- | --- | --- | --- | --- |
|  | Peripheral portion | Central portion | Peripheral portion | Central portion |
| Average surface roughness Ra (nm) | 0.05 | 0.046 | 0.06 | 0.072 |
| P – V(nm) | 0.393 | 0.475 | 0.47 | 0.52 |

In both the substrate A and the substrate B, there is no step between the central portion and the peripheral portion, and the planarity of the peripheral portion is substantially at the same level as that of the central portion. When the substrate A is compared to the substrate B, the following is found: in the peripheral portion of the substrate A, Ra is 0.05 nm and P-V is 0.393 nm; and in the peripheral portion of the substrate B, Ra is 0.06 nm and P-V is 0.47 nm. Accordingly, the planarity of the substrate A is better than that of the substrate B.

Next, results of measuring the amount of reduction in the thickness of the semiconductor substrate in the reprocessing treatment are shown. Here, the reduced amount (the amount of a removed semiconductor) in the central portion of the substrate is calculated by measuring change in the thickness thereof before and after the reprocessing treatment process. The reduced amount (the amount of removal) in manufacturing the substrate A and the substrate B is shown in Table 4.

TABLE 4

|  | Substrate A | | Substrate B |
| --- | --- | --- | --- |
|  | After etching treatment | After polishing treatment | After polishing treatment |
| Reduced amount in process (μm) | 0.41 | 0.97 | 6.96 |
| Total reduced amount (μm) | | 1.38 | 6.96 |

In manufacturing the substrate A, the reduced amount was 1.38 μm. Meanwhile, in manufacturing the substrate B, the reduced amount was 6.96 μm. This indicates that the reduced amount in manufacturing the substrate A was approximately one fourth of that in manufacturing the substrate B. In particular, the amount reduced by etching in manufacturing the substrate A was only 0.41 μm.

Accordingly, by reprocessing treatment using the combination of the above etching treatment and CMP treatment, the semiconductor substrate can be prevented from being reduced by the reprocessing treatment while the planarity of the reprocessed semiconductor substrate is maintained.

Example 3

This example shows observation results of a cross section of a semiconductor substrate which was provided with a thermal oxide film and then subjected to hydrogen ion irradiation.

In this example, a rectangular single crystal silicon substrate with a size of 5 inches square was used as the semiconductor substrate. First, thermal oxidation was performed on the semiconductor substrate under an HCl atmosphere to form a thermal oxide film with a thickness of 100 nm on a surface of the substrate. The thermal oxidation was performed under the condition of 950° C. for 4 hours under a thermal oxidation atmosphere containing HCl at 3 vol % with respect to oxygen.

Next, the semiconductor substrate was irradiated with hydrogen through the surface of the thermal oxide film with the use of an ion doping apparatus. In this example, by irradiation with ionized hydrogen, an embrittlement region was formed in the semiconductor substrate. Conditions of ion doping were set such that the acceleration voltage was 50 kV and the dose was $2.0 \times 10^{16}$ ions/cm$^2$. Thus, the embrittlement region was formed at a depth of approximately 250 nm from the surface of the thermal oxide film.

Figure 27A:
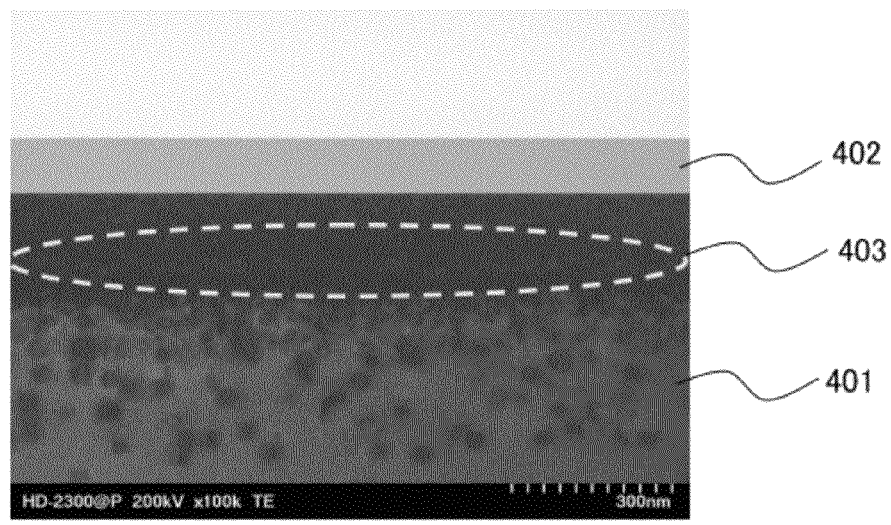
FIGS. 27A and 27B are cross-sectional TEM images of a semiconductor substrate.
Figure 27B:
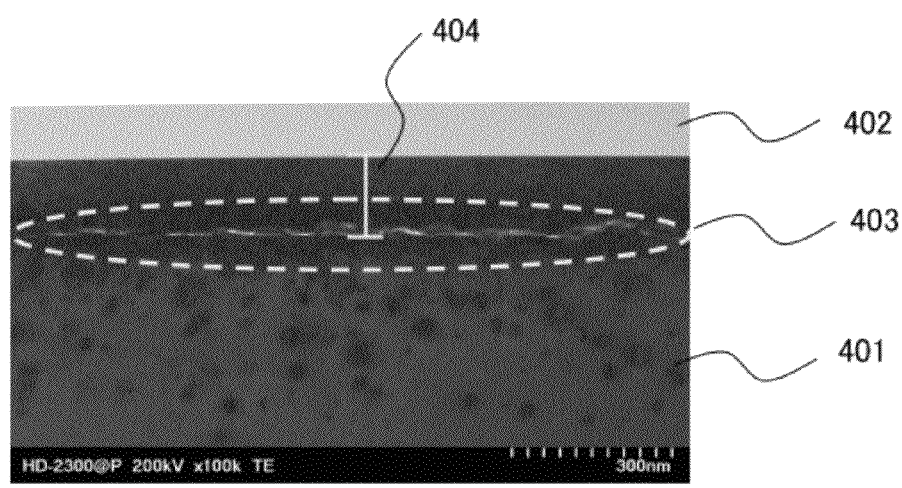

FIG. 27A is a cross-sectional TEM image of a semiconductor substrate which was subjected to the above treatment. FIG. 27B is a cross-sectional TEM image of the semiconductor substrate which was subjected to heat treatment without being bonded to the base substrate 120. FIGS. 27A and 27B each indicate that a thermal oxide film 402 is formed on the surface of a silicon substrate 401 and an embrittlement region 403 is formed under the thermal oxide film 402. In addition, FIG. 27B indicates that there is a crack in the embrittlement region.

FIGS. 27A and 27B show that a number of crystal defects were formed in the vicinity of the surface of the single crystal substrate. Further, FIG. 27B shows that the semiconductor substrate has a crack at a depth of 139 nm from the surface thereof (a depth 404 up to the crack). In the case where the semiconductor substrate is bonded to the base substrate 120, the semiconductor substrate is separated at the position of the crack.

Here, a step portion due to failure in bonding with a base substrate was formed in the peripheral portion of the semiconductor substrate after the separation as described in the above examples. In addition, the remaining semiconductor layer (the damaged semiconductor region) which is included in the step portion has crystal defects, microvoids, or blisters. Therefore, when etching using a mixed solution containing hydrofluoric acid, nitric acid, and acetic acid is performed as described in the above examples, the step portion formed in the peripheral portion of the semiconductor substrate after separation can be selectively removed.

Example 4

This example shows results of examining the case where, as an etchant, the mixed solution (the mixed solution A) where hydrofluoric acid, nitric acid, and acetic acid were mixed at a volume ratio of 1:3:10 was used and the case where, as an etchant, a mixed solution (hereinafter referred to as a mixed solution A+) where hydrofluoric acid, nitric acid, and acetic acid were mixed at a volume ratio of 1:2:10 was used.

Note that semiconductor substrates used in this example are similar to those used in Example 1 and thus details thereof are omitted.

Treatment performed on the above semiconductor substrates was as follows.

First, in order to remove an insulating layer which was formed to cover each of the semiconductor substrates, the semiconductor substrates were subjected to wet etching treatment using a mixed solution (product name: LAL500, produced by Stella Chemifa Corporation) containing hydrofluoric acid, ammonium fluoride, and a surfactant. At this time, the solution temperature was room temperature and the etching time was 300 seconds.

Next, the semiconductor substrates from which the insulating layer had been removed were subjected to wet etching with the use of, as an etchant, the mixed solution (the mixed solution A) where hydrofluoric acid, nitric acid, and acetic acid were mixed at a volume ratio of 1:3:10 or the mixed solution (the mixed solution A+) where hydrofluoric acid, nitric acid, and acetic acid were mixed at a volume ratio of 1:2:10. The mixed solution A and the mixed solution A+ were produced using hydrofluoric acid at a concentration of 50 weight % (produced by Stella Chemifa Corporation), nitric acid at a concentration of 70 weight % (produced by Wako Pure Chemical Industries, Ltd.), and acetic acid at a concentration of 97.7 weight % (produced by Kishida Chemical Co., Ltd.).

Figure 28A:
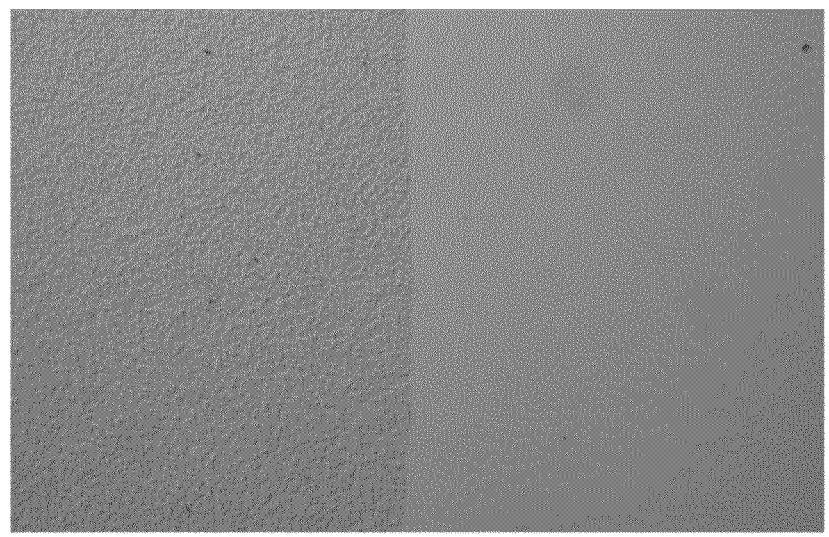
FIGS. 28A and 28B are optical micrographs of a semiconductor substrate.
Figure 28B:
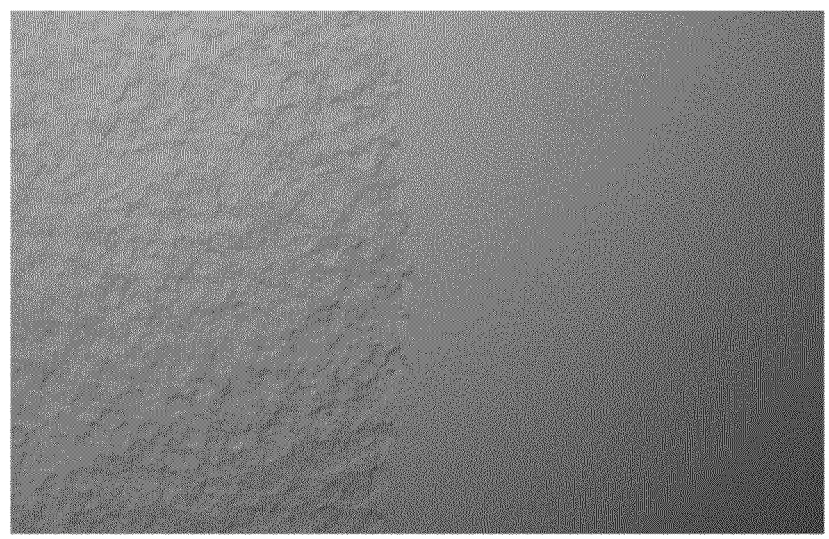

FIG. 28A is an optical micrograph (a Nomarski image at 50-fold magnification) of the peripheral portion of the semiconductor substrate after wet etching using the mixed solution A+. FIG. 28B is an optical micrograph (a Nomarski image) at 500-fold magnification. In the wet etching using the mixed solution A+, a residue was not observed even in the case of a processing time at which a residue due to etching may be generated in the wet etching using the mixed solution A. This is considered to be caused by the following reason: by slightly increasing the rate of hydrofluoric acid to nitric acid from 1:3 (hydrofluoric acid: nitric acid), a formed oxide film is quickly removed and generation of a residue is suppressed.

In this manner, it is found that when the step in the peripheral portion of the substrate is etched using the mixed solution A+ (the mixed solution where the volume ratio of hydrofluoric acid, nitric acid, and acetic acid is 1:2:10), generation of a residue can be suppressed as compared to the case where the mixed solution A (the mixed solution where the volume ratio of hydrofluoric acid, nitric acid, and acetic acid is 1:3:10) was used. The same can be said for the case where a mixed solution which contains hydrofluoric acid, nitric acid, and acetic acid at a volume ratio of 1.5:3:10 was used. On the other hand, when the rate of hydrofluoric acid to nitric acid was too high as compared to that in the mixed solution of 1:3:10, as in the case where the mixed solution has a ratio of 1:1:10, surface roughness, the remnant of the step, and the like were observed.

According to this example, it can be understood that by slightly increasing the rate of hydrofluoric acid to nitric acid slightly from 1:3 (hydrofluoric acid: nitric acid), reprocessing treatment of a semiconductor substrate can be performed more surely and effectively.

The present application is based on Japanese Patent Application serial No. 2009-234949 filed with the Japan Patent Office on Oct. 9, 2009, the entire contents of which are hereby incorporated by reference.

EXPLANATION OF REFERENCE

100: semiconductor substrate, 102: insulating layer, 104: embrittlement region, 120: base substrate, 121: semiconductor substrate, 122: insulating layer, 123: insulating layer, 124: semiconductor layer, 125: semiconductor region, 126: step portion, 127: semiconductor region, 128: step portion, 129: semiconductor region, 130: semiconductor substrate, 132: reprocessed semiconductor substrate, 133: semiconductor region, 134: blister, 135: region, 251: semiconductor layer, 252: semiconductor layer, 254: insulating layer, 255: gate electrode, 256: gate electrode, 257: low-concentration impurity region, 258: channel formation region, 259: high-concentration impurity region, 260: channel formation region, 261: sidewall insulating layer, 262: sidewall insulating layer, 267: high-concentration impurity region, 268: insulating layer, 269: interlayer insulating layer, 270: wiring, 280: transistor, 281: transistor, 301: step portion, 302: central portion, 401: silicon substrate, 402: thermal oxide film, 403: embrittlement region, 404: depth up to a crack.

The invention claimed is:

1. A method for manufacturing an SOI substrate, comprising the steps of:
providing a damaged semiconductor substrate, wherein the damaged semiconductor substrate comprises:
a first damaged semiconductor region in a central portion of the damaged semiconductor substrate; and
a step portion in a peripheral portion of the damaged semiconductor substrate, the step portion comprising:
a first insulating layer; and
a second damaged semiconductor region under the first insulating layer, the second damaged semiconductor region comprising:
a semiconductor region under the first insulating layer; and
an embrittlement region under the semiconductor region, removing the first insulating layer by a first etching treatment;
starting to remove the first damaged semiconductor region and the second damaged semiconductor region by a second etching treatment,
stopping the second etching treatment after an etching selectivity of the peripheral portion of the damaged semiconductor substrate to the central portion of the damaged semiconductor substrate per unit time is reduced from two or higher to lower than two, thereby a non-damaged semiconductor region is left, wherein the second etching treatment is performed using a mixed solution, and wherein the mixed solution comprises:
a first substance capable of performing an oxidation of a semiconductor material included in the damaged semiconductor substrate;
a second substance capable of performing a dissolution of an oxidized semiconductor material; and
a third substance capable of controlling a speed of the oxidation of the semiconductor material and a speed of the dissolution of the oxidized semiconductor material;
heating the damaged semiconductor substrate under an atmosphere including hydrogen after performing the second etching treatment, thereby a reprocessed semiconductor substrate is manufactured;
irradiating the reprocessed semiconductor substrate with ions to form an embrittlement region in the reprocessed semiconductor substrate;
bonding the reprocessed semiconductor substrate and a base substrate to each other with a second insulating layer interposed therebetween; and
separating the reprocessed semiconductor substrate at the embrittlement region to form a semiconductor layer over the second insulating layer.

2. The method for manufacturing an SOI substrate, according to claim 1, wherein the irradiation is performed without mass separation.

3. The method for manufacturing an SOI substrate, according to claim 1, wherein the ions include an $H_3^+$ ion.

4. The method for manufacturing an SOI substrate, according to claim 1, wherein etching selectivity of the second damaged semiconductor region to the non-damaged semiconductor region is 2 or higher.

5. The method for manufacturing an SOI substrate, according to claim 1, wherein at least a region where an angle between a tangent plane of the step portion and a back surface of the damaged semiconductor substrate is 0.5° or less is removed by the second etching treatment.

6. The method for manufacturing an SOI substrate, according to claim 1, wherein the first substance is nitric acid, the second substance is hydrofluoric acid, and the third substance is acetic acid.

7. The method for manufacturing an SOI substrate, according to claim 1,
wherein a thickness of the first damaged semiconductor region is thinner than a thickness of the second damaged semiconductor region.

8. A method for manufacturing an SOI substrate, comprising the steps of:
providing a damaged semiconductor substrate, wherein the damaged semiconductor substrate comprises:
a first damaged semiconductor region in a central portion of the damaged semiconductor substrate; and
a step portion in a peripheral portion of the damaged semiconductor substrate, the step portion comprising:
a first insulating layer; and
a second damaged semiconductor region under the first insulating layer, the second damaged semiconductor region comprising:
a semiconductor region under the first insulating layer; and
an embrittlement region under the semiconductor region, removing the first insulating layer by a first etching treatment;
removing the first damaged semiconductor region and the second damaged semiconductor region by a second etching treatment, thereby a non-damaged semiconductor region is left, wherein the second etching treatment is performed using a mixed solution, and wherein the mixed solution comprises:
a hydrofluoric acid;
a nitric acid;
an acetic acid; and
water;
heating the damaged semiconductor substrate under an atmosphere including hydrogen after performing the second etching treatment, thereby a reprocessed semiconductor substrate is manufactured;
irradiating the reprocessed semiconductor substrate with ions to form an embrittlement region in the reprocessed semiconductor substrate;
bonding the reprocessed semiconductor substrate and a base substrate to each other with a second insulating layer interposed therebetween; and
separating the reprocessed semiconductor substrate at the embrittlement region to form a semiconductor layer over the second insulating layer, wherein a molar ratio of the mixed solution of the hydrofluoric acid, the nitric acid, the acetic acid and the water is 2.05:3.29:11.55:7.42, each having a margin of error of ±10%.

9. The method for manufacturing an SOI substrate, according to claim 8, wherein the irradiation is performed without mass separation.

10. The method for manufacturing an SOI substrate, according to claim 8, wherein the ions include an $H_3^+$ ion.

11. The method for manufacturing an SOI substrate, according to claim 8, wherein etching selectivity of the second damaged semiconductor region to the non-damaged semiconductor region is 2 or higher.

12. The method for manufacturing an SOI substrate, according to claim 8, wherein at least a region where an angle between a tangent plane of the step portion and a back surface of the damaged semiconductor substrate is 0.5° or less is removed by the second etching treatment.

13. The method for manufacturing an SOI substrate, according to claim 8, wherein a thickness of the first damaged semiconductor region is thinner than a thickness of the second damaged semiconductor region.

* * * * *